(12) United States Patent
Soliman et al.

(10) Patent No.: US 6,839,003 B2
(45) Date of Patent: Jan. 4, 2005

(54) METHOD AND DEVICE FOR COMPRESSING AND/OR DECOMPRESSING DATA AS WELL AS FOR ANALYZING AND REPRESENTING DATA

(76) Inventors: Michael Soliman, Hauptstrasse 11a, 64401 Gross-Bieberau (DE); Henning Voss, Gross-Bierberauer-Strasse 4, 64354 Reinheim (DE); Günter Greschenz, Tannenweg 49, 64354 Reinheim (DE)

( * ) Notice: Subject to any disclaimer, the term of this patent is extended or adjusted under 35 U.S.C. 154(b) by 25 days.

(21) Appl. No.: 10/258,597
(22) PCT Filed: May 2, 2001
(86) PCT No.: PCT/EP01/04920
§ 371 (c)(1), (2), (4) Date: Jul. 3, 2003
(87) PCT Pub. No.: WO01/86819
PCT Pub. Date: Nov. 15, 2001

(65) Prior Publication Data
US 2004/0027259 A1 Feb. 12, 2004

(30) Foreign Application Priority Data
May 2, 2000 (DE) ......................... 100 21 286

(51) Int. Cl.[7] .............................................. H03M 7/00
(52) U.S. Cl. ............................ 341/50; 341/106; 341/87
(58) Field of Search ............................ 341/50, 51, 87, 341/106, 95

(56) References Cited
U.S. PATENT DOCUMENTS
6,606,040 B2 * 8/2003 Abdat ........................ 341/87

FOREIGN PATENT DOCUMENTS
DE          19 928985         12/1999

(List continued on next page.)

OTHER PUBLICATIONS

Rabbani et al, "Digital Image Compression Techniques In: Tutorial Texts In Optical Engineering", vol. TT 7, Bellingham, Washington USA, third printing 1991, pp. 175–181.

(List continued on next page.)

Primary Examiner—Brian Young
(74) Attorney, Agent, or Firm—Dennison, Schultz, Dougherty & MacDonald

(57) ABSTRACT

A method and device for compressing data to allow for a simple and rapid evaluation of the compressed data. The invention includes the steps of receiving and storing a possibly higher dimensional sequence of (possibly higher dimensional) raw data with at least two datapoints, storage of the datapoints [formally designated as decat built-in structure of the (−1)-st order] as the record to be processed momentarily, first decomposition of the data received by the computation of coefficients of a 0 order decat built-in structure (overview tree/compression zero order tree) on the basis of the data received, and determination of the layers of the 0-th tree structure (overview tree), at least one further decomposition (k-th decomposition, with $2 \leq k \leq n$ and $n \geq 2$) of the coefficients calculated with an immediately preceding decomposition [(k−1)-th decomposition] by the computation of coefficients of at least a further decat built-in structure of the 1-st to (n−1)-th order, as well as the determination of layers of the second tree structures [compression trees of the 1-st to (n−1)-th order], and sorting and/or filtering of the coefficients of the layers of at least the second tree structures of the (n−1)-th order (compression trees), preferably without having to decompress the tree structures computed again explicitly or implicitly, storage of those coefficients of at least the decat built-in structure of (n−1)-th order (n-th decomposition) that are suited for reconstruction of the data received on the basis of sorting and/or filtering.

36 Claims, 37 Drawing Sheets

FOREIGN PATENT DOCUMENTS

Figure 1:
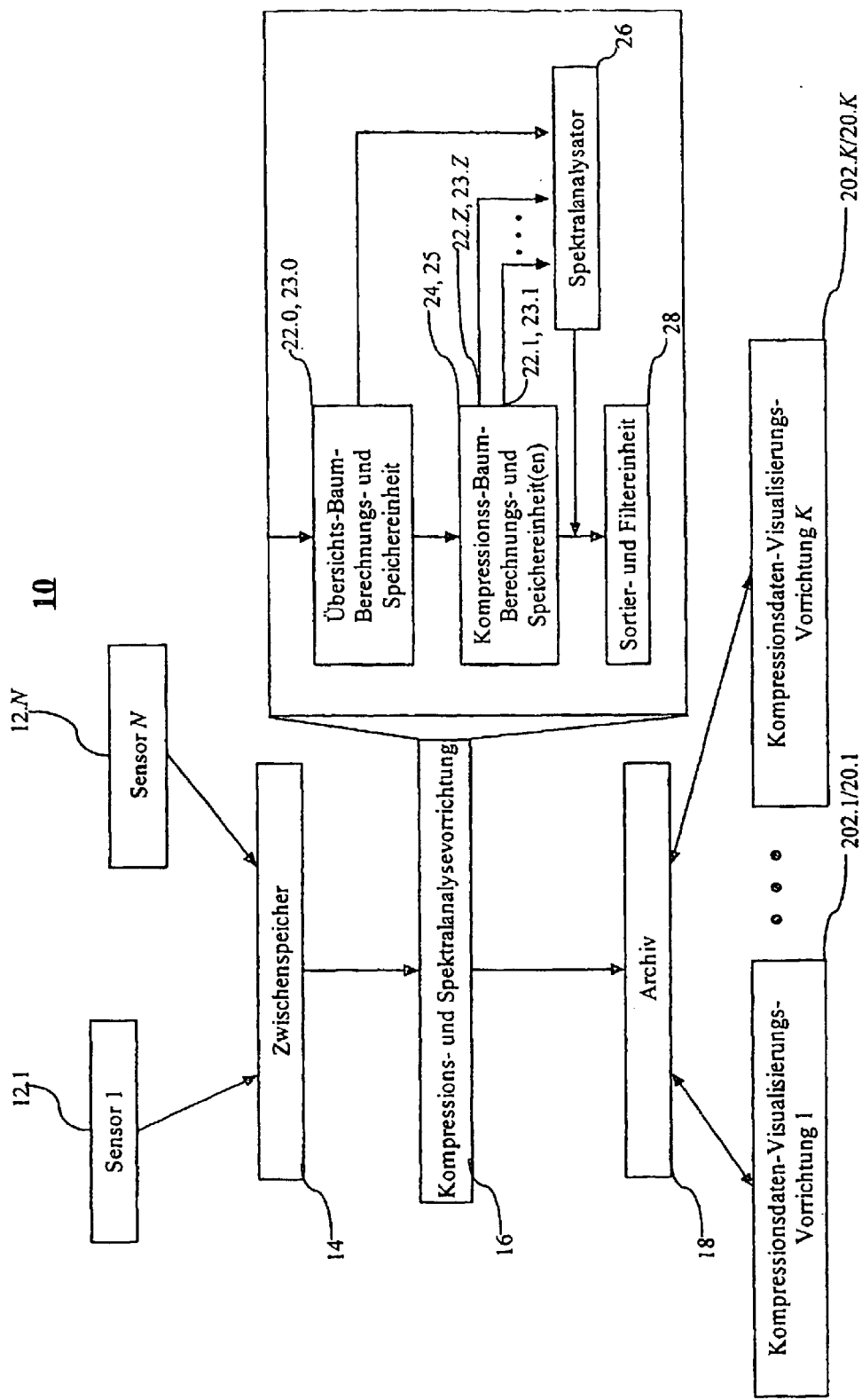

| | | |
|---|---|---|
| JP | 11 163733 | 6/1999 |
| JP | 00 023157 | 1/2000 |

OTHER PUBLICATIONS

Simmert et al, "Prioritatscodiertes Verfahren zur Datenkomprimierung". Berlin 47, 1997, 2, pp. 39–42.

Triebfurst et al, "Waveletbasierte Bildverarbeitung und Kompression als Tool Bei der Ableitung vin Karten Stadtischer Bebauungsstrukfuren aus Landsat–TM–Aufnahmen". ZPF, 3, 1998, pp. 79–88.

* cited by examiner

126

↑
128

130

132

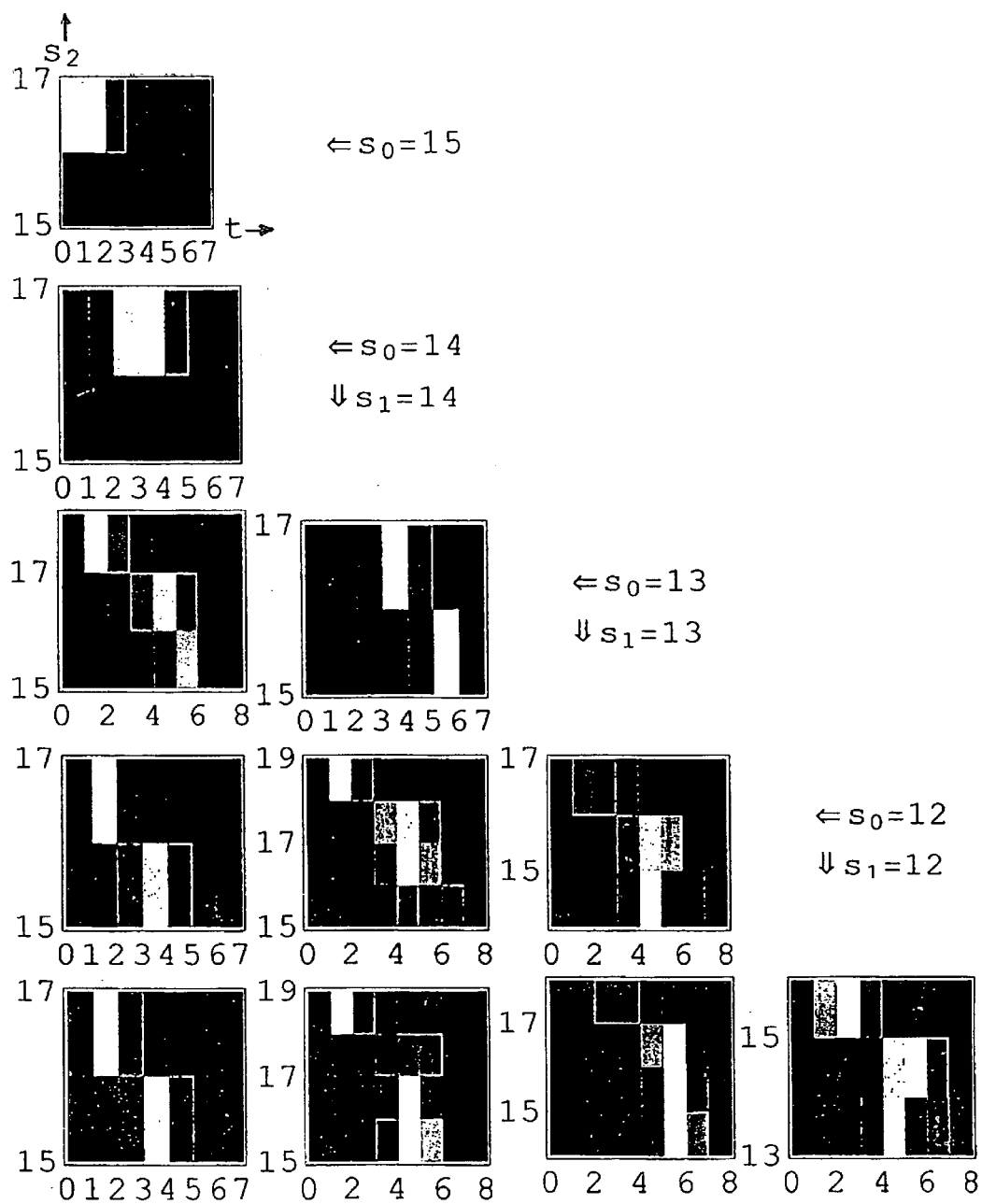
Fig. 20c.$s_0$.15.bis.11.$s_1$.15.bis.12:

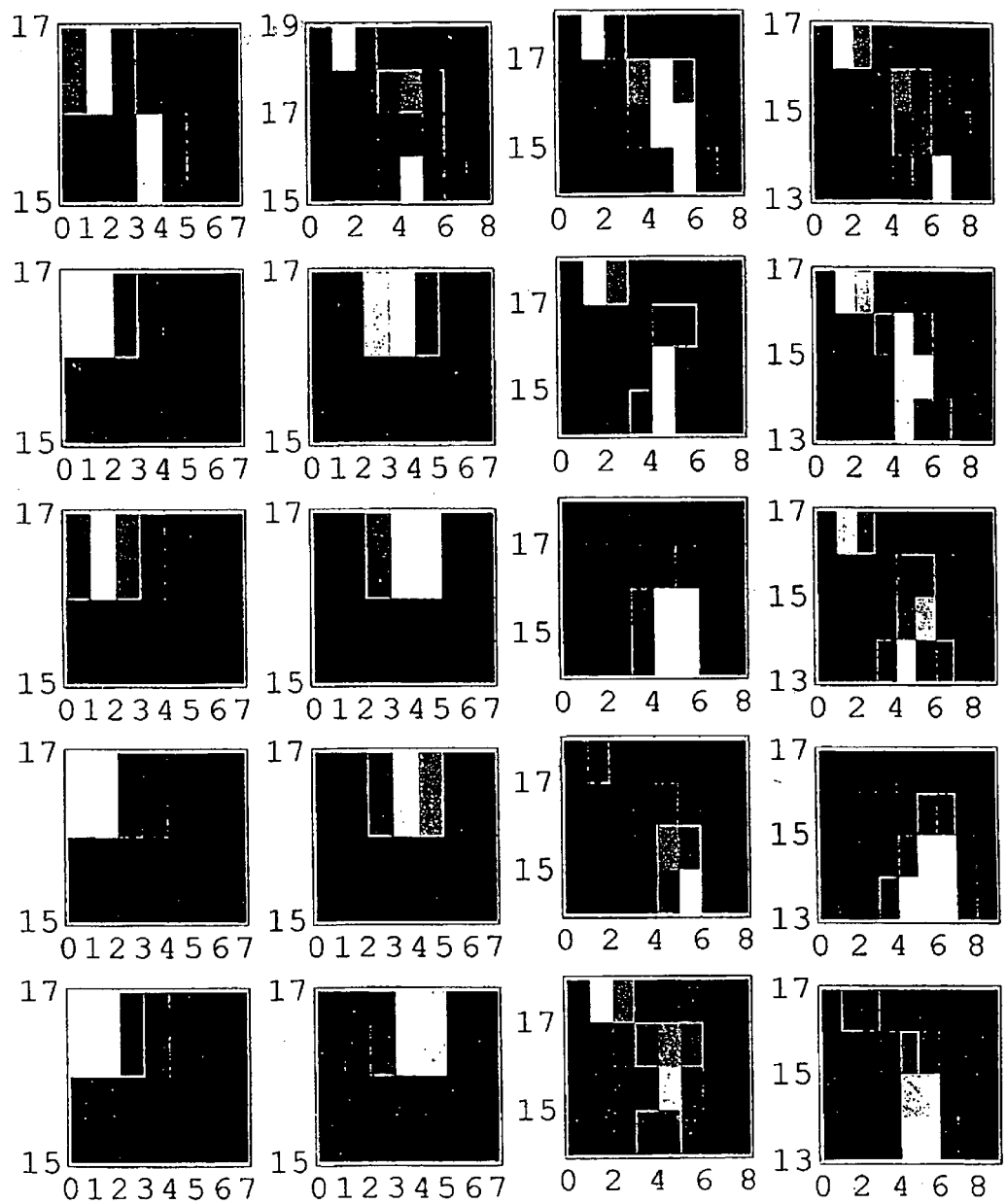
Fig. 20c.$s_0$.10.bis.6.$s_1$.15.bis.12:

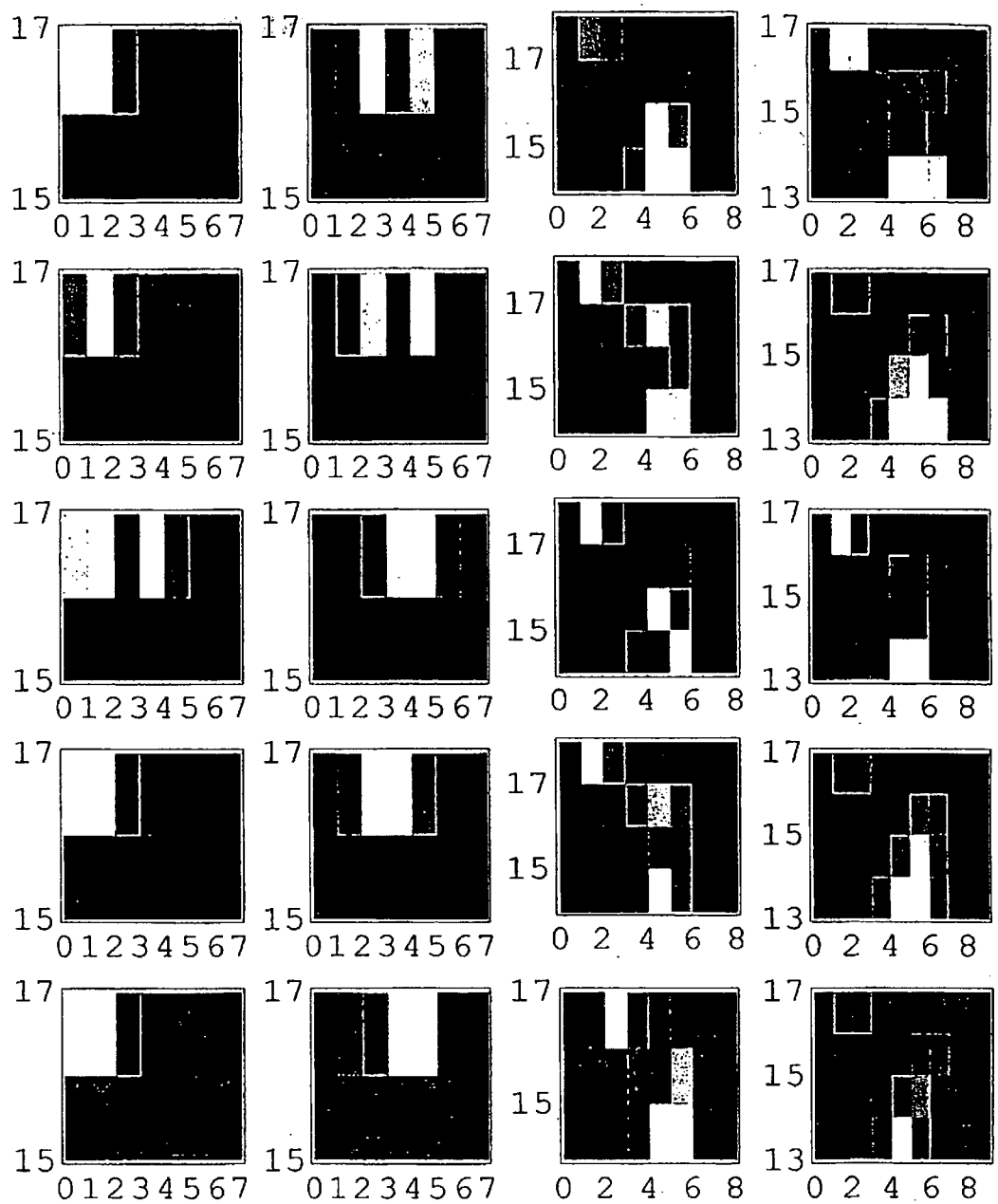
Fig. 20c.$s_0$.5.bis.1.$s_1$.15.bis.12:

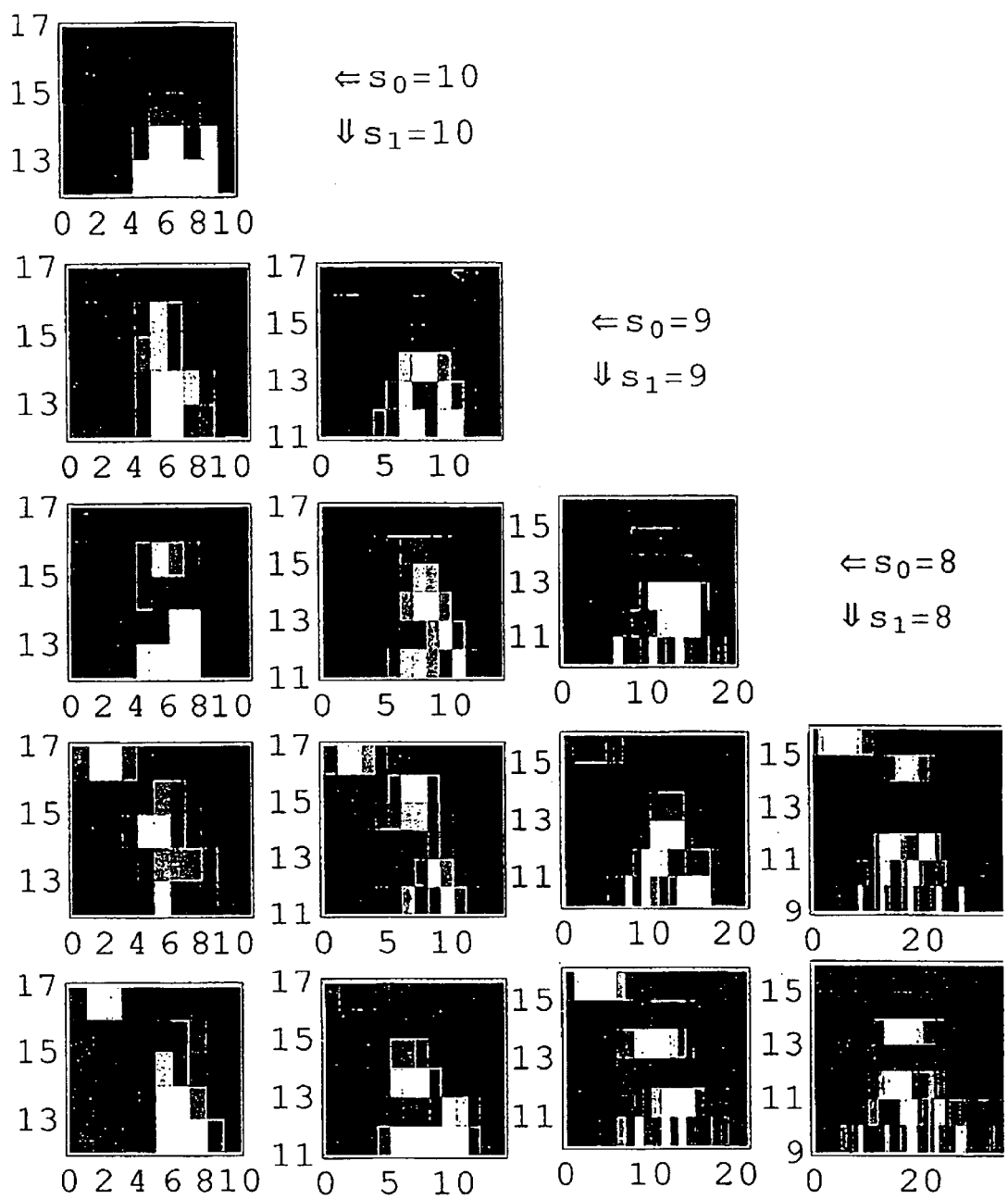
Fig. 20c.$s_0$.10.bis.6.$s_1$.11.bis.8:

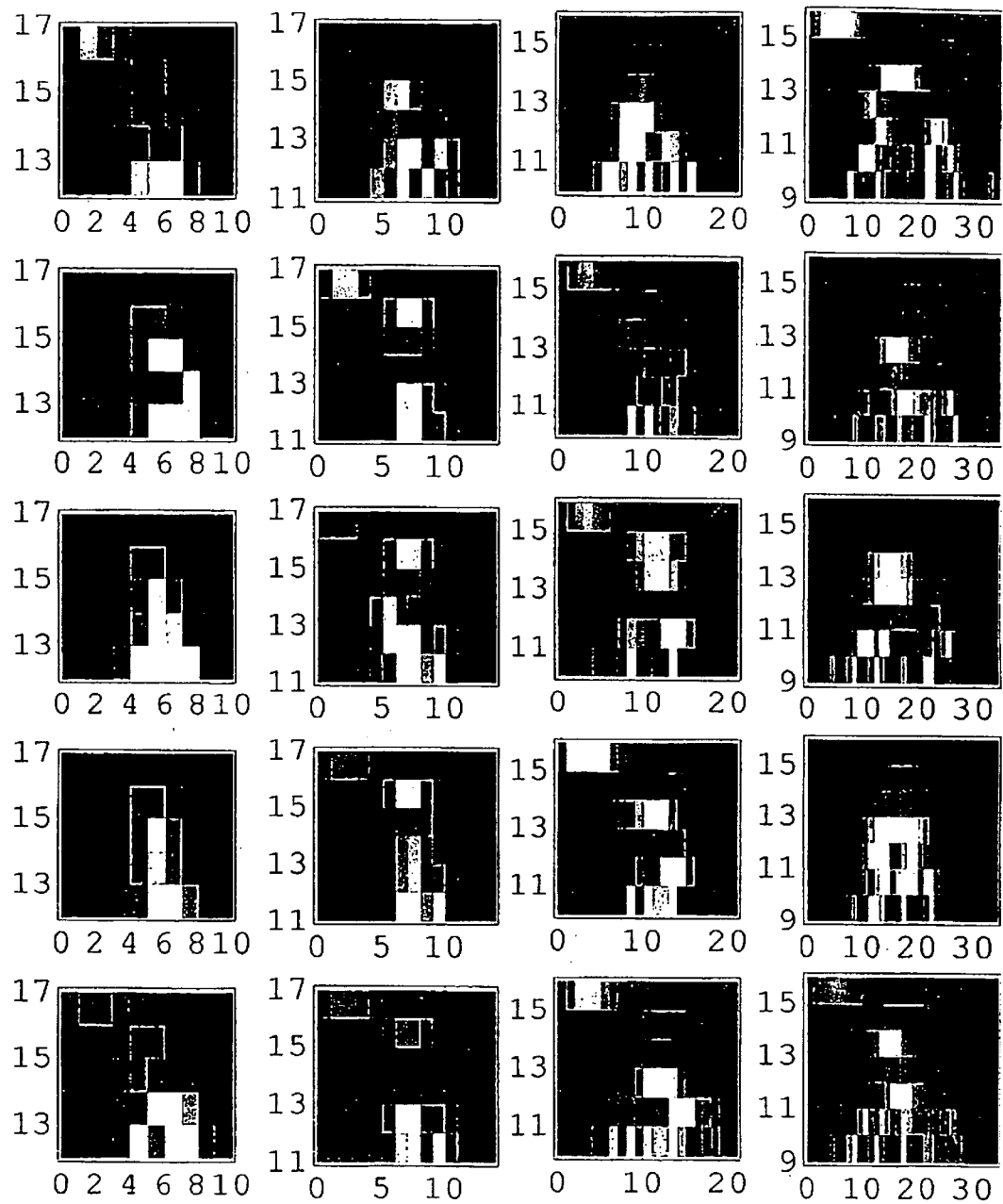
Fig. 20c.$s_0$.5.bis.1.$s_1$.11.bis.8:

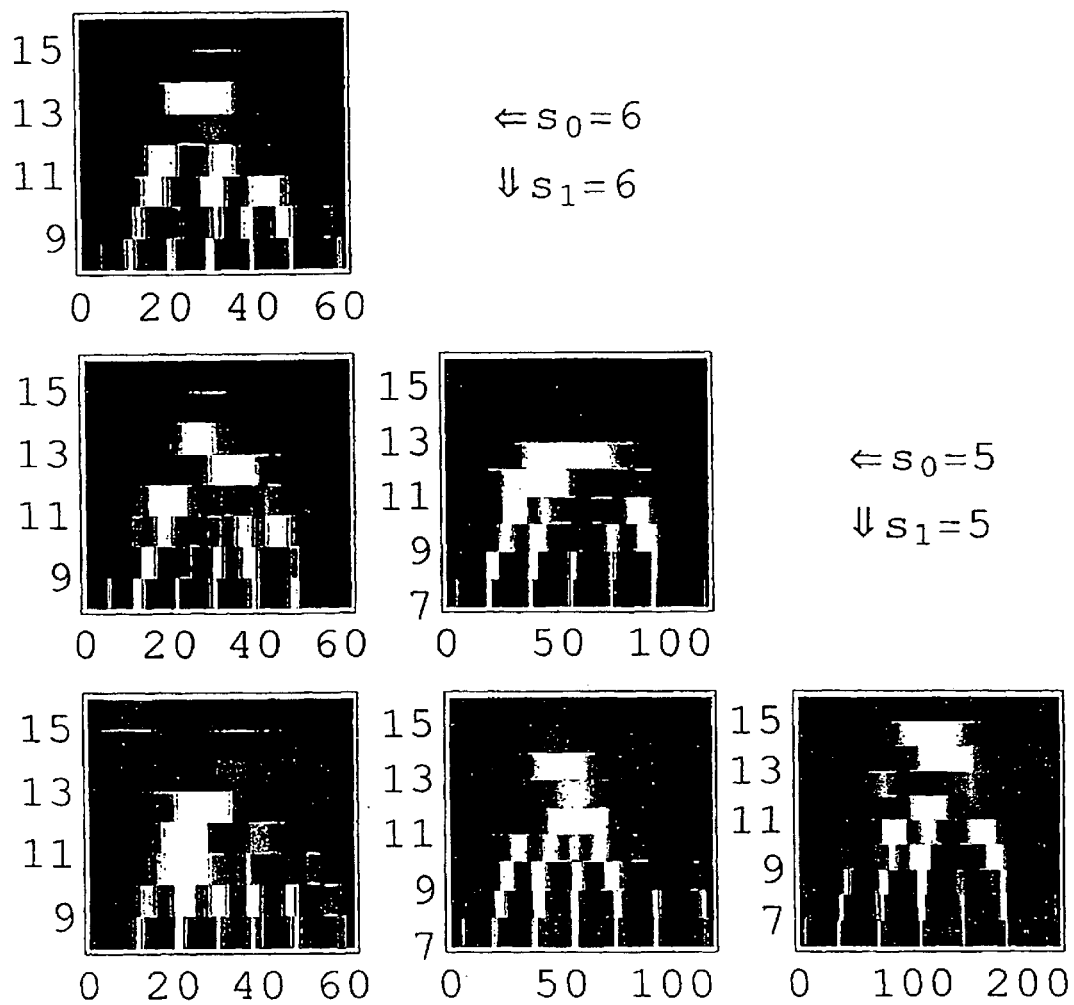
Fig. 20c.$s_0$.6.bis.4.$s_1$.7.bis.4:

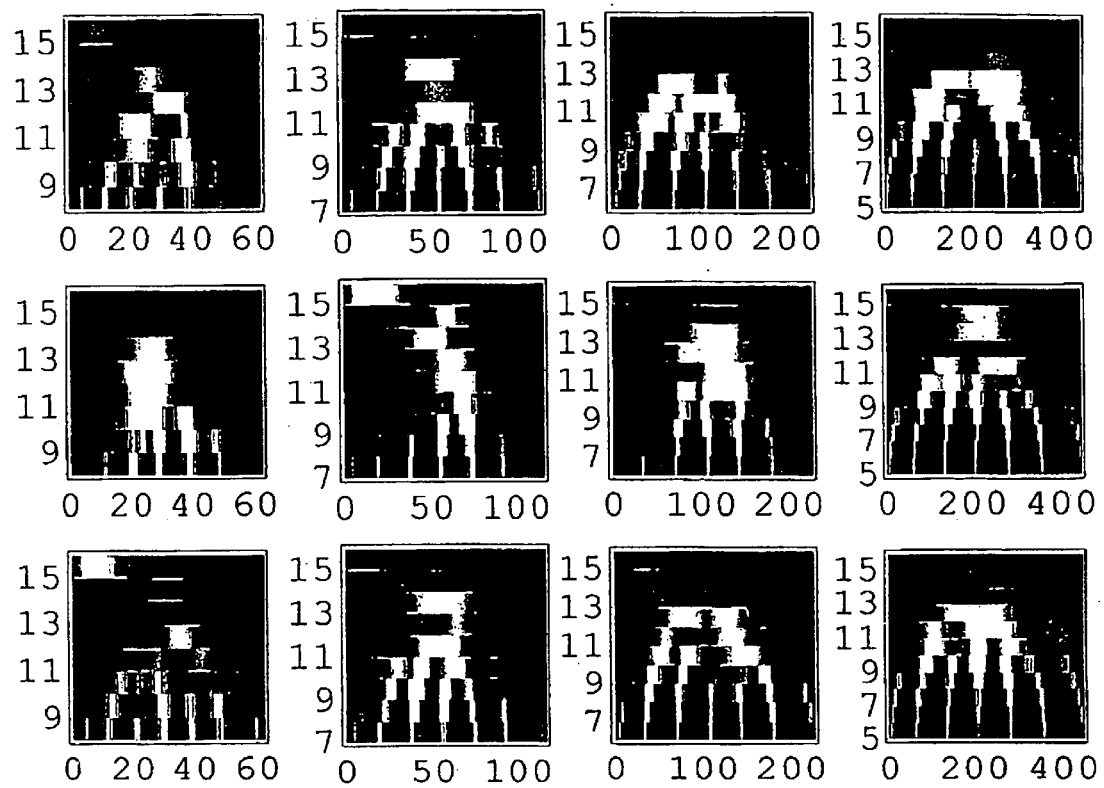
Fig. 20c.$s_0$.3.bis.1.$s_1$.7.bis.4:

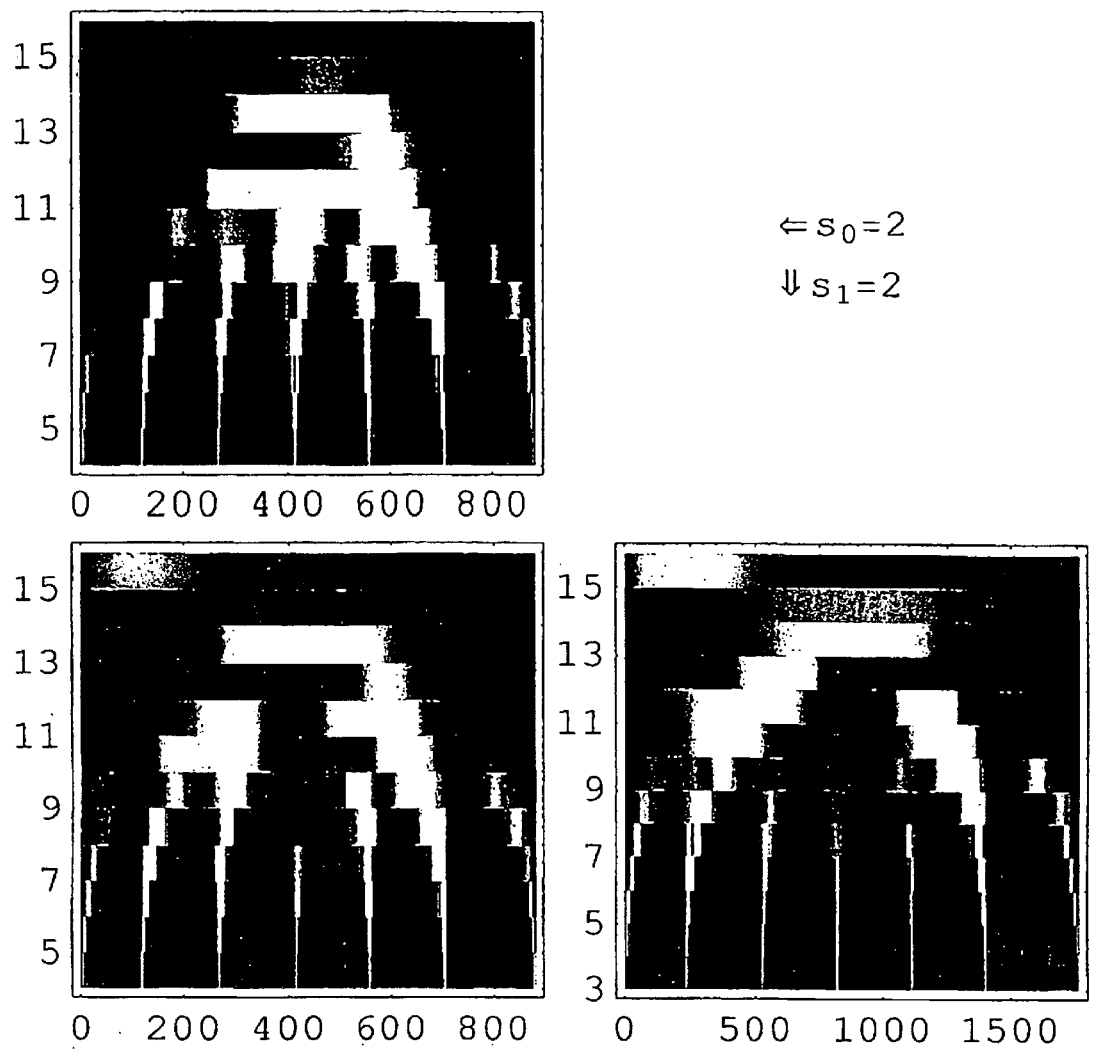
Fig. 20c.$s_0$.2.bis.1.$s_1$.3.bis.2:

METHOD AND DEVICE FOR COMPRESSING AND/OR DECOMPRESSING DATA AS WELL AS FOR ANALYZING AND REPRESENTING DATA

The invention relates to a method for compression of data and to a device for implementing the method. The invention further relates to a method for the analysis of compressed data in particular as well as to a device for implementing the method.

A recursive online wavelet data compression technique for use in data storage and in transmitting reports is described in the document 199 28 985 A1. A data compression system contains a data receiver, which receives the datapoints in a sequential manner, and a compression tree computation device, which determines a compression tree on the basis of the datapoints received, wherein the compression tree contains coefficients in the zero plane level that correspond to the stream of datapoints, and coefficients in one or more higher plane levels which are determined from the coefficients in the zero plane level. Further, a memory is provided, which stores the specified coefficients of the compression tree, along with a compression data generator for generating a record of compressed data corresponding to the datapoints received. In order to provide real time or online data compression, the compression tree-calculation device determines a coefficient from one of the higher plane levels after the data receiver has received the first of the datapoints, but before the data receiver has received a second datapoint. In other words, the data are compressed immediately after being received without an interim storage of large amounts of uncompressed data being required.

A process for compressing data using a wavelet compression tree comprises the following steps according to the state of the art:

Receiving a sequence of datapoints, wherein after each datapoint is received
  (1) The datapoint is stored in a momentary record
  (2) A point of a higher layer in a tree is determined recursively if the point of the higher layer can be determined on the basis of the values of the momentary record,
  (3) It is possible to conduct a comparison between an error value which is allocated to the point of the higher layer and a limit value for each specified point of a higher layer, and
  (4) If the error value is smaller than the limiting value, the following sub-operations are conducted
    (a) Storage of the point of the higher layer as a value in the momentary record,
    (b) Removal of any values not needed from the momentary record and Sending the momentary record as compressed data if the error value for any point of a higher level is greater than the limiting value.

According to the state of the art, it is further provided that units of a process control network in each case have a compression-decompression unit, wherein compressed data must be transmitted over a bus system connecting the units, and must first be decompressed in, for example, evaluation units in order to be available for further analysis/display.

Moreover, it is provided that the archives consisting of hundreds of millions of measurement values are first completely decompressed in order then to compile an overview. In fact, according to the state of the art, the decompression of more than three times the amount of data to be analyzed even demands the decompression of all data in some cases, which is associated with great cost in terms of time and memory.

It has also become manifest that the interpretation of measured data is difficult and almost impossible for unpracticed personnel if data sources such as sensors (feedback devices, preamplifiers) or A–D converters or video cameras that have a transmission function with a non-trivial, non-broad band structure are used.

Proceeding from this, the present invention is based upon the object of refining a method and a device of the previously mentioned type such that a simple and rapid reconstruction-decompression and/or interpolation and/or evaluation/interpretation of the compressed data is made possible. Furthermore, a high data compression ratio, i.e. a ratio of the scope of data to be archived without or with compression, is achieved.

The object is attained in accordance with a method preferably consisting of two parts, including the following features:

In the first part for collecting data:
  Receiving and storing a possible higher dimensional sequence of (possibly higher dimensional) raw data with at least two datapoints,
  Storage of datapoints [formally designated as decat built-in function of the (−1) order] as a record to be processed at the moment,
  First decomposition of the data received by calculating coefficients of a decat built-in function of the 0 order (overview tree/compression tree of zero order) on the basis of the datapoints received, and determining layers of the 0 tree structure (overview tree),
  At least one further decomposition (k th decomposition, with $2 \leq k \leq n$ and $n \geq 2$) of the coefficients, calculated in connection with an immediately preceding decomposition [(k−1) th decomposition], by calculating coefficients of at least one further decomposition structure of 1st to (n−1)-th order, and determining layers of the second tree structures [compression trees of 1st to (n−1)-th order],
  Sorting and/or filtering the coefficients of the layers of at least the second tree structures (n−1)-th order (compression trees), preferably without having to decompress the calculated tree structures explicitly or implicitly again,
  Storage of those coefficients, at least of the decat built-in structure of the (n−1)-th order, which are suited for reconstruction of the received sequence of data on the basis of the sorting and/or filtering.

In the second part for reconstruction/decompression and/or interpolation and/or evaluation/interpretation of data, which possess a tree structure as in the first part:
  Selection of a desired time range and/or a representation detail of coefficients of at least the decat built-in structure of (n−1)-th order, corresponding to the data to be represented,
  Reconstruction of coefficients of at least one new decat built-in structure of 0-th to (n−2)-th order and/or of datapoints [decat built-in structure of (−1)-th order] from the selected coefficients of at least the decat built-in structure of (n−1)-th order and
  Representation of the coefficients to be indicated of at least one decat built-in structure of 0-th to (n−1)-th order in a multidimensional structure, wherein coefficients of a decomposition tree of the same order are represented in one plane, and/or representation of the coefficients of the decat built-in structure of (−1)-th order to be indicated in the form of a typical possibly animated diagram adapted to the (possibly higher dimensional) data structure, or separately in connection with the multidimensional structure for representation of decat built-in structures of 0-th to (n−1)-th order.

In accordance with the invention, it becomes apparent that in each of the k-th tree structures (wherein $2 \leq k \leq n$), i.e., in each compression tree of (k−1) order, only few coefficients possess significantly large values, while most assume nearly the value zero. Three basic aspects of the present invention result from this:

1. First, a good compression (most coefficients at least of first order assume nearly the value of zero and therefore do not need to be stored in memory).
2. Second, in the very efficient extraction and representation of often very large time segments of the stored raw data [i.e., on the basis of the decat built-in structure of (−1)-th order], whereby in contrast to the method known from the state of the art, only the relevant information is extracted from the archives. Here the Nyquist-Shannon sampling theorem finds application, which states that for reproduction of a data sequence measured with the scanning rate $1/\Delta t$ ($\Delta t$ is the time lapsed between measurements), maximally L times as many coefficients are necessary in relation to a specified record (base) of functions as datapoints are to be reconstructed in the sequence. In this, the number L is a small whole number that is greater than or equal to 2, which is dependent solely on the record of specified functions and, e.g. in the case of harmonic functions (Fourier Transformation) assumes the value L=2. This results particularly in the advantage that, with the editing of the compressed data in accordance with the invention, no more than three times as many coefficients must be extracted from the archives than points, which are to be displayed.
3. Third, based upon the principles mentioned with the previously named representation of data of (−1)-th order, the method specified in the invention allows the representation of compressed data in various modes of representation, which support an appropriate evaluation, such as locating peculiarities or estimating energy distribution. Particularities of a measuring curve can be recognized by this method without great calculation expenditure, and robust toward errors can be detected on the compressed data. (As explained on page 8, this is accomplished via the successive reading out of coefficients from the archives of only those data for which it is apparent, on the basis of the representation, that they display the desired peculiarities. In this connection, the Nyquist sampling theorem says how many layers must at least be read out in order to be able to recognize a specified peculiarity with certainty. Nonetheless, often it becomes apparent after reading out only a few layers where the structures of interest sit, which of course saves on calculation expenditure as well as archive access expenditure).

Based upon the different interpretations which uncompressed and compressed data possess, it is appropriate for both data types to use different modes of representation, the modes of construction of which will be explained below:

The representation of uncompressed data (i.e., raw data) takes place according to application in the "traditional" form typical for the raw data gathered (possibly higher dimensional and/or animated diagrams).

The representation of the compressed data takes place, in that the coefficients resulting from the decomposition are preferably classified inside the decat built-in function of k-th order (wherein $0 \leq k \leq n-1$) in layers of different layer coordinates $s_0$ to $s_k$, wherein the classification is conducted (k+1) times. Furthermore, it is provided in accordance with the invention that each coefficient is allocated at least one of the layer coordinates $s_0$ to $s_k$ and/or a time and/or if need be a higher dimensional value, wherein a control order is computed for each image element, which represents the coefficients within the multidimensional structure, on the basis of at least the one layer number allocated to the coefficient and/or the time and/or its possibly higher dimensional value. A control order for representing a structure of k-th order (wherein $0 \leq k \leq n-1$) is calculated on the basis of (k+1) many layer numbers allocated to the coefficients.

Furthermore, the part of the method for representing compressed data is distinguished in that each coefficient to be represented is allocated a display parameter, especially a color value and/or a gray value and/or a representation coordinate height and/or a brightness value. Moreover, the display parameter of a coefficient can, for example, be dependent upon the amount value of the logarithmic amount value of the coefficient to be represented.

In other words, a further decat built-in structure is represented, with the aid of control commands, for each of the decat built-in structures obtained from each decomposition (compression trees of k-th order wherein $1 \leq k \leq n-1$ and an overview tree) for each of the layers contained in them. The control commands are selected such that each coefficient contained in a layer is allocated a previously adjustable representation as display parameters, wherein preferably a gray shading and/or color coding and/or height coding is allocated as a function of the amount value or the logarithmic amount of the coefficient to be represented.

For construction of the multidimensional structure, the control commands of the image elements associated with the coefficients to be represented are grouped by layer. Thus, for $0 \leq k \leq n-1$, the control commands grouped by layer are preferably grouped on surface units corresponding to their affiliation with the decat built-in structure of k-th order (that is, area-wise for k=1, 3d tree-wise for k=2, ... ), wherein preferably the surface units (consisting of elementary layers) of the decat built-in structures of k-th order are grouped along the associated layers $s_0$ to $s_k$ of the surface units of the decat built-in structure of (k−1)-th order.

In accordance with a preferred method, the decomposition of the data received is conducted through a wavelet transformation/decomposition (wavelet decomposition is a synonym for wavelet transformation), preferably a "rapid wavelet transformation." This rapid wavelet transformation on the one hand enables conducting the transformation on randomly large parts of the measured data, and on the other hand using the storage place reserved for the measured data further for the storage of tree coefficients. Here the expenditure for the wavelet transformation of the measured data is merely proportional to the number N of the measured data while it is, for example, proportional to the product of the number of measured data and the logarithm based upon the number of measured data (~N lg N), thus grows disproportionately. In addition, the calculation units for the rapid wavelet transformation can be conveniently commercially acquired, and can be programmed almost randomly with different wavelets (i.e. the coefficients of the wavelets in contrast to the data transformation coefficients resulting from the transformation) (for example, a "hair wavelet" and/or a wavelet of the Daubechies wavelets class, for example, the "Daubechies $d_2$ wavelet" and/or a wavelet of the Meyer wavelet class are used for the wavelet transformation/decomposition. Which wavelets are best used for which decomposition will be explained further below under the topic "spectral behavior.") By calculating decompositions higher than the 0-th order, the advantage is attained that, in contrast with the state of the art, a so-called quantization of the coefficients ascertained becomes superfluous, wherein the artefacts going along with the quantization in the compressed data are dispensed with.

Basically, successive details are split off during a rapid wavelet decomposition of a sequence of data to be decomposed (e.g., a series of measurements). Moreover, their size grows in any given case by a specified factor, preferably 2, and is stored in successive, numbered layers. The numbers of the layers reflect the size order of the width of the split off details, i.e., the higher the layer number, the greater the period of time over which a certain detail contains information. Basically, the smallness of most coefficients, i.e., the factual insignificance of tiny details, is used with a compression procedure, and these are consequently not taken into consideration. The error arising from non-consideration can nonetheless be controlled since only so many coefficients remain unconsidered that a previously selected error limit (norm) has only a certain, acceptable preferably percentage error. If very many small coefficients are contained in tree structures (compression trees) of k-th order (wherein $1 \leq k \leq n-1$), then the compression effect will be very large. In order to attain this, at least one second tree structure (1-st order) is ascertained for each layer of the first tree structure (0-th order), wherein the layers are ascertained recursively. In a similar manner, a splitting off of details, i.e. an identification and sorting out, is undertaken with each decomposition just like in the first decomposition, which according to the state of the art takes place only over a so-called quantization. (Because the recognition of details corresponds to an interpolation, in this context one also speaks of the interpolation property of the wavelet.) The advantage of the method of compression presented thus lies in the consequent continuation of identification and sorting out of details without undertaking a quantization process running counter to the nature of wavelet decomposition. (Wavelet decompositions recognize arbitrarily large details and reproduce their size with random precision. A quantization process corresponds to a rounding process and intrinsically prevents a randomly precise reproduction of details).

In accordance with the invention, an a priori error check takes place, wherein the coefficients are first completely sorted according to their importance. That is, considering a specific error limit, established with reference to a specific manner of measuring errors (norm), only those coefficients (with the selection of a so-called $I_p$ norm of the largest amount of coefficients) that are necessary for reconstructing the measured data within a specific error limit are activated. The result is the advantage that no recursion, partial inverse transformation, quantization, or re-sorting into the compression-tree structure-storage unit is necessary for error assessment, but only a direct storage into the archives. Since a quantization is superfluous, the often considerable artefacts in the compressed measurement data that accompany a quantization are eliminated. With the method of the invention, it is not absolutely necessary to conduct a quantitative comparison of the coefficients that would presuppose knowledge of the size of the coefficients to be compared. Rather, a qualitative comparison suffices, which only makes a binary decision as to whether a first coefficient is larger than a second coefficient. Based upon the placing of the sorted coefficients in the memory unit of a tree structure, a tolerance limit decision can be made.

Following the concept of identification and splitting, the method of the invention allows a long-term estimation of energy distribution on the basis of fewer of the uppermost layers of the overview tree or the uppermost compression tree, since the uppermost layer contains the mean value information 58, i.e., the signal material, and the next layers 56, 50 provide information on their variation and/or their distribution. Therefore, an estimation of energy distribution requires only the display of a few wavelet coefficients, which results in shorter loading times.

Peculiarities of a specific time resolution for the measurement curve can also be represented through large wavelet coefficients of the corresponding layers. Peculiarities in deeper layers, however, are often interpreted in higher layers (coarser time structures) through the corresponding wavelet coefficients hence it usually suffices to first display regions in the visualization unit that contain only the few wavelet coefficients of the coarser time resolution. If peculiarities are observed there within a specific time range, then it is possible to represent (successively) only the areas of the next deeper layers that manifest these peculiarities in the layers above them. Furthermore, the possibility exists of addressing any desired layer or of skipping over several layers. Long loading times can be avoided by this direct searching out of peculiarities.

A further feature of the method is distinguished in that the amount of the wavelet coefficient values can be represented logarithmically, wherein the sign of the wavelet coefficient value can only be adduced for modification preferably through a color change in the representation. (The modification mentioned corresponds to the representation of the complex logarithm of the wavelet coefficient value.) The previously mentioned peculiarities thus become especially clear in many practical cases because this representation translates identical coefficient amount relationships of peculiarities into identical color-representation-coordinate height or brightness distances, for example.

It has proven to be especially advantageous that the compressed data are represented in a multidimensional, preferably three dimensional (the case n=2) structure such as a tree structure comprising a first surface as the plane for representation of coefficients of the overview tree and, proceeding from the first surface, (further) second surfaces extending preferably perpendicular or with varying angles as planes for the representation of coefficients of 1-st order compression trees. For all further orders k (wherein $2 \leq k \leq n-1$), analogously (further) (k+1)-th surfaces extending from the k-th surfaces preferably perpendicular or with varying angles are displayed, such as planes for representing coefficients of k-th order compression surfaces. For each of the tree structures obtained (k-th order compression surfaces with $1 \leq k \leq n-1$, as well as an overview tree), a representation for each of the layers contained in them is generated with the aid of control commands, which can be interpreted by a display unit. Moreover, the control commands are selected such that a previous representation, preferably a gray shadowing or color coding and/or height coding, falls due to each value contained in each layer, depending upon the preferably logarithmic amount value of the coefficients to be represented. The breadth of such a representation of coefficients can be varied.

In selecting control commands for representing coefficients, the breadth of the coefficient representation can be selected freely and can be adjusted by the user in accordance with the invention. The breadth of the coefficients themselves (i.e., the width of the wavelets and their "mother functions," of the scaling functions mentioned, which are represented by a coefficient) lies firmly with the layer numbers $s_0$ to $s_k$, which fall due to the coefficient. It has proven appropriate to count each layer number as a so-called accumulated layer number. This means that the layer number accumulated from the zero plane layer with each layer transition is numbered up by 1, independent of whether the layer transition takes place within one and the same tree level k, i.e., $s_k \to s_k+1$, or on a new tree level, i.e. $s_k \equiv$ constant, $s_{k+1} \to s_k+1$ (wherein $0 \leq k \leq n-1$). Thus, the effective number of layer transitions, and thus also of coefficient-wavelet-scaling function width doublings, is counted. If a wavelet/scaling function of the zero level layer on which the decomposition lies possesses the breadth M, then the corresponding wavelet possesses the breadth $M2^{S1}$ in the level, which is described by the layer coordinates $s_0$ to $s_k$. On the basis of their mode of construction, which is described further below, it is precisely M determining coefficients that suffice for a wavelet/scaling function of the breadth M.

A triangular representation is a preferred representation of a three-dimensional structure, wherein the breadth of representation of all coefficients of a layer drops linearly with the rising number of the layer from which they originate.

With a further representation, the breadth b of the representation of a single coefficient remains constant. On the one hand, this representation gives an overview over the dataset contained in a layer; on the other hand, however, the breadth of the layers represented sinks exponentially with its height (from layer to layer by half in each case), owing to which the coefficient representations might only be recognized with difficulty in high levels on conventional display units. In addition, their temporal position is not easily recognizable inside the tree structure.

The breadth b of the representation of an individual coefficient can also be adjusted proportionally to the breadth $2^S \Delta t$ of the wavelet represented by it (isochronous representation). This representation, on the one hand, provides an undistorted overview over the position and the proportion of each of the wavelets represented by a certain coefficient representation on the signal shown in the represented time range. On the other hand, a representation with exponentially rising breadth b falls due to the coefficients of the higher layers, owing to which, only space for the complete representation of coefficients of the lower layers of the overview tree is present on conventional monitor visualization units.

Advantageously, an isochronious, complete representation can also be selected. Such a representation corresponds to the isochronous representation, however all coefficients of all layers are displayed. This means that all coefficients of higher layers whose allocated wavelets/scaling functions begin in the time range to be displayed are displayed.

In accordance with a preferred method of the invention, precisely those coefficients that are necessary to reach a previously set representation exactitude are extracted out of the archives for representation of the measurement points. In this way, it is assured that the generation of an analysis overview is based completely upon the compressed data or coefficients. Consequently, it is not necessary to extract and decompress very large datasets from the archives, and subsequently to discard the very large amount of information that did not go into the representation result, in order to attain the required representational exactitude. In accordance with the invention, which coefficients are to be extracted are ascertained on the basis of generalizing the Nyquist sampling theorem as well as the uncertainty relation. The Nyquist sampling theorem states the following, as mentioned above using different words: If a function $f(x) = \Sigma_{\forall k} \alpha_k \phi_\epsilon(\chi - k\Delta t)$ is to be represented by second functions $\phi_\epsilon(\chi)$ each shifted $\Delta t$ further and having the breadth $\epsilon \sim 2^S$ (i.e., scaling functions or wavelets from the layer s) on a representation grid with the grid point distance $v\Delta t$, then $\epsilon$ must be small enough that at least one function $\phi_\epsilon(\chi)$ per interval of breadth $v\Delta t$ will apply. (The rational number $v>0$ indicates the relationship of time breadth represented per image point at $\Delta t$ when using conventional monitor display units.) Moreover, the size of the proportionality factor in $\epsilon \sim 2^S$ is ascertained using the uncertainty relation on wavelets, and lies in the order of magnitude of $\Sigma_{k=0}^{n-1} M_k (s_0, \ldots, s_k)$, wherein $M_k(s_0, \ldots, s_k)$ reproduces the number of coefficients of the wavelet used in the decomposition. (This number which otherwise is referred to as M for the sake of simplicity, may depend upon the exact layer, including precursor layers, inside the decomposition if, as mentioned on page 13, the wavelet used for decomposition changes from decomposition order to decomposition order, or even from layer to layer within one decomposition order.)

In evaluating the compressed data, a period of time is first established, and a number of datapoints is selected, through or with which a representation is to take place, or an equivalent determination is reached. Based upon this information, it is determined which coefficients must be extracted from the archives in order to generate the desired overview. It should be mentioned as a particular advantage that the number of coefficients to be read out of memory/the archives becomes weaker than square with the number of datapoints required for the evaluation-representation.

In accordance with a preferred method of the invention, the number of coefficients to be extracted will at most be a small whole number multiple of the number $N = \lceil (t_2 - t_1)/\Delta t \rceil$ (with $t_1$ and $t_2$ as the start or ending time and $\Delta t$ as the interval breadth of the representation) which are necessary for generating the overview, i.e., evaluation by interpolation. In this, the upper Gauss bracket $\lceil \; \rceil$ designates the next larger whole number to a desired real number.

Finally, a decompression and/or transformation of the extracted coefficients takes place based upon their representation with reference to all wavelets of the 0-th to (n−1)-th order selected in the tree structures into a representation related to a further wavelet, preferably a Haar wavelet, which is adapted to the desired interpolation objective.

In other words, a decompression takes place in n stages, wherein (based upon extracted coefficients) the coefficients of the tree structures of k-th order ($0 \leq k \leq n-2$, $n \geq 2$) in relation to the wavelets preselected in the respective tree structure are inversely transformed/decompressed and stored in the tree structure of (k−1)-th order. The coefficients obtained in this manner in all tree structures are subsequently subjected to an interpolation in which the indicator values of the representation control commands are calculated, since preferably a wavelet transformation is undertaken for recalculation of the inversely transformed-decompressed coefficients in relation to a representation wavelet, preferably a Haar wavelet which possessed interpolation characteristics corresponding to the desired display.

The possibility of the unambiguous inverse calculation of the original data of a wavelet transformation also permits a rapid wavelet transformation by connecting suitable, typically commercially available devices one behind the other. If a transformation is undertaken, whose underlying wavelet possesses the desired interpolation properties, then interpolation and decompression can be very efficiently undertaken using one and the same subassembly, and the resulting interpolation coefficients can be represented as interpolation.

With a restricted band breadth of a transition channel it is necessary to make a crude preview available as soon as a small number of (interpolation) coefficients have been transmitted, and to refine these as soon as further coefficients have been transferred.

In accordance with a further preferred embodiment of the method of the invention, it is provided that a correction of the measured values against undesired (signal) transfer function artefacts is conducted, wherein the m-th wavelets underlying the m-th tree structure ($1 \leq m \leq n$) of the (m−1)-th order are adapted to the spectral properties of the (m−1)-th order of the measured values to be recorded and/or those of the sensor. (In the extreme case, they are adapted for each layer of the individual wavelet to be subjected to a further decomposition of the next higher order.) The positioning and stamping of various amplification factors with which the measurement system assigns certain basic signal course curves are designated as the spectral property or spectral structure of 0-th order of a measuring apparatus (or the entirety of the measuring apparatus and measured object, in short the measuring system). The underlying signal profiles are those that are amplified by the measuring system by an adjustable factor, but are not distorted or changed in their design. For measuring systems that show no manifestations of saturation, i.e., those that operate linearly and undertake no reflection on their inputs, which are stored in memory and influence later events, these are the harmonic Fourier functions. Their spectral structure in this case is their Fourier-transformed transfer function. In a prism having a gas vapor lamp as an optical measuring system, the positioning and stamping of the amplification factors are often designated as spectral lines. Owing to their physically conditioned uncertainty, spectral "lines" come into appearance not as lines, but as more or less wide forms. The form of their spectral lines is designated as differential spectral structure of differential spectral properties of a measuring system. Generally, the (Taylor) moments of m-th order of the local statistical distribution of amplification factors-spectral lines are designated as a differential spectral structure of m-th order. (For example, the local statistical variance of amplification factors-spectral "lines" is designated with the spectral structure of 2-nd order.)

On the basis of signal theory, it is known that the spectral behavior of a sensor provides (even complete) information on the information contained in its signals in the form of its transfer function. The good adaptation of a compression device to the differential spectral structures (i.e., all orders m wherein $0 \leq m \leq n$ recorded by it) of a data source connected thereto is thus a precondition for reaching high compression factors, as well as for the correction of measured values against undesired transfer function artefacts. Here it can be rewarding (in spite of the higher technical expenditure) to adapt individual wavelets for each layer that is to be subjected to a further decomposition of the next higher order. [i.e., the various representation planes of a tree structure of a desired order k ($0 \leq k \leq n-1$) are allocated various wavelets alternating even inside one order each from layer to layer.]

In particular, the method specified in the invention is capable of monitoring as many data recording systems as desired, entirely asynchronously, compressing and archiving their data, and conducting a data analysis, preferably at separate stations, wherein, in accordance with the invention, three times as many accesses of an archive or library are to be undertaken, which are necessary as interpolation-integration-evaluation nodes for generating an analysis overview or an automatic analysis.

In order to provide an asynchronous, multichannel measured value recording, archiving, and evaluation system, it is provided that the receiver is connected with a large number of data sources. In particular, a differentiation between quantitative (sorting unit) and qualitative decision unit-filter unit takes place.

One particularly preferred embodiment of the device provides that this comprises a spectral analysis unit that is connected on the input side with the first and/or second memory unit and on the output side with the sorting and/or filter unit. Using the spectral analysis unit, a spectral analysis of the coefficients, including correction, can be conducted against undesired transfer function artefacts of the sensors.

In order to provide access to the compressed data to a large number of users, it is provided that a large number of evaluation units 20.1 . . . 20.K for decompressed or compression data-visualization devices 202.1 . . . 202.K for compressed data are connected to the archives. Moreover, as many evaluation units as are desirable may be provided to conduct the analysis overviews of the decompressed-compressed data, and subsequently to join them.

In addition to the above-described asynchronous recording and the compression and storage in memory, a further object of the invention lies in providing a method and a device of the previously mentioned art such as will facilitate generating a rapid and efficient (i.e., managing with few archive accesses) display-representation of the uncompressed-compressed data, especially in the "traditional" form suitable for raw data. On the other hand, a simple, rapid, and efficient analysis and representation of the compressed data is to be made possible (owing to which, on the one hand, a very simple estimation of the energy distribution of the data, and on the other, a rapid and secure recognition of peculiarities is possible, since the possibility is offered of extending gradually from a lower time resolution or even directly to a point in time of the occurrence of a desired peculiarity, with a possibly higher resolution.) In the interest of an overview, the descriptions of the devices will be provided separately below:

At least one device 20.1 . . . 20.K for solving the problem of displaying interpolated overviews especially on decompressed data [decomposition structure (−1)-th order] is distinguished by:

A receiver for the coefficients stored in the archives,

A decompression-inverse transformation unit connected to the receiver,

A display unit,

An interin memory positioned between the decompression and/or inverse transformation unit and the display unit, and A selection unit for determining a range to be indicated of data to be represented.

At least one device 202.1 . . . 202.K for solving the problem of representing especially interpolated overviews of compressed data [decomposition structures of 0-th to (n−1)-th order] is distinguished by:

A selection unit for determining a time range and a representation fineness of the data to be represented, especially to be compressed, A receiver for receiving selected coefficients of compression trees stored in the archives, An inverse transformation unit which calculates the coefficients required of at least one new decomposition structure of 0-th order (overview tree) to (n−2)th order (compression tree) from the coefficients received at least of the decomposition structure of (n−10)-th order, and generates control commands for the representation of a multidimensional structure via a display unit on the basis of all coefficients needed for representation.

The devices 202.1 ... 202.K are constructed in the preferred embodiment such that the control commands are calculated for one image element each of the display unit to be represented within a multidimensional structure, solely on the basis of their (k+1) many layer coordinates $s_0$ to $s_k$ (with $0 \leq k \leq n-1$, the layer coordinate $s_1$ is with $0 \leq l \leq k$ the variable which numbers the layers inside the representation plane l, and their values number the individual layers, wherein $s_{l-1} < s_1 \leq s_{max}$, $1 \leq l \leq n-1$, $0 \leq s_0 \leq s_{max}$ applies) of the time allocated to the coefficients as well as the possibly higher dimensional coefficient value, wherein a storage unit for saving the control commands generated and a display unit that processes the control commands stored in the memory, preferably asynchronously, are provided. This display unit can be realized, for example, using a commercially available Internet monitor station with a Web browser capable of VRML (e.g., Netscape Navigator, Internet Explorer).

With such devices as 202.1 ... 202.K, multidimensional, preferably three-dimensional structures, preferably tree structures, can be constructed. It is especially possible to recognize peculiarities on the measurement curve without great computing expenditure, and to recognize robust toward errors on the compressed data. The evaluation unit receives the wavelet coefficients of the compression trees at least of 1-st order by the receiver, calculates the required coefficients of the compression trees of lower order or of the overview tree, and prepares the coefficients obtained for all trees to be represented for display via the display unit.

Overviews of any desired size can be generated analogously using the devices 20.1 ... 20.K, suitable for possibly multidimensional raw data, without enormous amounts of data having to be received first from the archives, which would then fall victim when displayed on typical (commercial) monitor visualization units to their limited resolution or a possibly line side-connected interpolation.

In both cases (i.e., for the activation of a display unit 20.1 ... 20.K for decompressed raw data or a display unit 202.1 ... 202.K for compressed data), if gaps should occur in the received/adjusted region, the inverse transformation unit or data preparation unit first generates the missing coefficients within the gaps and sets their values to zero. Then the part of the tree of next smaller order (k−1, $1 \leq k \leq n-1$) is successively reconstructed on the basis of the supplemented coefficients. To the extent that a representation of compressed data is desired, a tree structure is generated for each of the tree structures received (compression trees of k-th order with $1 \leq k \leq n-1$ as well as an overview tree) and for each of the layers contained within them, with the aid of control commands which can be interpreted by the display unit 202.1 ... 202.K selected. In this, the control orders are selected such that a group control command is first allocated to each layer $s_k$ (with $s_{-1} < s \leq s_{max}$, $1 \leq k \leq n-1$, $0 \leq s_0 \leq s_{max}$) for a tree of k-th order ($0 \leq k \leq -1$), which contains the further control commands for representation of the layers numbered through with the control coordinates $s_k$. This procedure is continued successively for all control coordinates $s_j$ (with $0 \leq j \leq k-1$). If decompressed (raw) data are displayed through a display unit 20.1 ... 20.K, then a last reconstruction step [of 0-th to (−1)-th order] is conducted, which generates a possibly interpolated (i.e., freed of fine details for display) approximation of the raw data (if all layers were received within the time range to be displayed, i.e. $s_0=0$, and all coefficients were stored when raw data were recorded, this approximation is exact). If compressed data are represented by a display unit 202.1 ... 202.K, then they are sorted in such a manner in layers of layers by layers ... grouped associated control commands for each of the resulting elementary layers (those that contain no further layers, but contain representation values) according to their respective time coordinates, and provided with a representation value depending on the coefficient (i.e. value, along with all layer and time coordinates), preferably a gray shadow coding or color coding and/or height coding depending upon the preferably logarithmic amount value of the coefficient value to be represented. The represented values themselves in general are dependent not only upon the coefficient value itself, but also upon all layer coordinates as well as time coordinates, for example, if additional, place-dependent (i.e., coordinate dependent) brightness gradations are to give rise to a plastic 3-D impression on a typical commercial, computer assisted monitor display unit.

Further advantages, features, and details of the invention emerge not only from the claims as well as the features to be gathered from these-alone and/or in combination-but also from the following description of the preferred embodiments to be gathered from the drawings.

Figure 1A:
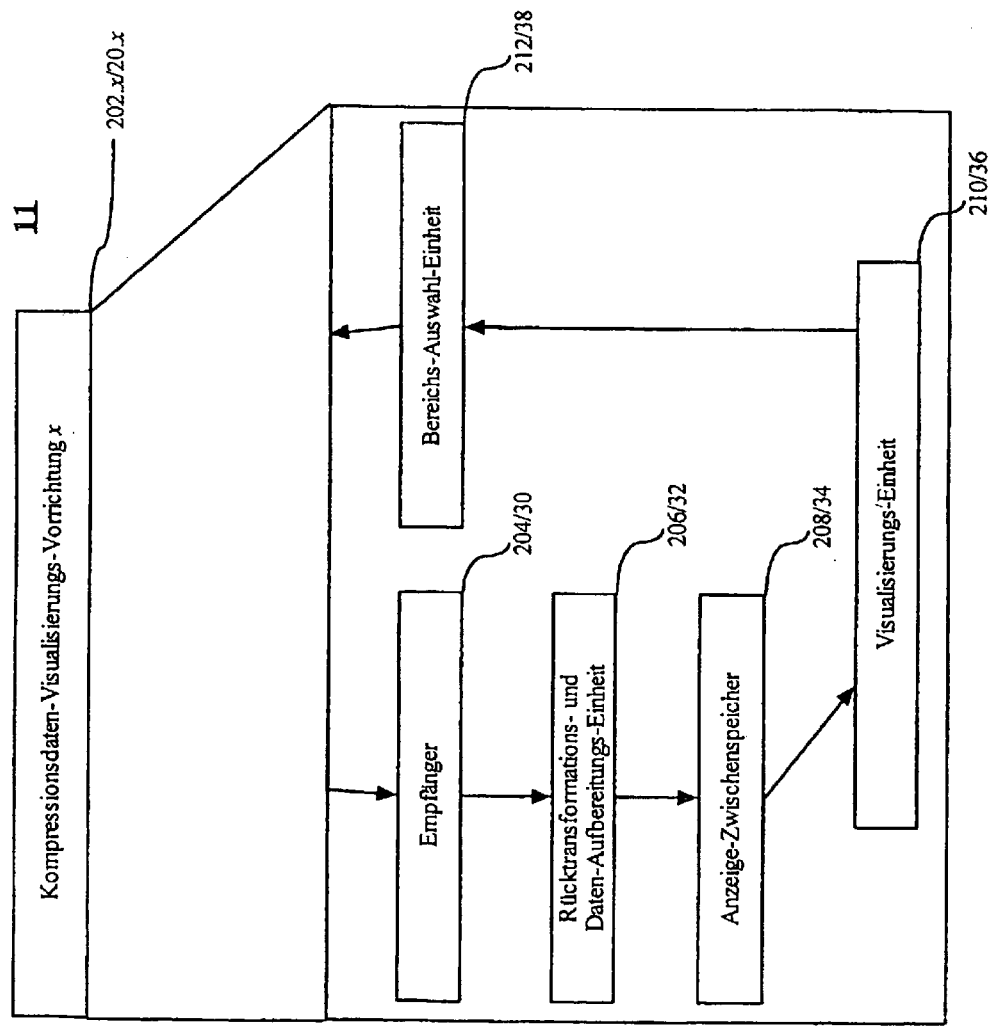
Figure 9:
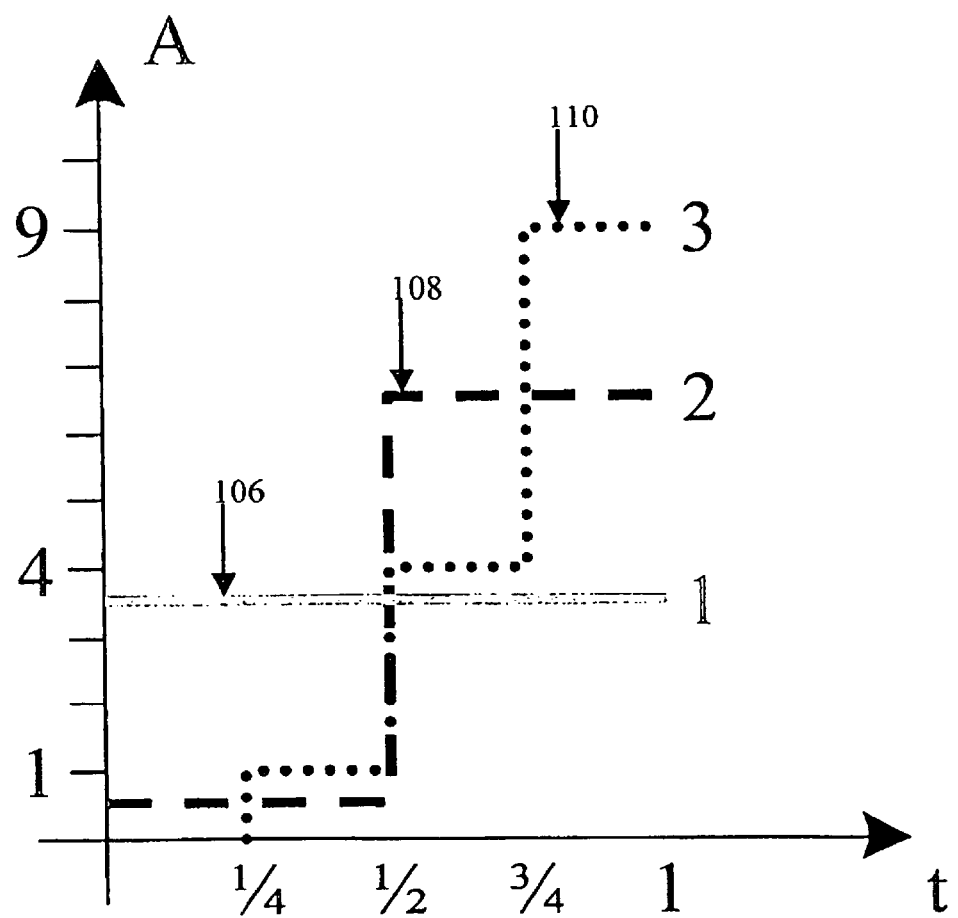
Figure 10A:
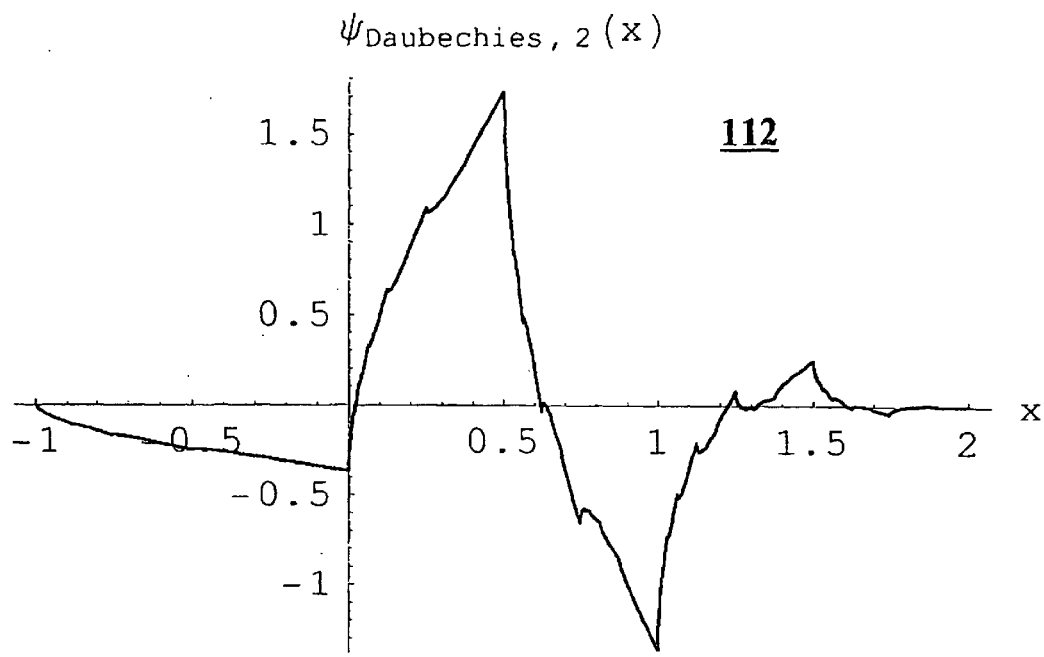
Figure 10B:
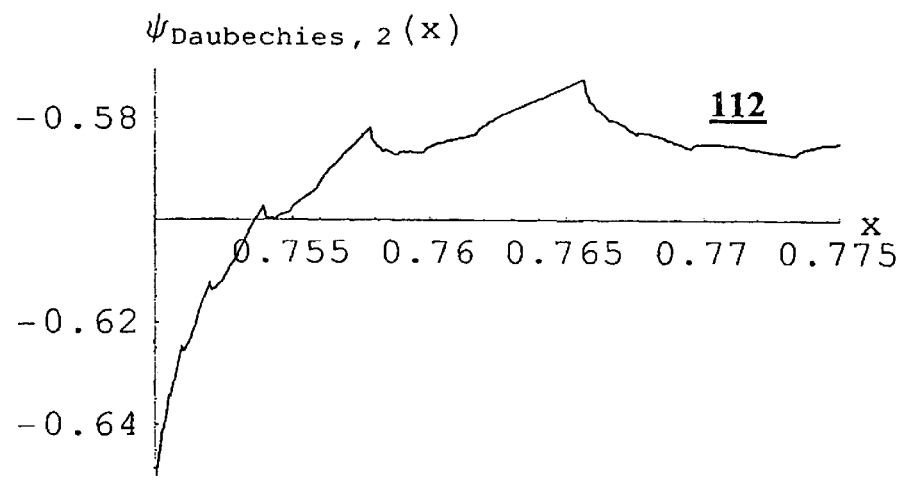

Shown are:

FIG. 1, 1a A block diagram of a data gathering, compression, and evaluation unit, FIG. 2a Temperature measurement curve 40 comprised of measurement points, FIGS. 2b–c Curve 41 composed of artificial values in various degrees of enlargement, FIG. 3 A basic tree structure of a wavelet transformation which reproduces the structure of the trees, which is called "overview tree" or quite generally "compression tree of k-th order" (wherein $0 \leq k \leq n-1$) below for the first transformation, FIG. 4 A diagram for clarification of the successive removal of detail information from a series of measurements, whereby the individual detail information is stored in the form of so-called layers, FIGS. 5a–d An example of a compression by means of wavelet decomposition using the Haar wavelet 74 (in FIG. 5b), FIG. 6 A graphic representation of the concentration of the intensity of coefficients of an increasing signal upon decomposition in an overview tree (perpendicular triangle) and compression trees (horizontal triangles, wherein only three arbitrarily selected triangles were represented for a better overview), FIG. 7 a logarithmic representation of the amount of the coefficient of the overview tree (compression tree of 0-th order) of temperature in accordance with curve 40 in FIG. 2a, FIG. 8 A logarithmic representation of the amount of the coefficients of the compression tree of the first order analogous to FIG. 7, FIG. 9 An example of a decompression via wavelet decompression using the Haar wavelet, FIG. 10a A graphic representation of the Daubechies wavelet of order 2 (the so-called $d_2$ wavelet) and FIG. 10b A graphic representation of a section of the Daubechies wavelet in accordance with FIG. 10a, FIG. 11 A graphic representation of the concentration of the intensity of the coefficients of the constant signal 41 in accordance with FIGS. 2b/2c during decomposition when n=2 in an overview tree (perpendicular triangle) and in compression trees of 1-st order (horizontal triangles), wherein the breadth of representation of the entire coefficient drops linearly with the number of the layer, FIG. 12 A three-dimensional representation of coefficients (when n=2), wherein the breadth of the representation of an individual coefficient remains constant, FIG. 13 An isochronous representation of coefficients (when n=2), wherein the breadth of the representation of an individual coefficient is proportional to the breadth $2^S \Delta t$ of the wavelet represented by it, FIG. 14 A three-dimensional representation of coefficients (when n=2) in isochronous complete representation, wherein all coefficients of layers are displayed, FIG. 15 A Daubechies $d_2$ wavelet FIG. 16a A rotated view of FIG. 13, which permits the structures of the compression tree of the 1-st order to emerge more clearly in the region that is shown enlarged in FIG. 16b, FIG. 16b A section enlargement of the representation shown in FIG. 16a, FIG. 17a A 1-st order compression tree for the temperature measurement curve 41 in accordance with FIGS. 2b, 2c, FIG. 17b An amplified contrast representation of the compression tree in accordance with FIG. 17a, FIG. 18a The first compression tree of 1-st order on the first (deepest) layer of the overview tree (0-th order compression tree) for the temperature measurement curve 41, in accordance with FIGS. 2b, 2c, FIG. 18b The amplified contrast representation of the first compression tree in accordance with FIG. 18a, FIGS. 19a–b The second compression tree on the second layer of the overview tree (0-th order compression tree) for the temperature measurement curve 41 in accordance with FIGS. 2b, 2c and FIGS. 20a–d Enlarged representations of 0-th order compression trees (FIG. 20a) 1-st order (FIG. 20b), 2-nd order (FIG. 20c) for the temperature measurement curve 41, in accordance with FIGS. 2b, 2c.

The way in which decompositions of the orders 0 and 1 can be implemented will be explained below using n=2 as an example. The generalization to orders of any desired height k (wherein $0 \leq k \leq n-1$) will be explained thereafter. FIGS. 1, 1a shows a block diagram of devices 10, 11 for the recording, compression, and evaluation of data that are made available by a large number of data sources 12.1 . . . 12.N, such as sensors, for example. Sensors 12.1 . . . 12.N are connected to a receiver having interim memory 12, in which the data made available from sensors 12.1 . . . 12.N can be stored in the interim memory. In this, as many sequential sensors 12.1 . . . 12.N as desired can be asynchronously connected to the interim memory 14. The interim memory 14 is connected to a compression and spectral analysis device 16 in which a compression and/or a spectral analysis of the data received is conducted. Finally, an archive 18 is provided, in which the compressed and if need be spectrally corrected data can be filed or stored in memory. A large number of compression data visualization devices 202.1 . . . 202.K is connected to the archives through which, for example, analysis overviews such as graphic representations of data recorded can be represented.

The compression and spectral analysis device 16 comprises a first calculation unit 22.0 as well as a (first) memory unit 23.0 for the calculation and storage of a first tree structure such as an overview tree (0-th order compression tree), after which a second computing unit 24 with a (second) memory unit 25 is connected in series for the calculation and storage of a second tree structure as a 1-st order compression tree. The memory units 23.0, 25 are connected to a spectral analysis unit 26. An output of the second memory unit 25 and of the spectral analysis unit 26 is connected to a sorting and filtering unit 28, the output of which is connected to an input of the archives 18.

The evaluation unit 20.1 . . . 20.K or compression data-visualization device 202.1 . . . 202.K (which are described together below due to their structural similarities) includes a receiver 20 or 204 which is connected to archives 18 via a data transfer medium such as a bus system. If data gathering takes place in localities without electromagnetic emissions whose intensity is capable of disturbing electrical or electronic installations, for example in a medical facility, then commercially available lines designed for this purpose will suffice for forwarding data. However, if data gathering takes place in industrial facilities, then lines based upon optical waveguides (OWG) are preferable owing to the often strong electromagnetic emissions, or, if air serves as the transfer medium, transfer technologies should be used whose transfer modes are possibly very broad band, such as spread spectrum technology, pulse code modulation, etc. The receiver 30 or 204 is connected on the output side to a decompression unit 32 or inverse transformation and data preparation unit 206, which is connected to an analysis display system 36 or a visualization unit 210 via a display interim memory 34 or 208. The analysis display system 36 or the visualization unit 210 is connected to a region selection unit 38 or 212, which has access to the archives 18 via the data transfer medium.

In calculating compression trees of k orders (wherein $0 \leq k \leq n-1$) of any desired height that can be set in advance by personnel, it is first established by the personnel operating the invention which decomposition orders are to be adduces for analysis/sorting from devices 26, 28.

The compression and spectral analysis device 16 is made available to the personnel with a certain number Z established in advance of preferably commercially available tree computation units as they are already being used in 22.0, 24. The calculation units can consist of several subcalculation units that perform their operations on parts of the data to be decomposed, and a reintegration unit that reassembles the partial results. The more of these computation units that are present, the more rapidly the device 16 will operate effectively.

First of all, a decomposition, preferably using a wavelet transformation or wavelet packet transformation, is undertaken starting with the data stored in 14 from a tree computation unit, wherein previously established wavelet-scaling function coefficients are used.

To the extent that they are needed for analysis and/or sorting as well as subsequent storage, the calculated layers are stored in an interim memory. The memory 14 can be freed for further use via the decomposition units.

Subsequently, the layers present are successively allocated to the available computation units for all decomposition orders k (wherein $0 \leq k \leq n-1$) in the k-th step. The allocated computation units are programmed with previously determined wavelet-scaling function coefficients (which were stored in archives 18 for this purpose and for inverse transformation), after which they are started, wherein the memory used in step k−2 (with $k \geq 2$) may also be used (for k=1, the memory from unit 14 may be used here, as long as this is provided for structurally).

As in step 0, the coefficients calculated by the tree computation units, to the extent that they are needed for analysis and/or sorting as well as subsequent storage, are stored in an interim memory, after which the memory from step k−1 is released.

After being run through the preferably asynchronously operated spectral analysis device 26, the coefficients of at least compression trees of (n−1)-th order may reach the sorting and filtering unit 28, which decides on their storage in archives 18 and in this way, in case some coefficients are not stored, factually undertakes a compression.

Compression means omitting superfluous information, referred to as "details" below, from an arbitrary measured value series (for example 40 in accordance with FIG. 2), which consists of measured values of the same type as, for example, the temperature of a boiler, the surface potential of a heart muscle (electrocardiogram), or the magnetic vector potential (magneto-cardiogram) of the heart, etc. The omission of details takes place in two steps: First the details are determined, after which an evaluation of their relevance takes place. Irrelevant, chiefly small details are left out. Usually the details are determined or measured in that a measured value series is broken down into units of functions (wavelets or their "mother functions," the so-called scaling functions, on the basis of which they are constructed) that are suited for representing the desired details. Since wavelets are basically functions having a mean value of zero, these can be adduced for representing details of any desired position and size following a suitable shift or compression/extension of the wavelet. As a consequence of their disappearing mean value, one can also regard their compression/extension as a variation of their frequency and the details consequently as frequency components of random place and "tone height" in the decomposed signal.

In evaluating relevance, a measurement concept is adduced for the quantitative evaluation of differences (for example, on the basis of errors caused by interpolation, compression, or quantization) between the representation of the measured value series and the measured value series (for example 40) itself, which will be referred to as the "norm" below. A detail is considered irrelevant if the difference between the measured value series and the representation of the measured value series arising after omission according to the terms of this norm falls below a certain specified tolerance limit. Here the so-called energy norm or the Euclidian norm or $l_2\|\|_2$ of a function f or the coefficients $(c)_V$ of its measurement series $\|f\|_2$=[paste in left formula page 22] or [paste in right formula, page 22 middle] is of special importance.

In this, it is not absolutely necessary to undertake a concrete comparison, however the sorting unit 28 of the compression and spectral analysis device 16 can be used to make the tolerance limit decision based solely upon the placement of coefficients ascertained during the decomposition of the function in the sorted representation. In other words, no quantitative comparison that presupposes a knowledge of the magnitude of the curve to be compared takes place; instead a qualitative comparison, which concerns only the binary decision as to whether coefficient 1 is placed before or behind coefficient 2 by the sorting unit, takes place.

Generally the entirety of an identification number and the associated numerical marking of a value (e.g., the pair for measuring time and measured value) are designated as a coefficient. [In the present case, the identification number consists of all layer coordinates and time coordinates, i.e. for a coefficient of a tree of k-th order of a (k+2)-tupel of (k+1) many layer coordinates and a time coordinate.] The actual numerical mark is designated as the coefficient value. Measured values can indeed be measured at random times, but in fact are always measured at few discrete times. This raises the question of how the possible vectorial measured value would look at the times not considered in the measurement, hence each time-point recorded measured value is allocated an associated "course curve" [the so-called (vectorial) transfer function], wherein the entirety of all "course curves" is designated as the base. If one joins all "course curves" multiplied with their associated measured values together again, there results a largely continuous overall curve which provides the associated measured value at each measuring time point. The base of "course curves" suited for a certain problem, which reproduces the information contained in the measured values and which would also become apparent with a temporally infinitely fine measurement, is referred to here as "spectral decomposition." (If the overview tree is decomposed using the Haar wavelet, this curve is not necessarily constant/continuous because the Haar wavelet itself is not constant/continuous.)

In accordance with the invention, a wavelet decomposition takes place in each computation unit in each step of the order k (with $0 \leq k \leq n-1$). If n=2, the coefficients ascertained in this connection are first inserted into the overview tree structure memory unit 23.0 in the manner of a tree structure 42.0, in accordance with FIG. 3. Then a second wavelet decomposition takes place in the second computation unit 24 whose coefficients are sorted into compression tree structure memory 25 in accordance with a compression tree structure 42.1, which corresponds to that of the overview tree structure 42.0. If n>2, the functional units 24 and 25 are picked up as functional units 22.1 and 23.1, possibly supplemented by further functional units 22.2 and 23.2 to 22.(Z−1) and 23.(Z−1), after which the decompositions of the order 0 to n−1 are undertaken in accordance with the description of the compression and spectral analysis device 16 (see page 19).

The wavelet transformation is preferably a matter of the so-called "rapid wavelet transformation," via which, on the one hand, it is possible to conduct the transformation of randomly large parts of the measured data, and which, on the other hand, permits further use of the storage place reserved for the measurement data or, in the k-th step wherein $2 \leq k \leq n-1$, the storage space reserved for the decomposition coefficient of the (k−2)-th step in storing the coefficients of the tree 42.k. If all decomposition coefficients of the (k−1)-th step do not enter into the evaluation through the spectral analysis unit 26 or are explicitly to be stored by the compression and spectral analysis device 16 in archives 18, it is even possible to use the unneeded storage space of the (k−1)-th step to store the coefficients of the tree 42.k further. An algorithm for generating the tree types 42.0–42.(n−1) is identical up to the selection of the underlying wavelet.

Figure 3:
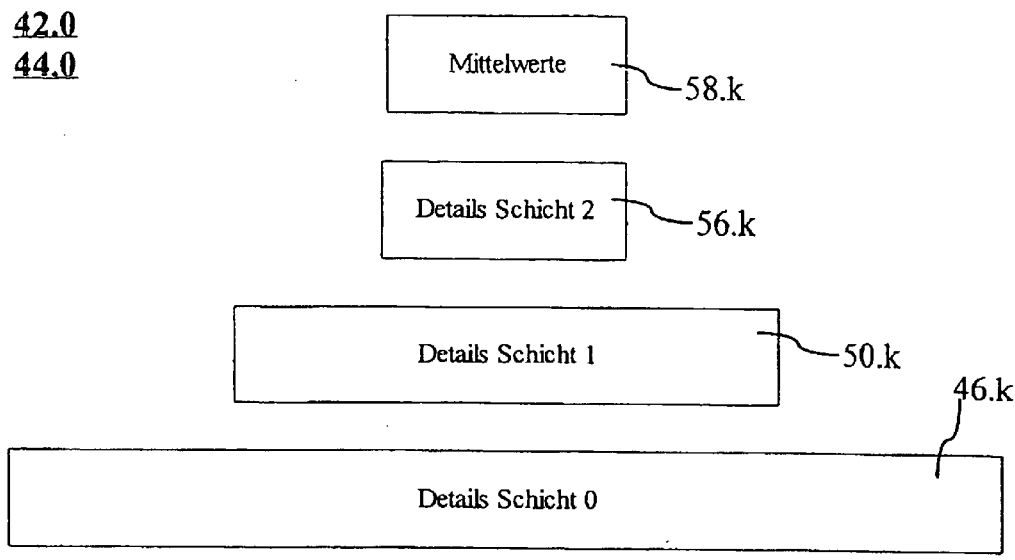
Figure 4:
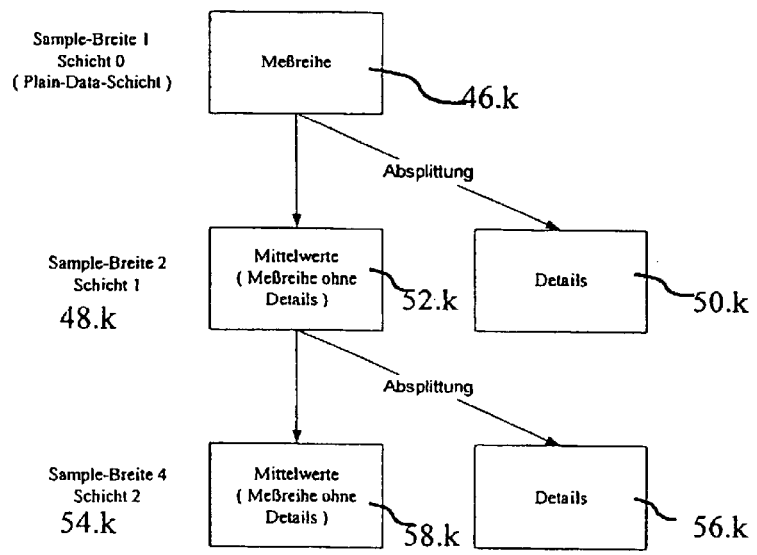

A schema for clarifying the construction of each of the layers of all tree structures 42.0–42.(n−1), which corresponds to a successive removal of [detail] information from a measurement series, is represented in FIGS. 3 and 4. As is typical in the literature of the state of the art, the numeration 46.0–58.(n−1) of the individual layers is implemented from bottom to top in representing the trees, and from top to bottom in representing the decomposition that leads to the tree structure. In using the "rapid wavelet transformation," the original data are first entered (in the 0-th step, these are measured data) in a lowermost (according to FIG. 3) layer (layer zero) 46.k (with $0 \leq k \leq n-1$). In a first layer 48.k, details 50.k split off from the original data, and leftover measured values 52.k are stored in memory. The mean values (measurement series without details) 52.k are used as input data for a next higher level 54.k, which once again contains details 56.k of mean values 52.k of the preceding layer, as well as left over mean values 58.k. Moreover, the details are doubly as large from layer to layer in each case.

The wavelet transformation of each step ends when the details have reached a previously selected magnitude and/or a specified layer number is reached, and/or if a layer contains fewer than M coefficients, wherein the wavelet is established by M coefficients. Indeed, this criterion for ending the transformation is the most used, but is in no way cogent. Without violating the integrity of the measurement series 46.0 [and in sequence also 46.0–46.(n−1)], it can be filled with zero data so that in each layer, more than M coefficients are left over.

The construction of the trees 42.0–42.(n−1) can preferably be conducted recursively. For this, details 50.k of the greatest fineness possible are first split off from the record 46.k (with $0 \leq k \leq n-1$) of the original data (for k=0 measurement data), which the interim memory 14 has provided, and are stored together with the mean values 52.k remaining in the same memory sites that were previously covered by the original data 46.k covered. For $1 \leq k \leq n-1$, the recursion consists in allowing the role of the original data 46.(k−1) to fall, due to the mean values 52.k, 58.k that have arisen, splitting off details again, and storage together with the mean values left over instead of these mean values. This does not mean, however, that checking the error that arises due to compression requires a recursion in which the omission or change of coefficients into compression is verified over and over, for example by decompression, and if need be discarded. Even if this method is typical, it becomes superfluous in the framework of this invention through the n-stage decomposition of the measurement data into an overview tree and several compression trees.

In accordance with the invention, at each time contained in the trees 42.k (with $0 \leq k \leq n-1$), an associated wavelet coefficient is stored in the form of a (k+3) tupel based upon the layer coordinates $s_0$ to $s_k$ of its measuring time and the coefficient value proper. Moreover, the construction and storage of trees 42.k takes place in the form of analysis steps, since first of all the first M+1 original data coefficients (for k=0, these are measurement time and measured value pairs) are filed in internal memory places of the tree structure memory units 23.0–23.(Z−1), wherein M is the number of wavelet coefficients necessary for representation of the wavelets selected. Then the first of the detail coefficients 50.k as well as the first of the mean value coefficients 52.k are calculated and filed in the memory places of the first two original data values/measured values. These are indeed written over in this manner, however they can be reconstructed at any time. In each further decomposition step, the remaining (M−1) coefficients are supplemented by two new coefficients and the process described in the preceding point is repeated. In this manner, only [3(M+1)−2] more memory places are needed, as original data values/measured values are read out of the interim memory unit. The number 3(M+1)−2 originates first from the M+1 internal memory places, and second from M−1 each coefficients left over on the left and right edges of a plane level, which take up the marginal effects that, for example, the known star-shaped marginal artefacts generate in the 2-dimensional Fourier transformation.

With known wavelet compression methods, the coefficients occurring in the overview tree 42.0 are rounded or quantized to as few as possible frequently occurring numerical values, so-called quantization levels. The compression can be controlled via a suitable selection of the quantization level as well as its number, which nonetheless is associated with difficulties, since in practice often not only horizontal/ genuine plateaus arise, but also plateaus that increase in a non-linear manner, or curved "plateaus." The quantization described will pixel these "plateaus" into horizontal segments, although this is not necessary since wavelets are preeminently suited for the interpolation of non-linear function curves as well. If only one quantization level is used, the representation of the measured values is merely a constant whose value assumes the mean value of the measured value series. The compression is maximal, whereby only three values, the beginning and end of the function and the coefficient value, must be stored in memory. If each coefficient value that occurs is used as a quantization level, then the representation of the measurement series is indeed exact, however in practice there is no compression.

Thus, in accordance with a basic concept of the invention, further wavelet transformations take place, wherein the next higher compression tree 42.k (with $1 \leq k \leq n-1$) is calculated or set up over each tree 42.(k−1) of (k−1) order. In other words, for $1 \leq k \leq n-1$, each layer 46.(k−1), 50.(k−1), 56.(k−1) . . . of a compression tree 42.(k−1) of (k−1)-th order is decomposed once again in a "compression tree" of overall k-th order, which is here designated as compression tree 42.k. This process is continued until k=n−1. In accordance with the invention, it is apparent that only few coefficients possess significantly large values in each compression tree 42.(n−1), and most assume nearly the value zero. The compression tree 42.(n−1) itself contains the split off details 50.(n−1), 56.(n−1) as well as a layer from the left over mean values 58.(n−1) of the last decomposition undertaken.

Below, a wavelet decomposition is described by way of example, with reference to the example of function 64 represented in FIG. 5a.

Figure 5A:
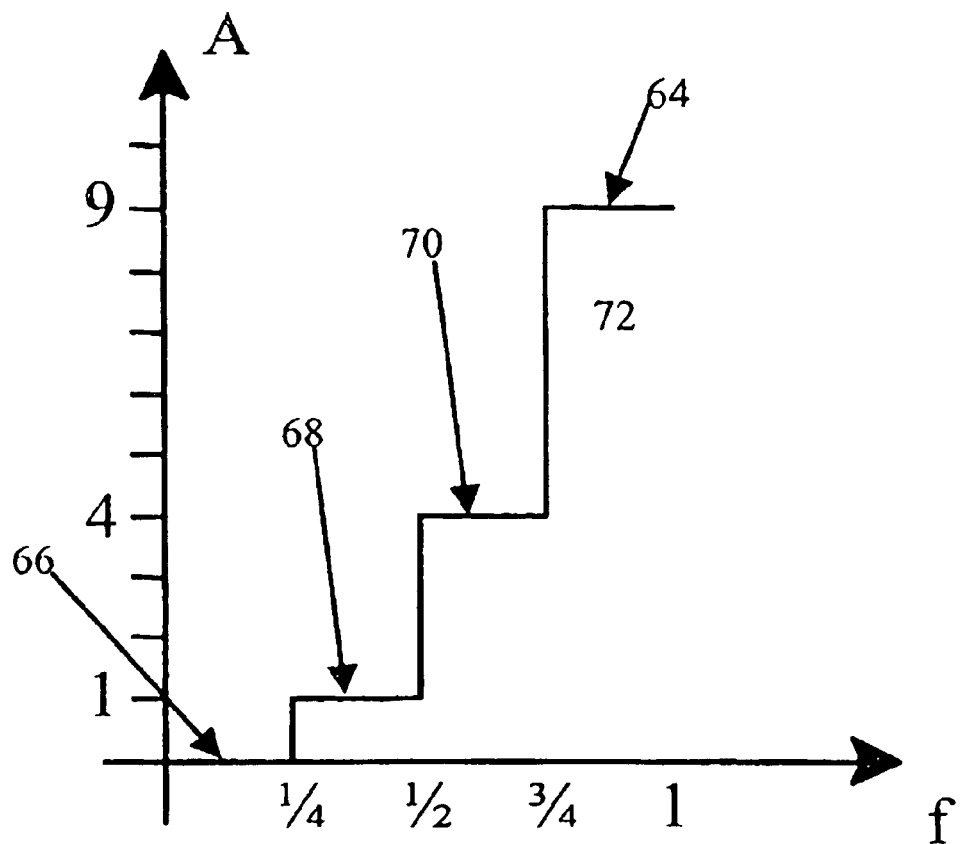
Figure 5B:
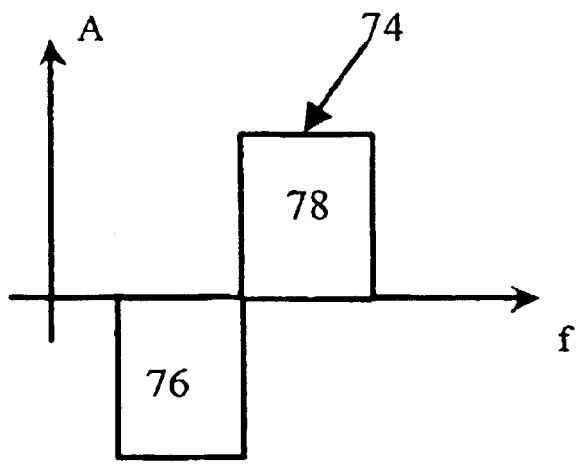
Figure 5C:
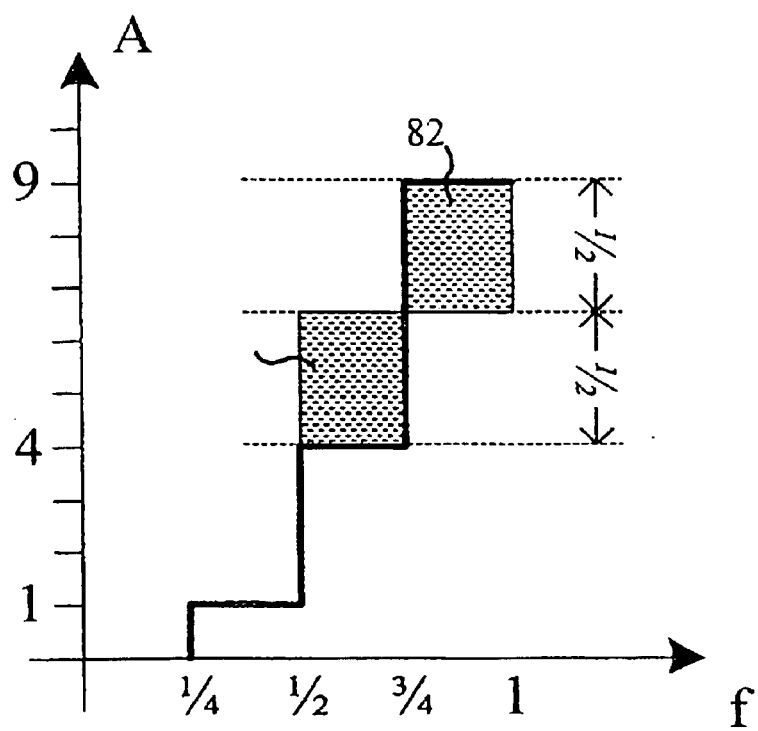
Figure 5D:
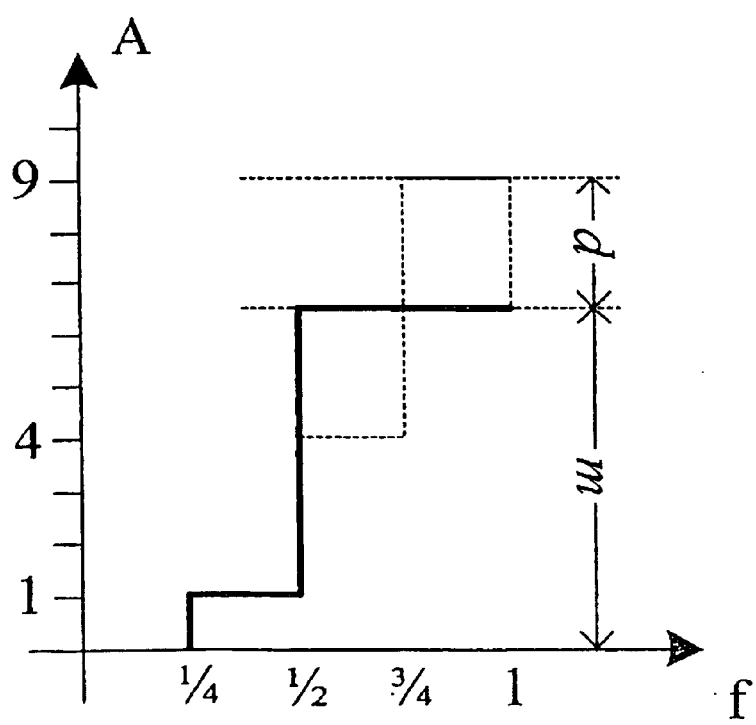

Function 64 consists of four blocks 66, 68, 70, 72, which are to be decomposed into details and mean values with the aid of the wavelet 74 (the Haar wavelet) represented in FIG. 5b (block 66 possesses the height of zero). The wavelet 74 has two blocks 76, 78 whose size is adopted with the value ±1, so that two copies, i.e. pairs of blocks 76, 78, of the function 74 can be fitted into the functions 64 that are to be analyzed, as is represented in accordance with FIG. 5c. The fitting (halving the length and height as well as suitable displacement) of the Haar wavelet into the right half of the function 64 is represented in FIG. 5c, wherein a detail is graphically disclosed as the height difference of the projecting part of a right block 82 over a left block 80. The result of this is a detail $d_r=(9-4)/2=2.5$. FIG. 5d illustrates the calculation of the mean value which is graphically ascertained through the reversal of the projecting part 82 of the right block, wherein a mean value of $m_r=(9+4)/2=6.5$ results.

Likewise, a mean value and a detail arise for the left blocks 66, 68 of function 64, i.e. a function out of 4 blocks 66.72 is first decomposed into two mean values and two details. As represented in FIG. 3, the details are stored for example in layer 1 of overview tree 42.0, wherein the mean values can once again be decomposed into a detail in layer 2 and a mean value in layer 3. Overall one obtains a mean value and three details. In this example, it is apparent that the detail $d_1$ of the left blocks 66, 68 at $d_1=(1-0)/2=0.5$ is basically smaller than the detail $d_r$ of right blocks 70, 72. To the extent that it is acceptable with reference to a specified tolerance to replace the two left blocks 66, 68 with a large block of height 0.5, $d_1:=0$ can be set without essentially changing the function.

Finally, a measuring time is allocated to the details $d_1$ and $d_r$, at which these assume a value unequal to zero for the first time. In the case described, the measuring time of ½ is allocated to detail $d_1$ and the measuring time of zero is allocated to detail $d_r$. Generally, a detail belongs to the measuring time $t_{detail} = \lfloor t_{min.\ Measuring\ point\ considered}/(2^A \Delta t) \rfloor$ if the smallest measuring time input into its calculation is $t_{min.\ Measuring\ point\ considered}$, s is its layer number and $\Delta t$ is the time lapsed between two measurements, wherein the lower Gauss brackets $\lfloor \ \rfloor$ designate the next lower whole number to an arbitrary real number.

Figure 2A:
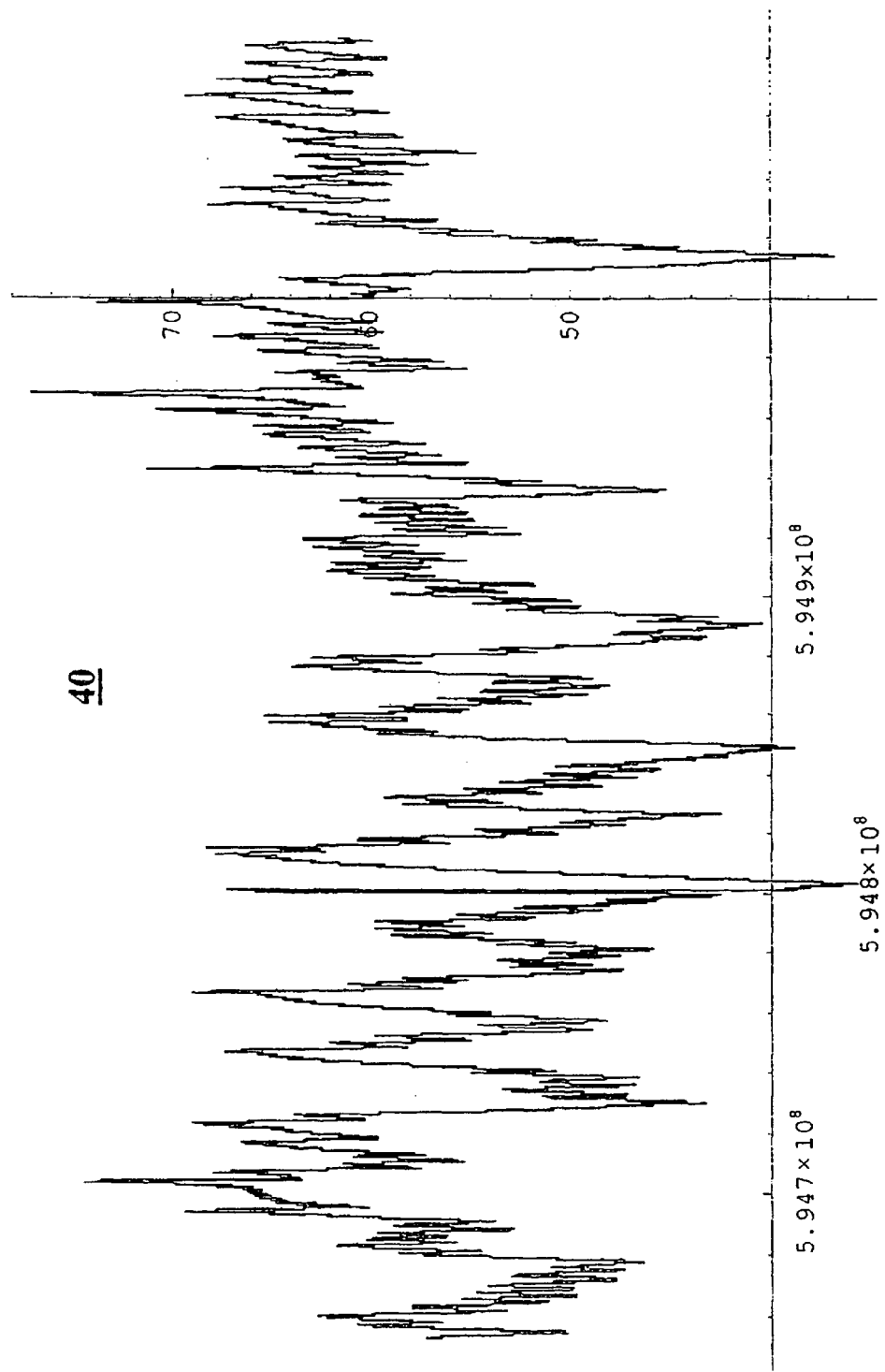

The wavelet decomposition described is based upon the general principle of classifying the coefficients of a function to be decomposed, such as the measurement series 40 in accordance with FIG. 2a or the example function 64 in accordance with FIG. 5a, into pairs and calculating a weighted average on them, and generally calculating two additional coefficients on them. The further coefficients arise in that, except for the Haar wavelet 74, directly adjacent (i.e., shifted $2^S \Delta t$ in relation to each other) wavelets genuinely overlap.

If the function to be decomposed in the form of coefficients $c_k$ (for k=0, . . . , N), their details are given through the coefficients $d_k$, the wavelet in the form of coefficients $g_l$ (for 1=2-M, . . . , 1, i.e., M coefficients determine the wavelet), and its associated mean value determination function (the so-called scaling function) in the form of coefficients $h_l := (-1)^1 g_{l-1}$ (for l=0, . . . , M-1), then the decomposition explained in the above example (M=2, $h_0 = h_1 = \sqrt{2}/2$, $g_0 = \sqrt{2}/2$, $g_1 = (-\sqrt{2}/2)$) can be brought into the following generalized form:

$c_{k,\ next\ higher\ layer}$=[paste in right side of formula (a)][paste in formula (b), page 27]

The calculated detail coefficients $d_k$ are entered in the first detail layer 50 from FIG. 3, the mean value coefficients $c_{k,\ next\ higher,\ layer}$ assume the role of coefficient $c_1$ in the next decomposition step.

Three things are striking in considering these formulae:
  In formula b, the index k appears only doubled on the right side. Therefore the coefficients $c_1$ are processed only in pairs as indicated above.
  In both formulae, only sums of products of the coefficients $c_1$ occur with constant coefficients. Such calculation formulae are called linear, and make it possible to conduct the decomposition first on a randomly small/large part of the coefficients $c_1$ and to later combine them through simple addition.

The choice of the size determining the wavelet at M=2, $g_0 = \sqrt{2}/2$, $g_1 = (-\sqrt{2}/2)$ (the coefficients $h_1 := (-1)^1 g_{1-1}$ are established by the coefficients $g_1$) generates the already described Haar wavelet. Thus a very few, precisely established parameters suffice to establish a relatively complicated decomposition that is a consequence of their mode of construction and conditions their so-called self similarity. The wavelet established by M=4, $g_{(-2)} = (1+\sqrt{3})/(4\sqrt{2})$, $g_{(-1)} = (3+\sqrt{3})/(-4\sqrt{2})$, $g_0 = (3-\sqrt{3})/(4\sqrt{2})$, $g_1 = (\sqrt{3}-1)/(4\sqrt{2})$, the so-called second order Daubechies wavelet 112 in accordance with FIG. 10a–b should serve as a simple example.

Examples for the event that n=2 will be shown below in order to illustrate the explanations above.

Figure 6:
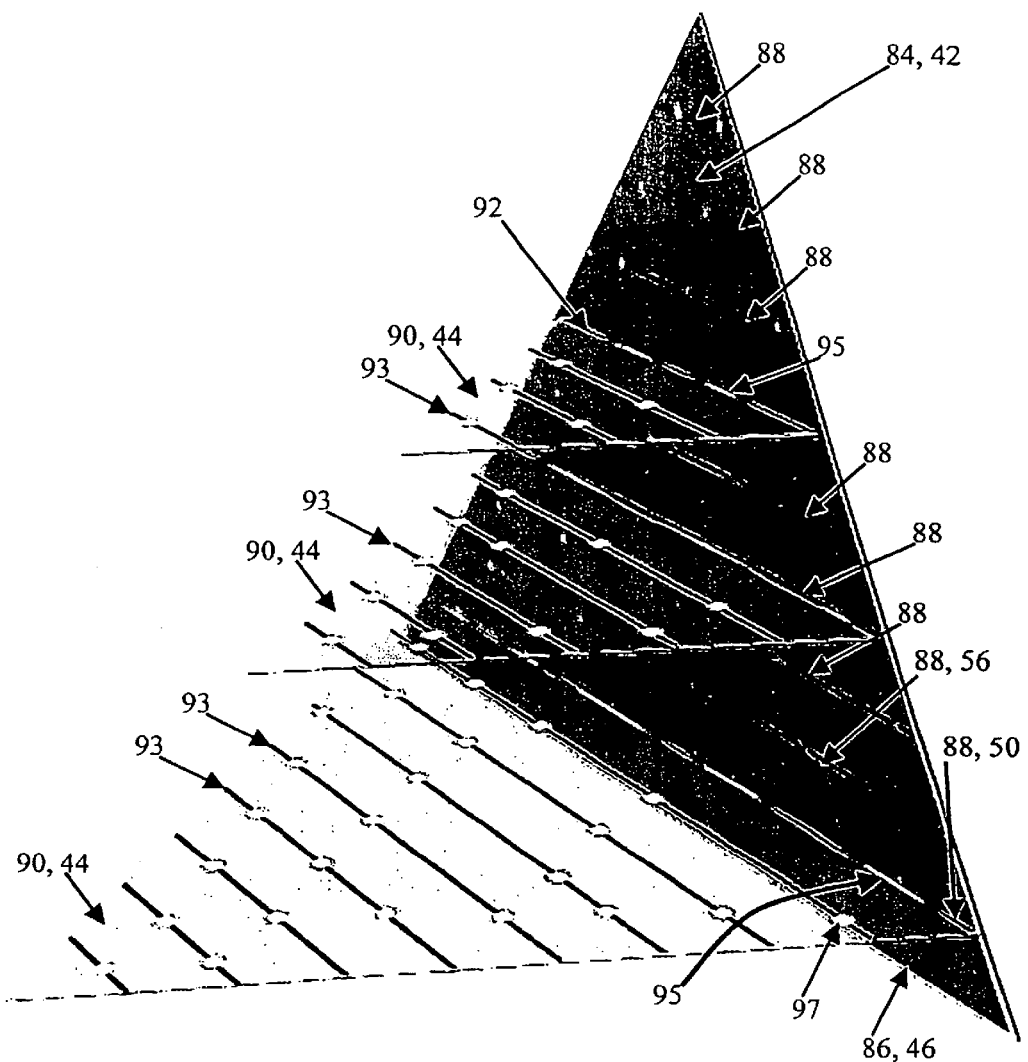

FIG. 6 shows a graphic representation of the intensity of coefficients of a constant signal during the decomposition into overview and compression trees, which illustrates one of the possible constructions of the representation of compression trees through the suitable assignment of display values (see page 12). As explained before, the received measurement data 46.0 of a function such as 40 in accordance with FIG. 2a through the overview tree structure memory unit 23 according to the process in accordance with FIG. 4 are decomposed into the first tree structure 42.0 in accordance with FIG. 3, which in FIG. 6 is represented by the vertical triangle 84. The triangle 84 has parallel running dark lines 88, along a base edge 86, which corresponds to the layer, 46.0 (zero-th layer); these lines represent the different layers 50, 56 of the tree structure 42.0.

All details obtained through the decomposition are subsequently decomposed in the same manner, but if need be with reference to another wavelet. In this way, compression trees 42.1 in accordance with FIG. 3 arise, which are represented in FIG. 6 by horizontal triangles 90. The triangles 90 have parallel dark lines 93 along their base edges 92 which represent the various layers of the tree structure 42.1. In the course of dark lines 88 or 93, bright course curves 95 or points 97 are represented, wherein the brightness of the course curves 95 or light points 97 corresponds to the number of coefficients that have arisen in connection with the decomposition, for example, of the constant temperature profile 40 in accordance with FIG. 2a.

The concentration effect that arises from this (narrow punctiform arising from wide, bright course curves) is the source of the good compression capacity of the present process.

To the extent that the measurement data are present as a constant function in the example described, the mean temperature, for example, will occur only in the uppermost layer of the overview tree. Only the coefficients for deviation from the mean temperature occur in the layers lying under this. FIG. 7 shows a logarithmic representation of the amount of coefficients of the measurement series 40, in accordance with FIG. 2a, which consists of ca. 14,400 measurement points in the example described. Moreover, the first 7,200 coefficients are allocated to the first layer of the overview tree, the subsequent 3,600 coefficients are allocated to the second layer, the next 1,800 coefficients are allocated to the third layer, etc., wherein each subsequent layer has ca. half as many coefficients as the preceding layer. [Generally there will not be precisely half as many coefficients, but up to (M=1) more, because the Haar wavelet/scaling functions (M=2) used here overlap, and all coefficients whose wavelet/scaling function touches the rim must be taken into consideration. When using a wavelet with M>2 this effect is further amplified because the wavelet/scaling functions mutually overlap, therefore $\lfloor M+½ \rfloor$ wavelets/scaling functions each overlap the same point in time at the beginning and end of the measuring range in any given case.

Figure 7:
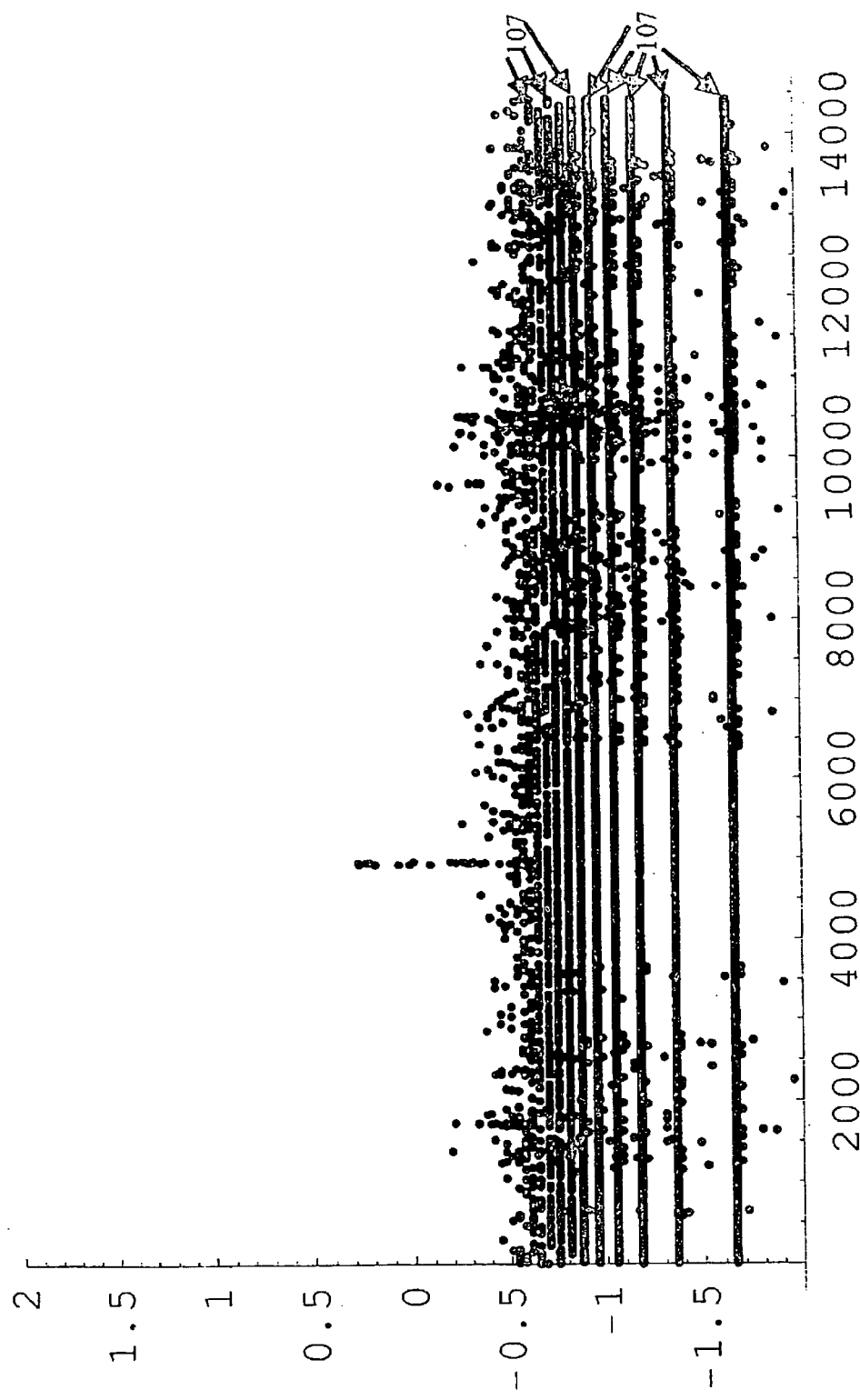
Figure 8:
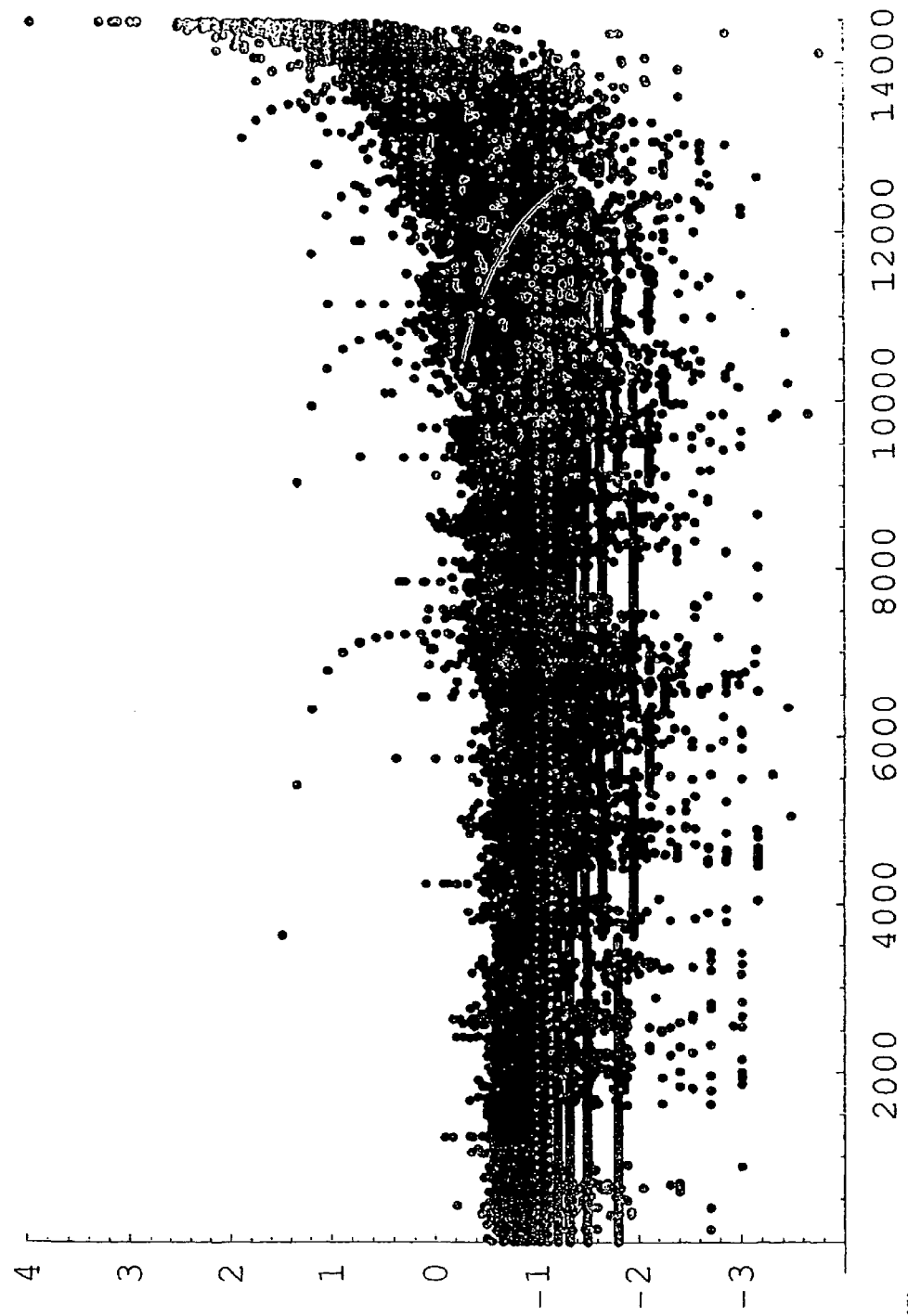

In FIG. 8, a common logarithmic representation of the amount of coefficients of the compression tree 42.1 at overview tree 42.0 in accordance with FIG. 7 is represented. The coefficients of the compression tree of the first layer of the overview tree are shown in the left half of the diagram, i.e. in the region between points numbered 0 to 7,200. In the range between 7,200 and 14,400, i.e. in the half of the remaining coefficient numbers region, the coefficients of all further layers are represented (between 7,200 and 10,800, those of the second layer, between 10,800 and 12,600, those of the third layer, etc.). In other words, further compression trees are each represented in further halves of halves of the representation.

In the common logarithmic representation 94 in accordance with FIG. 7, the formation of plateaus can clearly be recognized. FIG. 8 shows clearly that fewer than 20% of the coefficients possess more than 40 dB signal distances from the remaining coefficients. That means that the error arising from the omission of ca. 80% of the coefficients comprises less than 1/10,000 of the energy contained in the signal 40. This corresponds to an error of less than 0.1% in compression of the data occurrence to a fifth when the energy norm is used as a standard of error.

After the measurement series (e.g. 40) is decomposed in the manner specified in the invention above, and is filed into the respective memory units 23.0, 25, a correction of the measured values against undesired transfer function-artefacts can be undertaken using spectral analysis (for example, for signal regeneration), wherein the wavelets underlying the overview tree structure computation and memory unit 22.0, 23.0 and/or the compression tree structure computation and memory unit 24, 25 can be adapted especially for this purpose to the spectral properties and/or differential spectral properties of the measured values to be recorded.

The data stored in the overview tree structure 23.0 and/or the compression tree structure memory unit 25, and/or processed/regenerated by spectral analysis unit 26, are fed to the sorting and filtering unit 28. In the sorting unit 28, the coefficients are sorted according to their importance (e.g., according to their amount or their frequency/layer number-weighted amount), wherein the decision as to which coefficients may pass through the filter unit 28 is made solely on the basis of the sorted sequence. Specifically, a precise number of coefficients are selected from the compression tree structure storage unit, such that a certain previously set error is not exceeded, wherein the most important (for example, largest in amount) coefficients pass through the filter unit and are filed in the archives 18. In accordance with the invention, no recursion, partial inverse transformation, quantization, or pure resorting into the compression tree structure memory unit 25 takes place for error estimation; instead a direct storage into the archives 18 takes place. In other words, a sharp estimate of the error is conducted in accordance with the invention, via which the archiving of those most important/largest coefficients that are necessary for reconstruction of the measurement data inside specified error limits is generated. I.e., the coefficients are sorted, and only the most important/largest coefficients are stored into memory. The error control used is also designated as "a priori error control." All storage accesses of the preferably commercially available tree computations that are used take place sequentially, and are therefore efficient especially for SDRAM-type architectures, which place memory accesses near adjacent coefficients in rapid buffer memory. (The so-called RAMBUS memory also belongs to this type of memory.)

The archive 18 is capable of storing all incident data and reacting to priority demands, such as the degree of filling the interim memory 14, while fulfilling asynchronous inquiries from the evaluation unit 20.1 . . . 20.K for decompressed data, or from the compression data visualization device 202.1 . . . 202.K for compressed data 202.1 . . . 202.K.

The queries from the evaluation unit 20.1 . . . 20.K or compression data visualization device 202.1 . . . 202.K are specified for generating an overview preferably within the time interval $[t_1, t_2]$ specified by personnel and within a time interval breadth $\Delta t$ of subintervals, also selected by personnel. The compression data visualization device 202.1 . . . 202.K is also in a position to have only certain (r many) decomposition orders $k_1$ . . . $k_2$ (with $0 \leq k_1 \leq n-1, 1 \leq l \leq r, 1 \leq r \leq n$) displayed. On the basis of this information, it is determined in both devices via the range selection unit 212 which coefficients must be extracted from the archives 18 in order to generate the desired overview. Here the number of coefficients to be extracted will be at most a small whole number multiple of the number $N=[(t_2-t_1)/\Delta t]$ of the coefficients required for compiling the overview.

The extracted coefficients, at least of the tree structure 42.(n-1) of (n-1)-th order, are picked up by the receiver 30 or 204 and transformed back analogously to their decomposition described on pages 21ff in reverse sequence in decompression and the return transformation unit 32 or the return transformation and data preparation unit 206, wherein the tree structure computation units 22.0–22.(Z-1) again find application. That means that the inverse transformation begins on the (n-1)-th step with the coefficients of the tree structure 42.(n-1) received. Subsequently, as many tree structure computation units 22.0–22.(Z-1) as are needed with the associated wavelet/scaling function coefficient, also received from the archives 18, are programmed and started. The resulting coefficients of the tree structure 42.(n-2) are supplemented by coefficients of the tree structure 42.(n-2) possibly stored separately from the archives 18 and received on the basis of the current query. The above-described step is then repeated as often as is necessary to represent all tree structures requested [i.e. n-times from the device 20.1 . . . 20.K or (n+1-k) from the device 202.1 . . . 202.K, if only the coefficients of the tree structure 42.(n-1) were stored in the archives 18], preferably n times, until the desired raw data or all requested tree structures 42.$k_1$–42.k lie within the desired range. The computed coefficients of the raw data or the tree structures 42.$k_1$–42.k are also subjected to another interpolation necessary for representation using a further wavelet transformation (interpolation wavelet transformation) with reference to a wavelet whose interpolation properties correspond to the desired interpolation objective.

The possibility of unambiguous recalculation of the original data of a wavelet transformation also permits undertaking wavelet transformations via the series connection of suitable, preferably commercially available devices. If a transformation is undertaken whose underlying wavelet possesses the desired interpolation properties, then interpolation and decompression can be very efficiently implemented using one and the same component in a form suited for representation. Based upon the property that is dependent upon conventional visualization units displaying all image points of a preferably two/three dimensional display area that is exactly equally large, in the so-called pixel/voxel (voxel≡volume picture element) form, preferably the previously described Haar wavelet can be used.

Since the band width of the connection between the display interim memory 34 or 208 and the analysis display system 36 or visualization unit 210 is often very limited, it is desirable to make available to operating personnel a correspondingly crude preview after transmitting very few interpolation coefficients, and to refine these as soon as further coefficients are transferred. This procedure corresponds to omitting the details, which have not yet been transmitted, on the tree structure 42.0 or tree structures 42.$k_1$–42.k, which proceed from the interpolation wavelet transformation, and adding them retroactively in succession. The successive addition of details is schematically represented in FIG. 9 with the example of the reconstruction of data previously transformed with respect to the Haar wavelet, wherein one overview of the measurement series 64 each is generated from a crude preview 106, through a more precise representation 108, up to a definitive function 110.

The described procedure is interesting with respect to devices 20.1 . . . 20.k or 202.1 . . . 202.k especially since the number of the coefficients contained in it doubles from layer to layer. The representation of the crude preview 106 can be undertaken in the present situation, thus earlier than the complete overview. Furthermore, the method of the invention permits representing compressed data in different modes of representation with respect to the device 202.1 . . . 202.K, with these data being necessary for appropriate evaluation such as, for example, seeking out peculiarities, estimating energy distribution, etc. Peculiarities of a measurement curve can be recognized via this method without great computation expenditure and without error on the compressed data.

A special method is distinguished in that a fixable display value, especially a certain color, representation coordinate height, and/or brightness, is allocated to each coefficient of the trees 42.k$_1$–42.k to be displayed. More information can be obtained from this. Thus, for example, a long term estimation of the energy distribution is possible based upon a few of the uppermost layers of the overview tree or the uppermost compression trees, since the uppermost layer contains the mean value information, i.e. signal material, and the subsequent layers provide information on their variation and/or distribution. Therefore, an estimation of energy distribution requires the display of only few wavelet coefficients, resulting in short loading times.

Peculiarities of a certain time resolution (such as measuring curves 40 in accordance with FIG. 2a, and 41 in accordance with FIGS. 2b–c) can also be represented through large wavelet coefficients of the corresponding layer. Peculiarities in deeper layers, however, are often indicated in higher layers (coarser time structures) via the corresponding wavelet coefficients, so that it usually suffices to display only regions of inverse transformation and the data preparation unit 206 first, which contains only the few wavelet coefficients of coarser time resolution. If peculiarities are observed within a specific time range, then it is possible to represent (successively) only the ranges that manifest these peculiarities in the layers lying above them. Moreover, it is possible to address each random layer or to skip over several layers. With this direct discovery of peculiarities, long loading times can be avoided.

A further feature of the method is distinguished in that the amount of the wavelet coefficient can be represented logarithmically, wherein it is possible to change the color representation value as a function of the sign of the wavelet coefficient values (complex logarithm). With this method, the above-mentioned peculiarities are especially clear in many practical instances because this representation translates identical coefficient value amount conditions of the peculiarity/energy distribution, e.g. into identical color and/or coordinate height or brightness representation value intervals.

Figure 11:
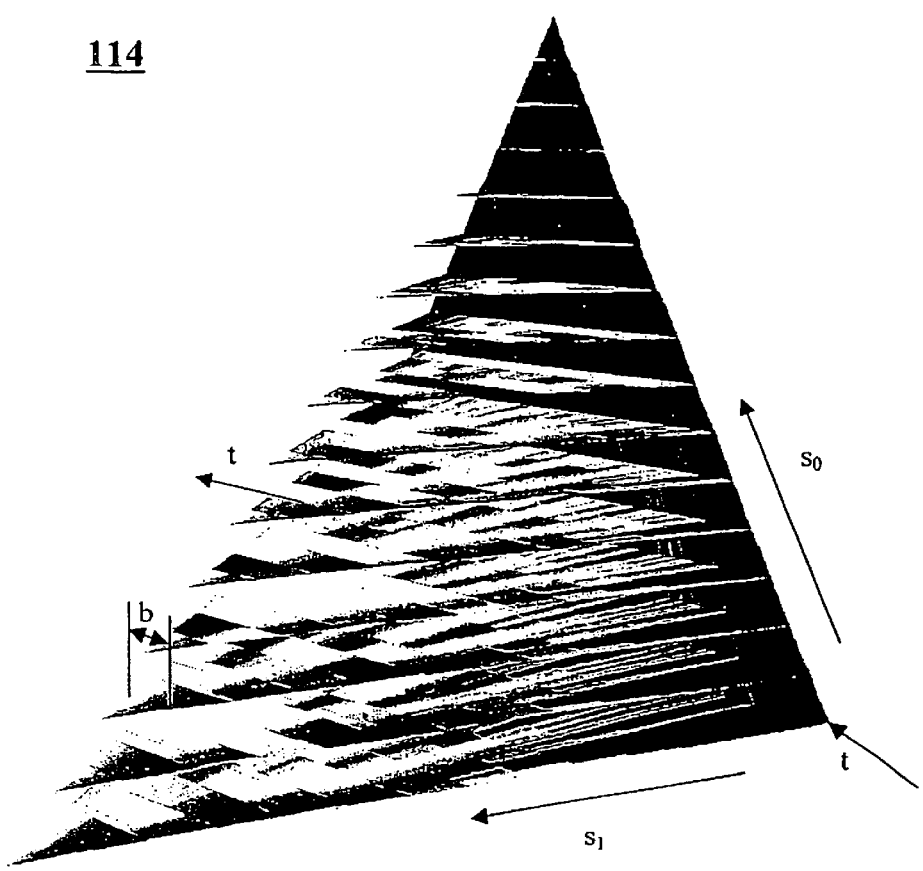

It has proven especially advantageous for the compressed data to be capable of representation in a multidimensional tree structure, illustrated here for n=2 in the example of a three-dimensional structure such as a tree structure 114 in accordance with FIG. 11, including a first surface as a plane for representing coefficients of the overview tree and, proceeding from the first surface, two (further) surfaces preferably extending vertically as planes for representing coefficients of compression trees. For each of the tree structures (compression trees and overview trees), a representation is generated with the aid of control commands for each of the layers contained in them, which can be interpreted by the display unit. Moreover, the control commands are selected such that a previously adjustable representation, preferably a gray shadowing or color and/or height coding, falls due to each value contained in each layer, depending upon the preferably logarithmic value of the coefficients to be represented. The width of such a representation of coefficients can be varied.

In selecting the control commands for representation of the coefficients, the breadth of the coefficient representation can be freely selected and is adjustable by the user according to the invention. Below, representations for n=2 will be illustrated, in tree forms and "stripped of leaves"/in table form below. A view for n=3 will be presented only "stripped of leaves"/in table form for reasons of representation space technology (difficulty of easily surveyed representation of multidimensional objects on two-dimensional paper print outs).

A triangle representation in accordance with FIG. 11 is a preferred representation of a three-dimensional structure, wherein the breadth of representation of all the coefficients in a layer falls in a linear pattern, with the rising number of the layer from which they originate. This means that the breadth b of the representation of the actual time breadth $2^s \Delta t$ of a coefficient from the layer $s=s_0$ in the overview tree or from the accumulated layer number $s=s_1$ in the compression tree (i.e., the overview layer $s_0$ and the compression layer $s_1 > s_0$ in the compression trees) sinks in a linear manner (owing to the designation of the measured data layer as zero layer or layer 0, and $s_{k-1} < s_k \leq s_{max}$ applies $s_j \geq j+1$, $0 \leq j \leq n-1$). In other words, the coefficients become wider by a factor of 2 with each layer limit that must be overcome on the basis of the double tree structure 84/114 represented in FIG. 6, 11, in order to reach the layer of any desired coefficient (regardless of whether this layer limit monitoring takes place in the overview tree or in a compression tree). This representation 114 (in accordance with FIG. 11) permits more space to fall due to the very numerous coefficients of the lower layers, however it assigns to the coefficients of the upper layers a breadth so great that they can be recognized without effort even on conventional monitor visualization units.

Figure 12:
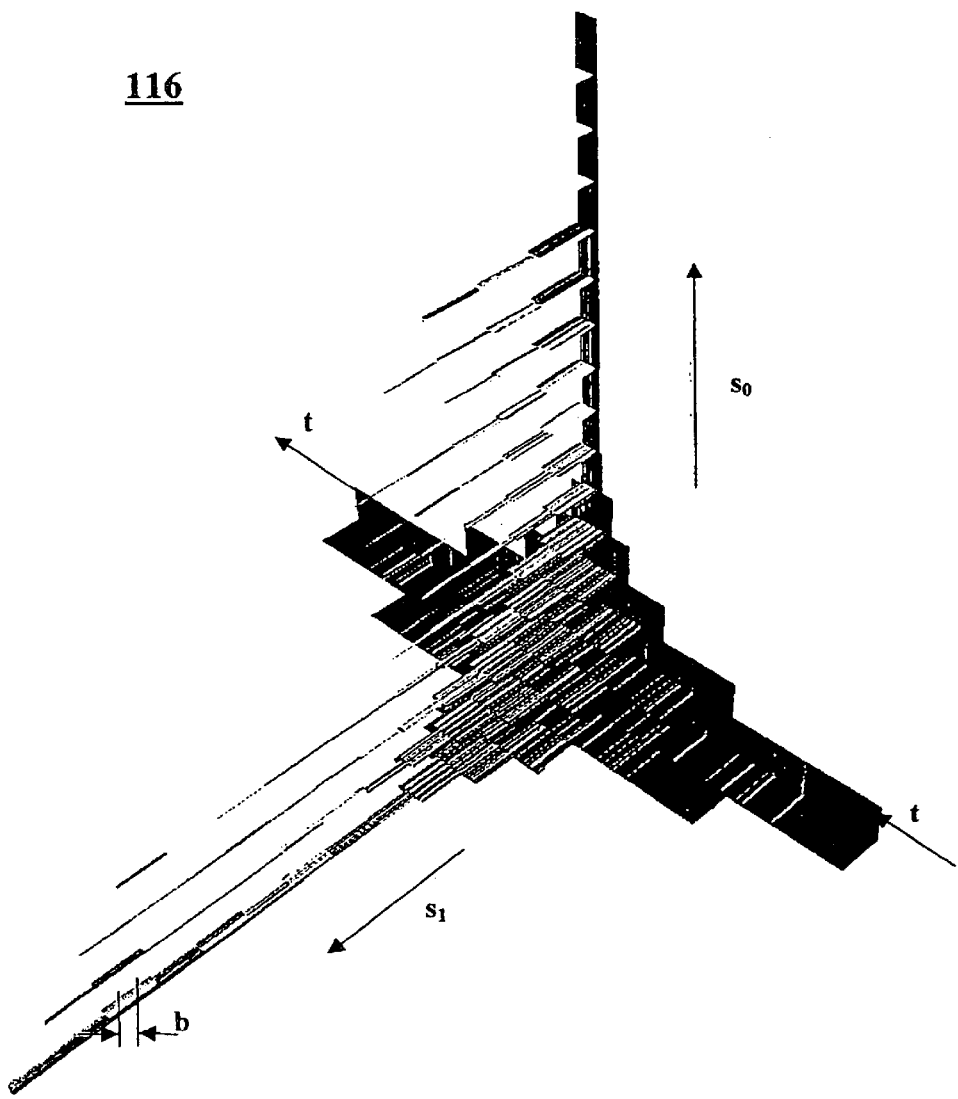

With a further representation 116 in accordance with FIG. 12, the breadth b of the representation of a single coefficient remains constant. This representation on the one hand provides an overview of the dataset contained in a layer, however the breadth of the layers represented sinks exponentially with their height, hence the coefficient representations in the higher layers can only be recognized with difficulty on conventional display units. In addition, their temporal position is not easily recognizable within the tree structure.

Figure 13:
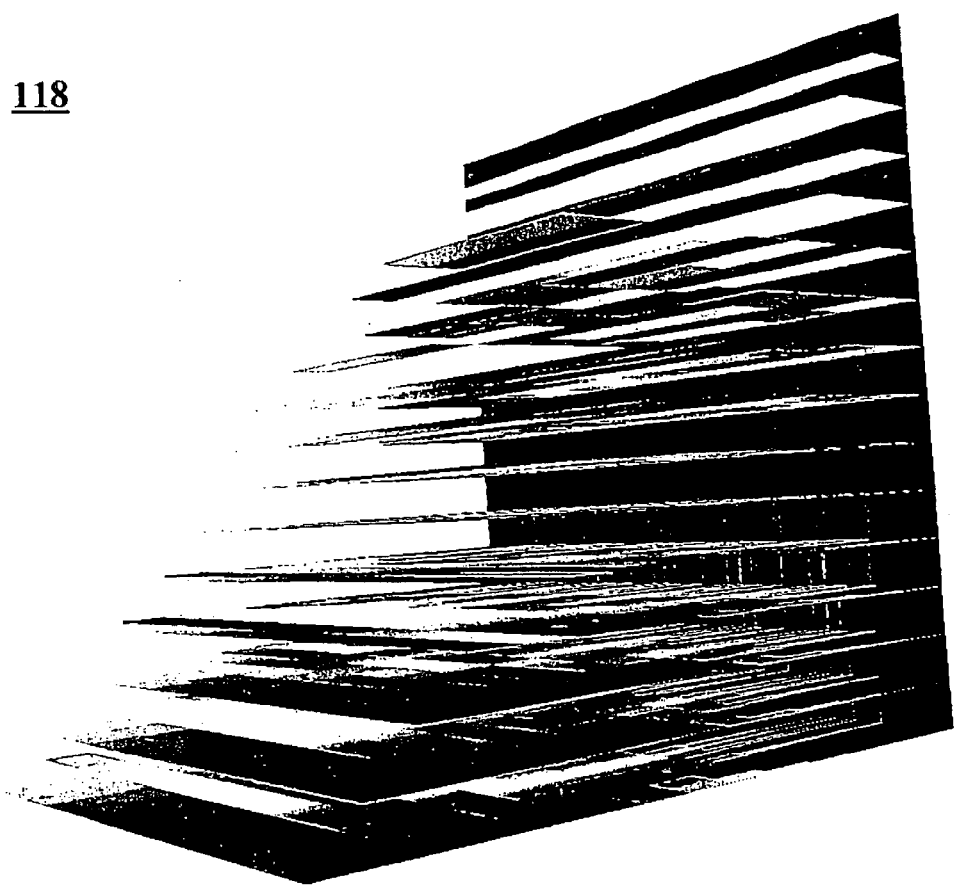

The breadth b of the representation of an individual coefficient can be adjusted proportionally to the breadth $2^s \Delta t$ of the wavelet represented by it (isochronous representation 118, in accordance with FIG. 13). This representation reproduces an undistorted overview of the position and proportion of each wavelet represented by a certain coefficient representation on the signal displayed in the time range represented. However, a representation with exponentially increasing breadth b falls due to the coefficients of the higher layers, hence there is only space (in the form of pixels) on conventional monitor visualization units for the complete representation of the coefficients of the lower levels of the overview tree. The other coefficients of the higher levels flowing out of the time range to be displayed, which begin or end at most within this time range, are not represented or are no longer completely represented.

Figure 14:
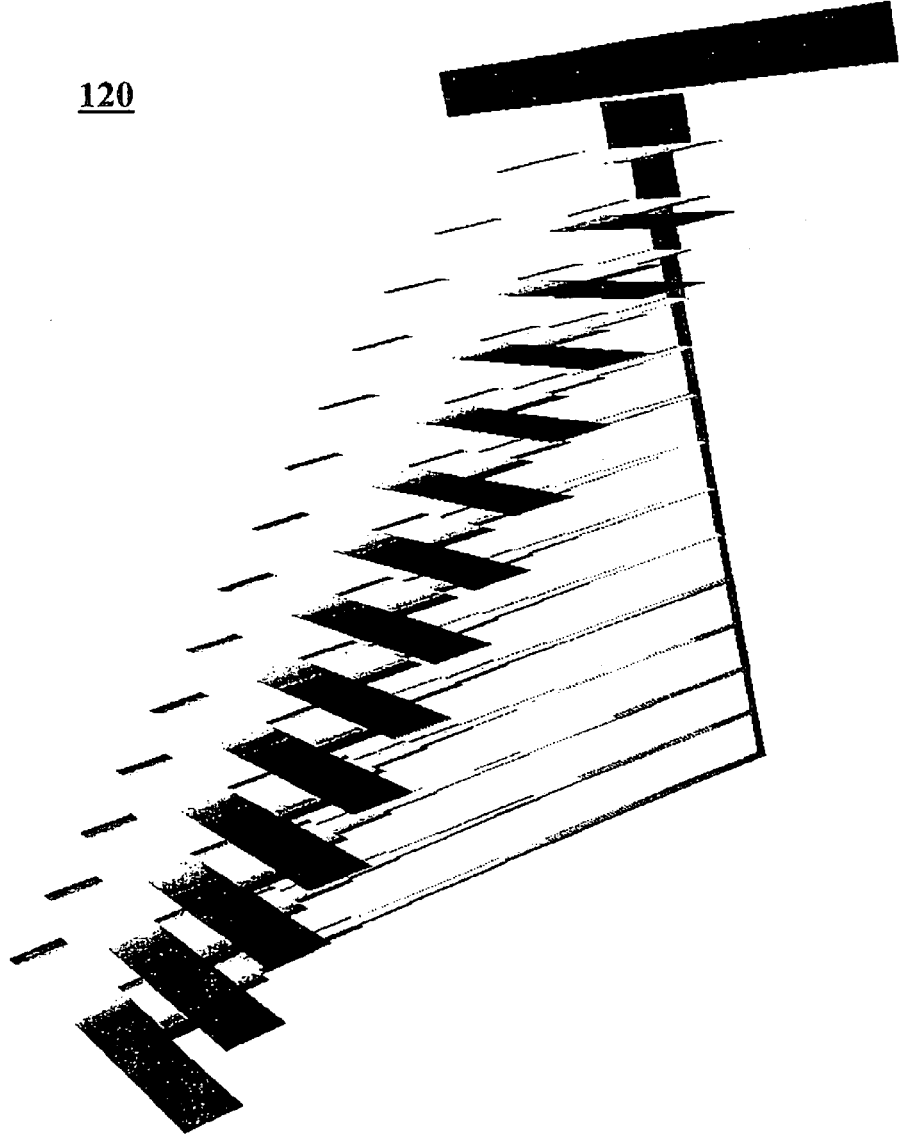

Advantageously, an isochronously complete representation 120 can also be selected in accordance with FIG. 14, which corresponds to the isochronous representation, wherein all coefficients of all layers are displayed. That means that all coefficients of higher layers that begin or end within the time range to be displayed (i.e., their allocated wavelet/scaling function ends or begins within the time range to be displayed) are displayed. In this connection, their exponentially increasing breadth $B=M2^s\Delta t$ (wherein the wavelet is established by M coefficients) results in the removal of their beginning or ending exponentially from the beginning or end of the time range to be displayed. Like the isochronous representation, this provides an undistorted overview of the position and proportion of each wavelet represented by a certain coefficient representation on the signal displayed within the time range represented. On the other hand, a representation with an exponentially shrinking breadth falls due to the numerously occurring coefficients of the deep layers, for which reason very few image points may remain on conventional display units for the deep layers.

Figure 2B:
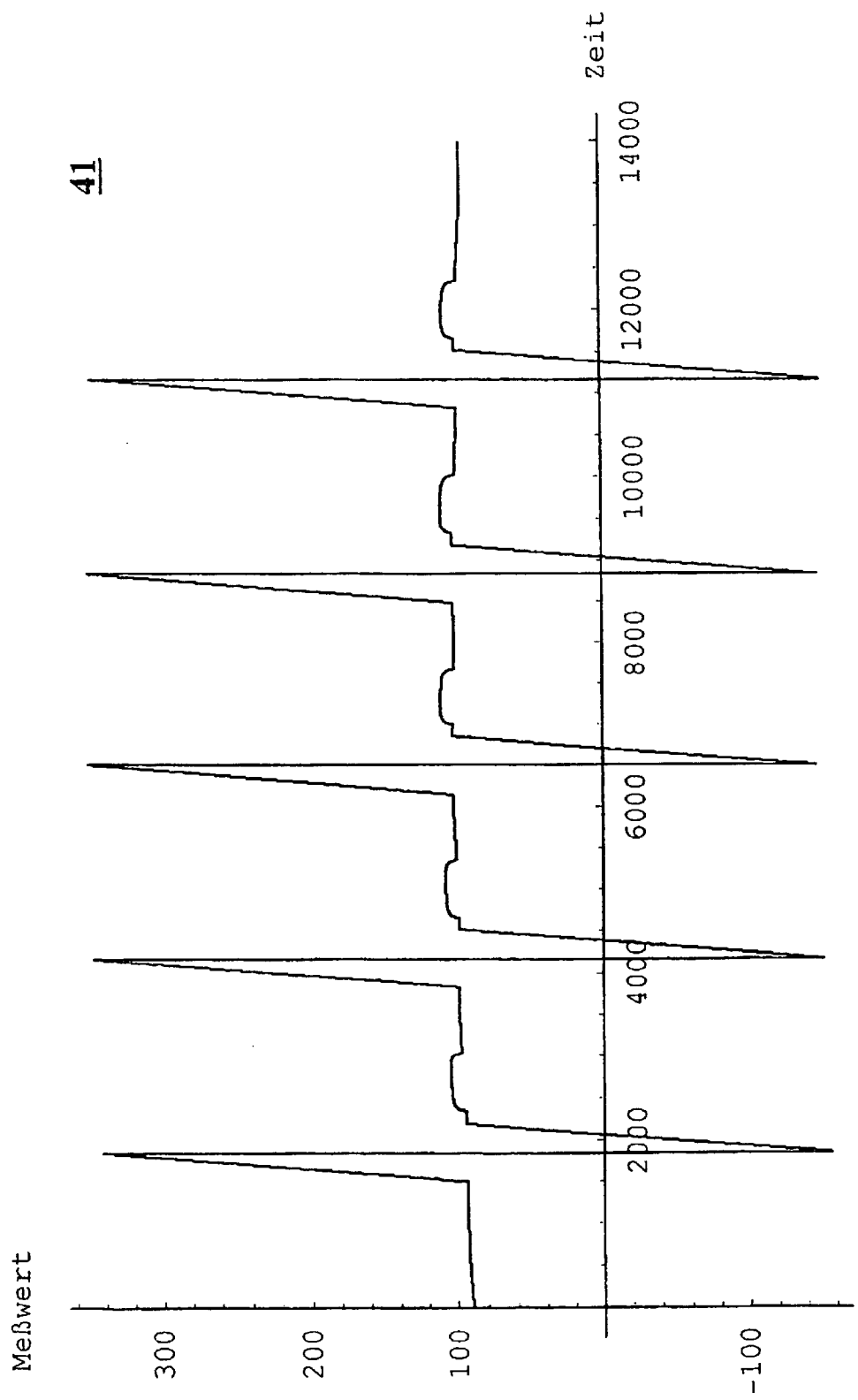
Figure 2C:
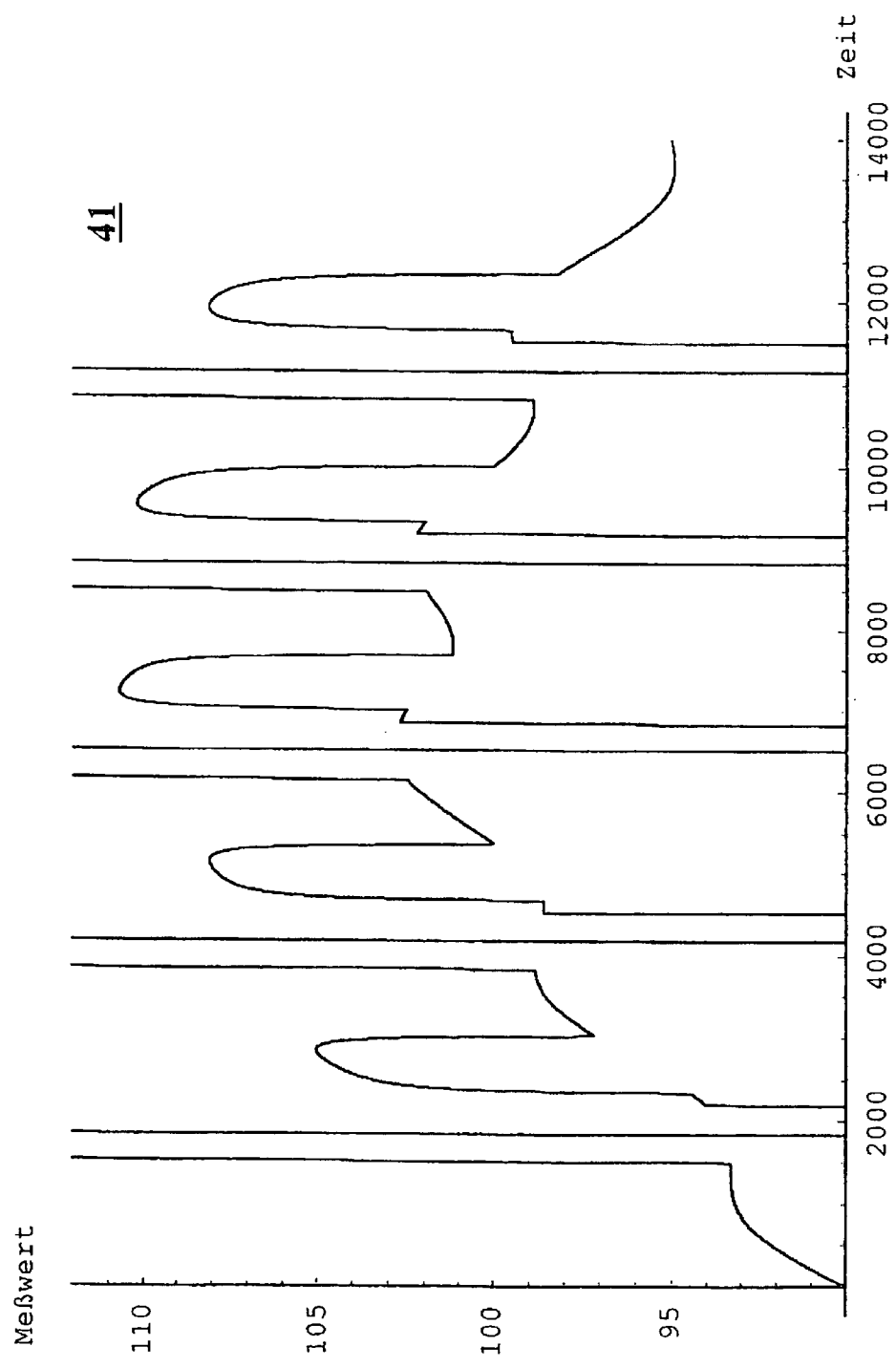

A constructed temperature measurement curve 41 in accordance with FIGS. 2b–c is chosen as an example. FIG. 2b shows their course curve, while FIG. 2c represents an enlargement of the signal amplitude of this measurement curve. The temperature measurement curve consists of ca. 14,000 points and initially has a basically sinus-like course curve. It is constructed such that it additionally has skips, bends, and smooth areas. These regions are variously smooth (that is variously well differentiable), and for this reason they can only be distinguished variously well from a smooth wavelet. (The sinus-like course curves are infinitely often differentiable. The derivations of the bends are no longer classically representable but are differentiable in the $L_2$ sense and yield skip functions. The derivations of the skips yield $\delta$ distributions.) It is shown on the basis of these structures how peculiarities in the measurement signal have a direct effect on the stamping of the brightness structures in the visual representations generated.

Figure 15:
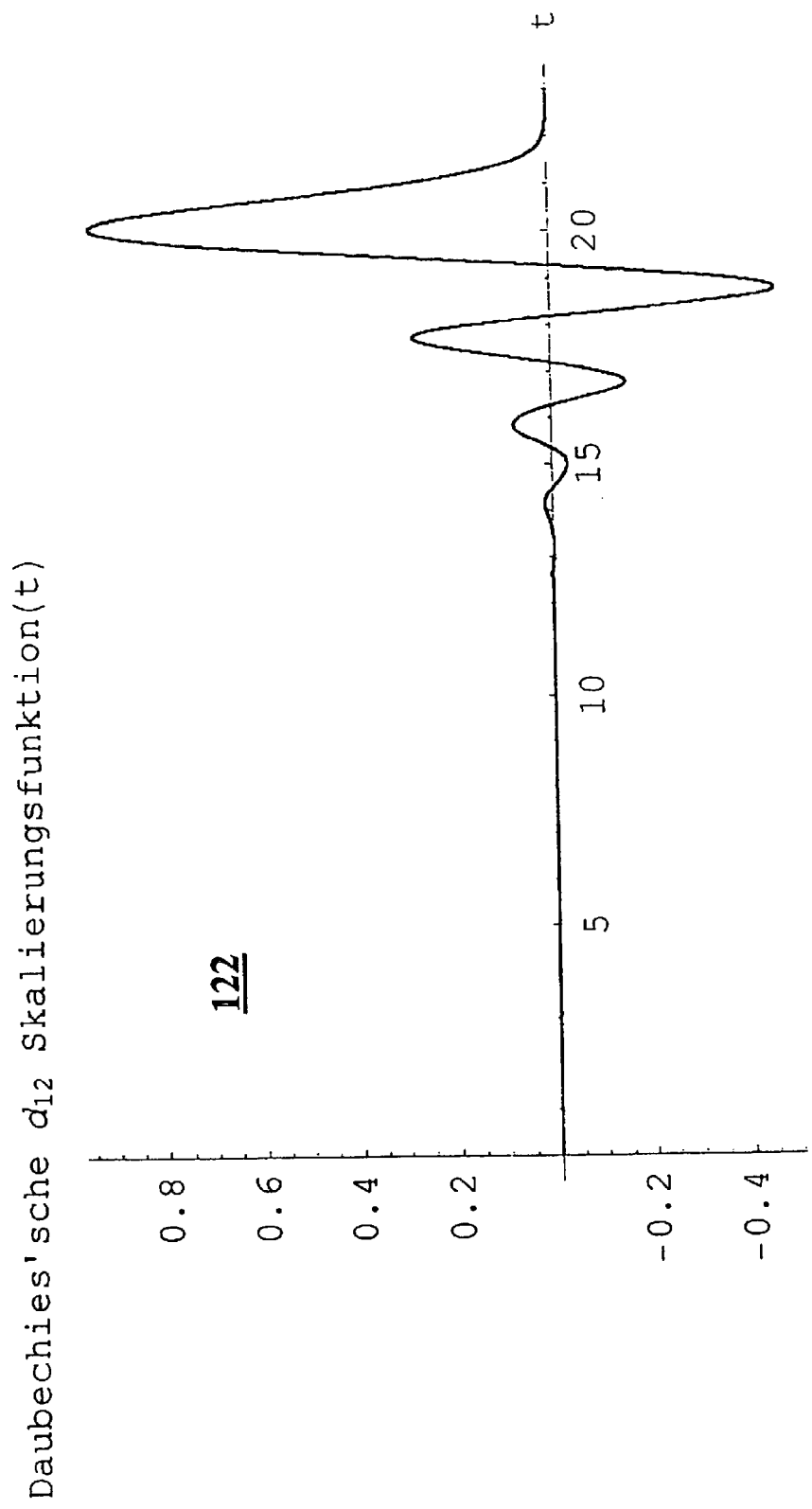

For the decomposition of the temperature measurement curve selected, the $d_{12}$ wavelet represented in FIG. 15 is adduced for generating the overview tree or the compression trees for n=3. This wavelet also possesses a sinus-like course curve and is very smooth, hence the smooth structures of the temperature measurement curve with few non-disappearing coefficients, which are situated chiefly in the high levels of the overview tree, and there once again in the high levels of the associated compression trees, can be well reproduced. Otherwise, the smooth structures are represented by small coefficients, which lead to preferably dark regions in the visual representation. Primarily only weakly marked detail coefficients lie in the deeper layers of the compression trees, since the large area sinus-like behavior of the temperature measurement curve can already be very well interpolated with few coefficients or corresponding size through large copies of the $d_{12}$ wavelet.

Bends and skips in the temperature curve lead to light structures in the overview tree or in the compression trees, which spread finger-like proceeding from higher levels to deeper levels. The brighter, more strongly prominent narrow structures result from the skips, the less bright structures running structures from the bends.

Figure 16A:
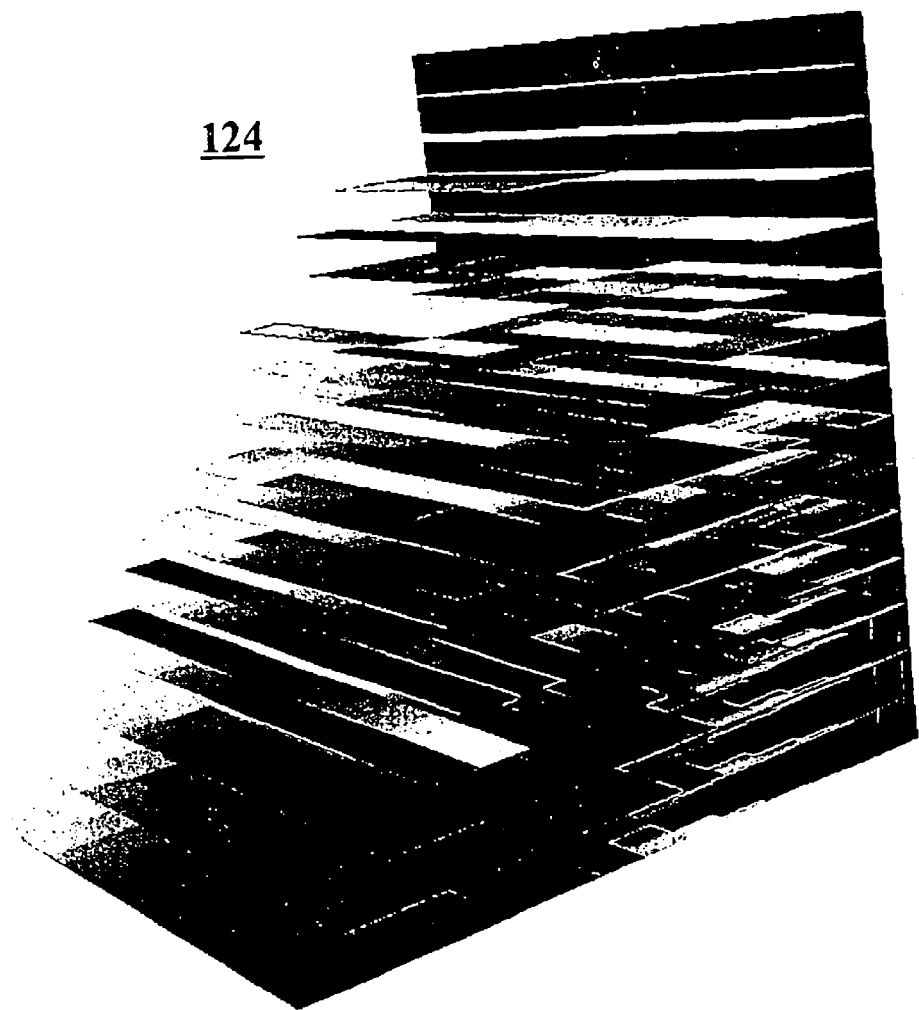
Figure 16B:
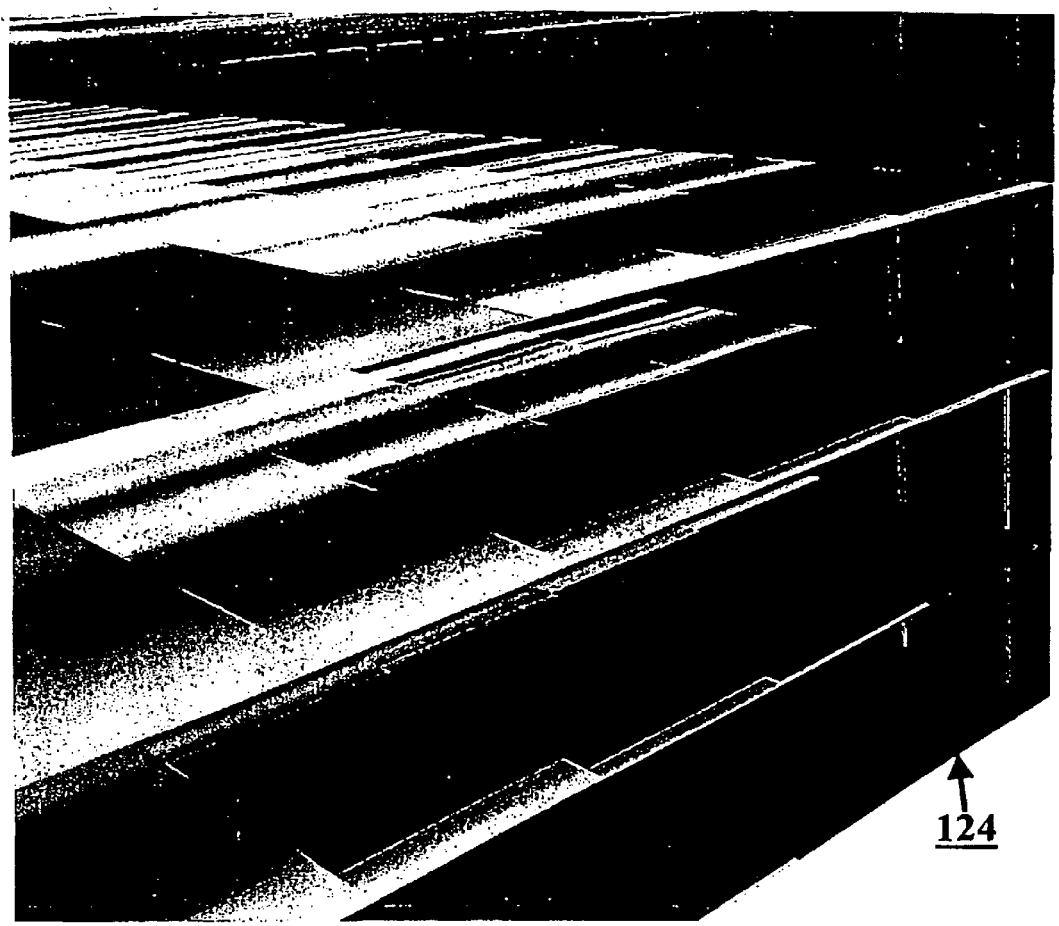

A complete isochronous representation corresponding to the temperature curve 41 selected is shown in 124, in accordance with FIGS. 16a–b. Finger structures can be clearly recognized, extending from the higher levels to the deeper levels. An enlargement of the right lower section of FIG. 124 represented in FIG. 16a is shown in FIG. 16b, in which there are coefficients that are strongly marked. The representation shows the course curve of these finger structures in the deeper levels quite clearly.

Figure 17A:
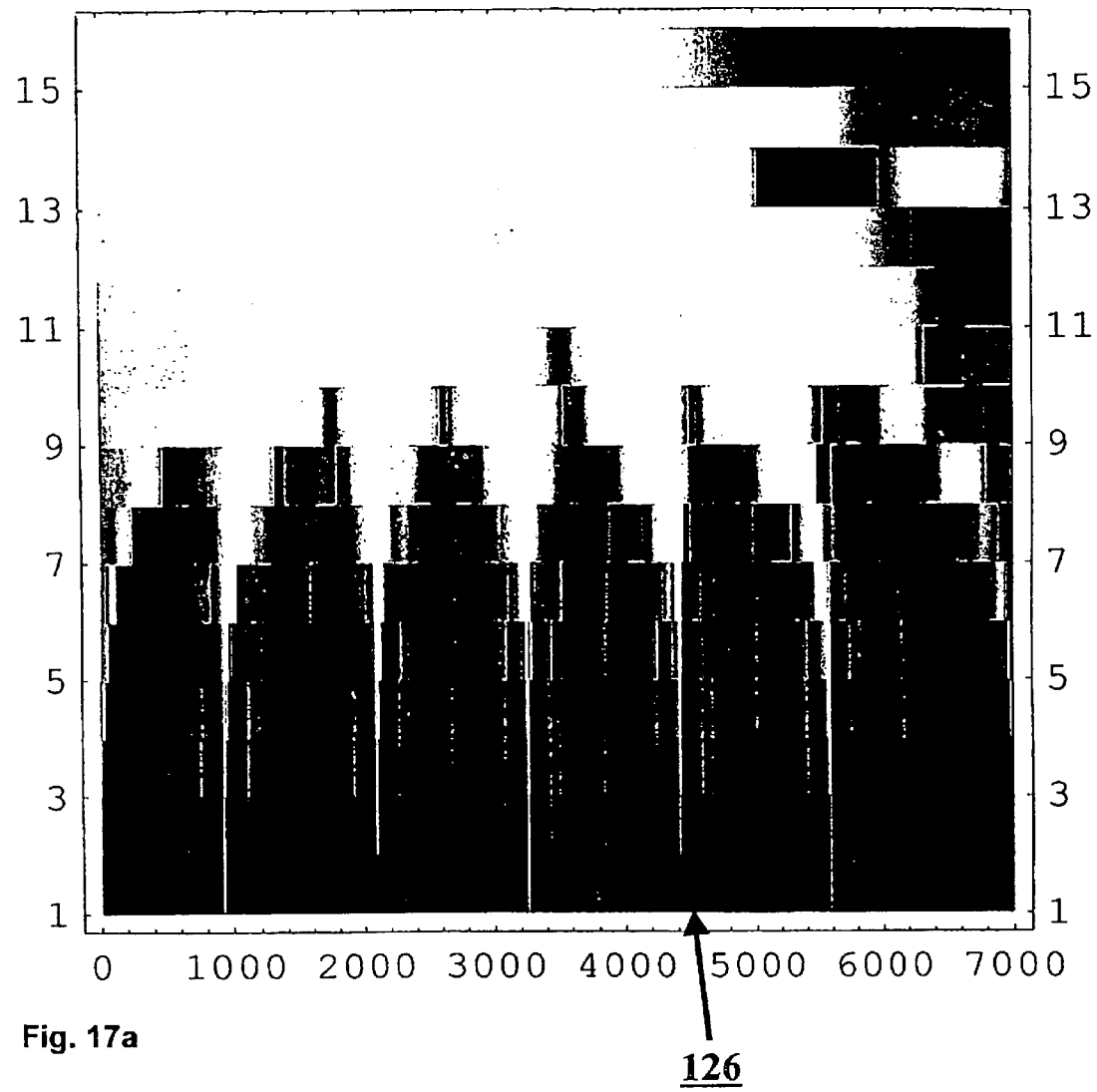
Figure 17B:
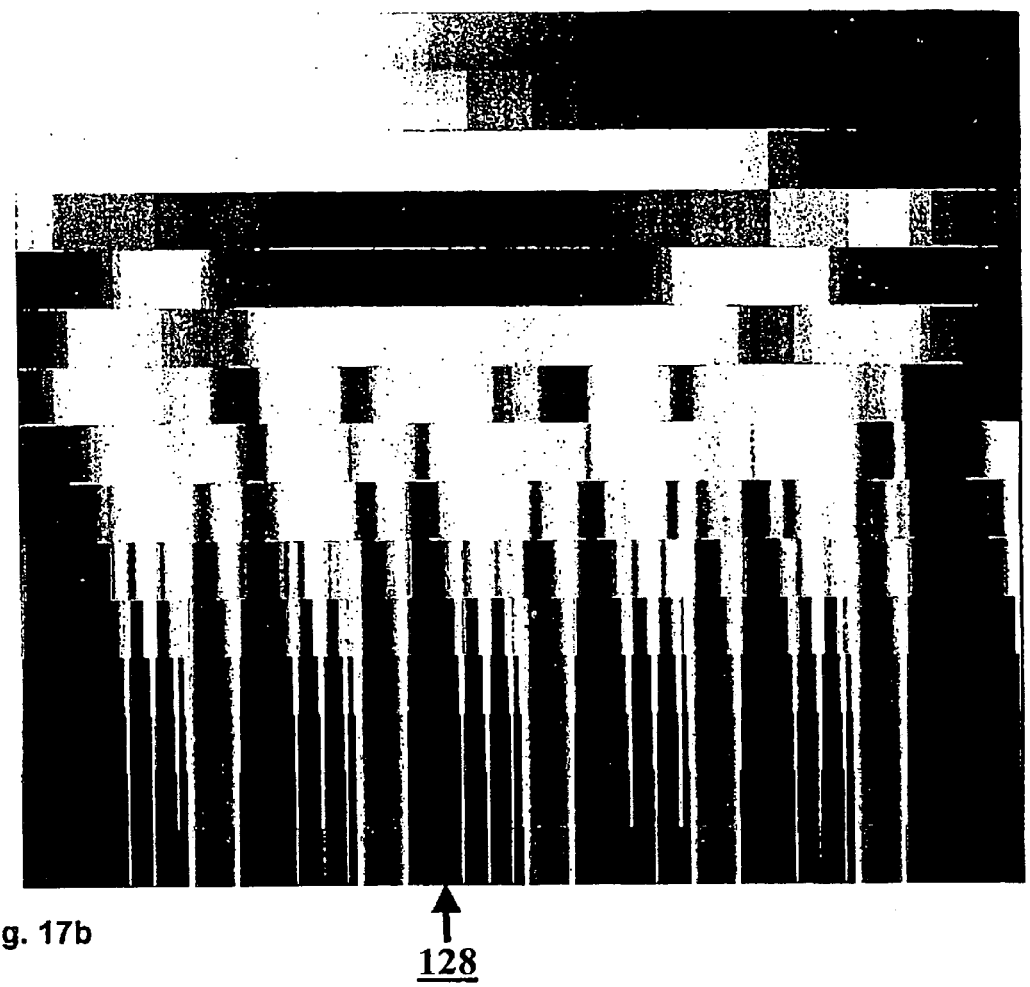

126 in accordance with FIG. 17a shows the overview tree belonging to temperature measurement curve 41, in accordance with FIGS. 2b–c, in a coordinate-numbered form (time coordinates≅x axis and layer coordinates≅y axis).

Figure 18A:
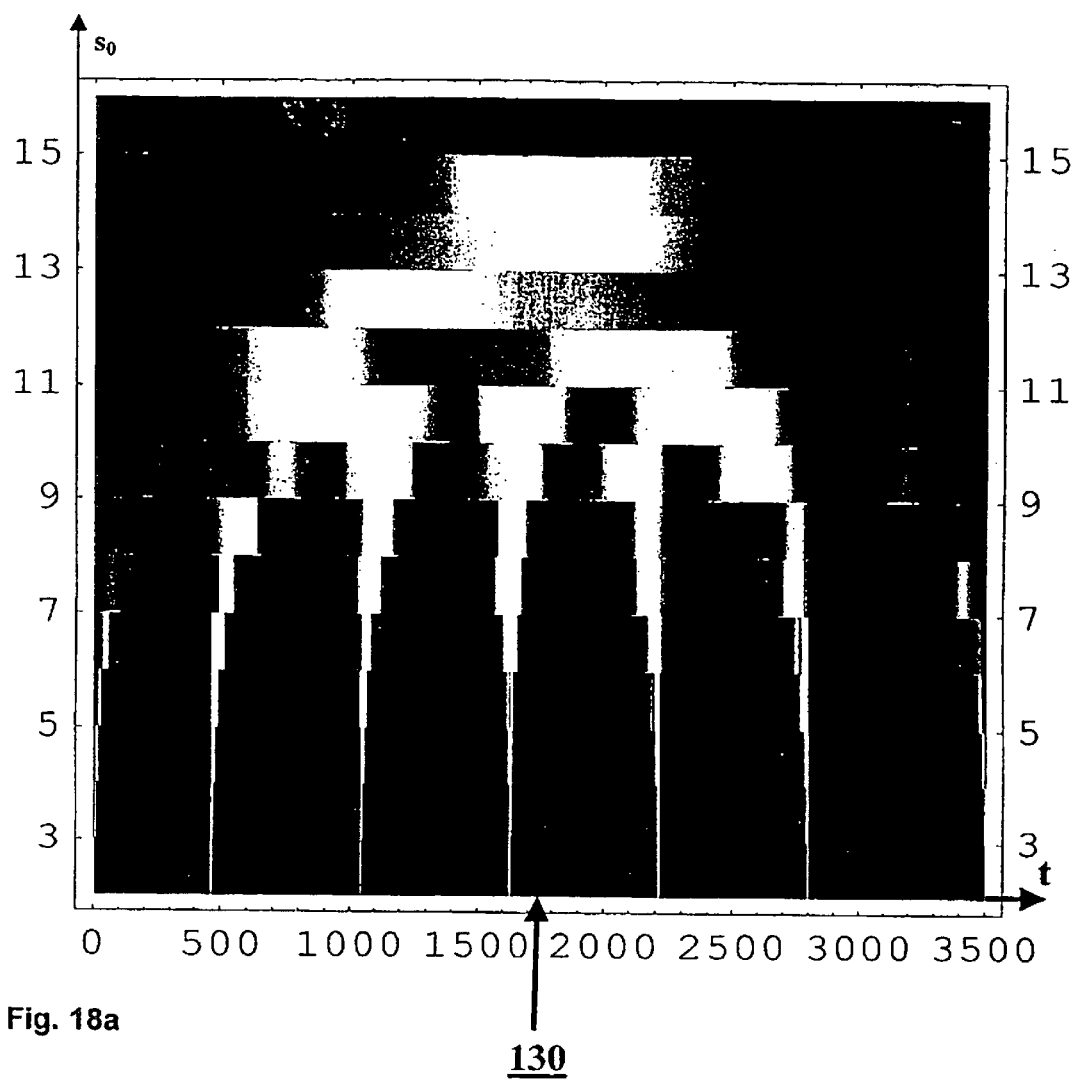
Figure 18B:
Figure 19A:
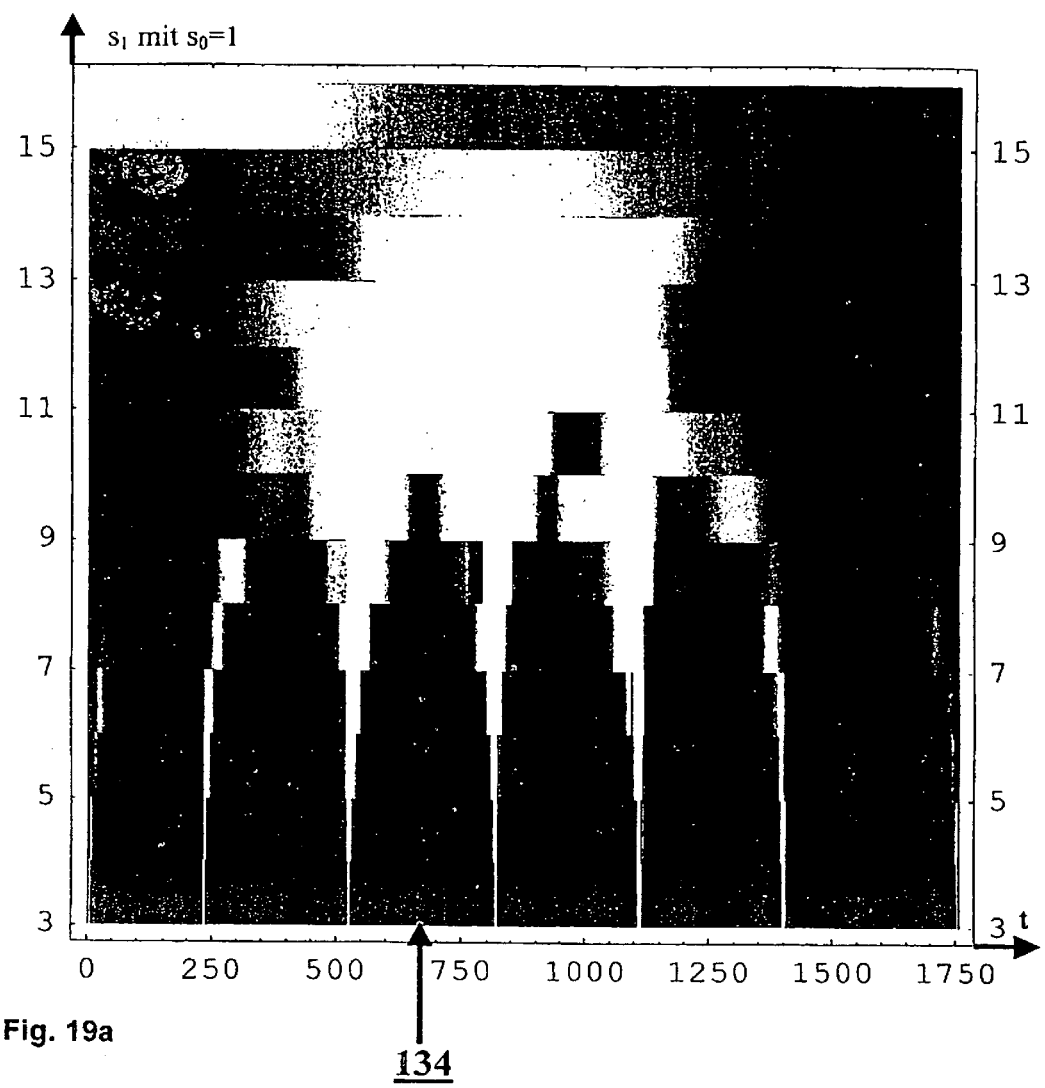
Figure 19B:
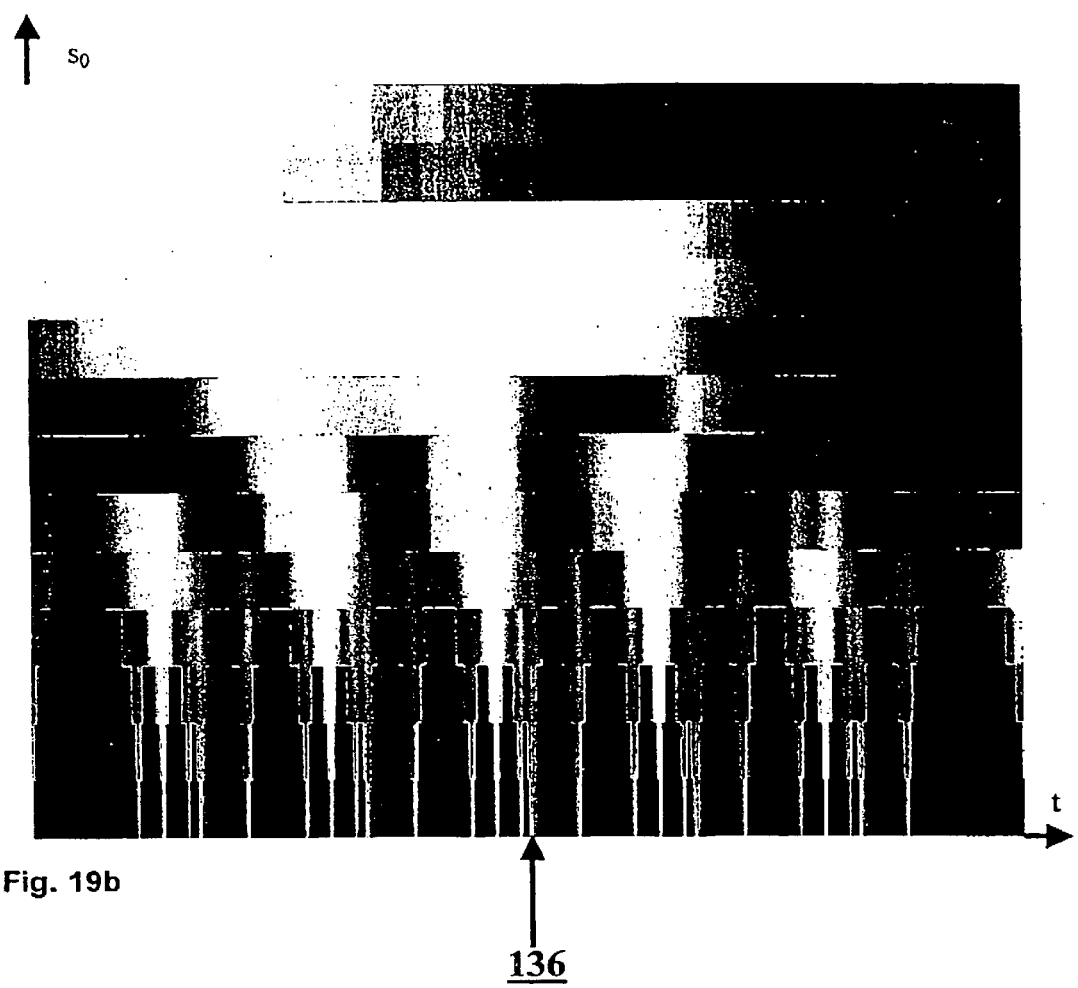

FIGS. 18a and 19a show the associated first compression tree 130 or second compression tree 134, in (amount logarithmic) coordinate numbered form. For improved recognition of the brightness levels, FIGS. 17b, 18b, and 19b show logarithmic representations 128, 132 and 136 from the views represented in FIGS. 17a, 18a and 19a, in strongly amplified contrast. (In particular, the amplified contrast representations 132 and 136 permit more details to be recognized than the printouts of the associated coordinate numbered forms 130 or 134.) The finger structures in the overview tree 126 or 128 in accordance with FIG. 17a or 17b are more blurred than in the compression trees 130 or 132, for example, in layers 0 to 4, the coefficients of ca. 1180 to ca. 1500, as for example in FIG. 18a or 18b in layers 0 to 4, coefficients in the range of ca. 500. The coefficients in the deepest layer of the compression tree 130, in accordance with FIG. 18a, belonging to the layer $s_0$=1 of the overview tree 126 are twice as wide ($M2^{S0+1}\Delta t = M^{1+1}\Delta t$) as the coefficients in this layer of the overview tree 126 in accordance with FIG. 17a. Therefore, their numbers are only half as large as those of the compression trees. The blurred character basically arises from the fact that, in the overview tree, skips or bends in the temperature curve selected can only be poorly or moderately interpolated with the smooth $d_{12}$ wavelet, therefore they also provide a considerable amount to this measurement signal section in the time range adjacent to these areas. The course curve of the coefficients then has fewer skips and bends than the original measuring curve, and is thus smoother and can be better recreated with a smooth $d_{12}$ wavelet (in the compression trees). Thus only few strongly marked coefficients are needed in the compression trees to interpolate the associated layer of the overview tree or the original data. Therefore the structures in the compression trees are more clearly marked and less blurred, in short more concentrated, than in the overview trees. On the basis of this observation, the highly attainable compression ratio results from ca. 76 with 1% $l_2$ errors with the $d_2$ wavelet for compression trees and the overview tree in the example processed.

Figure 20A:
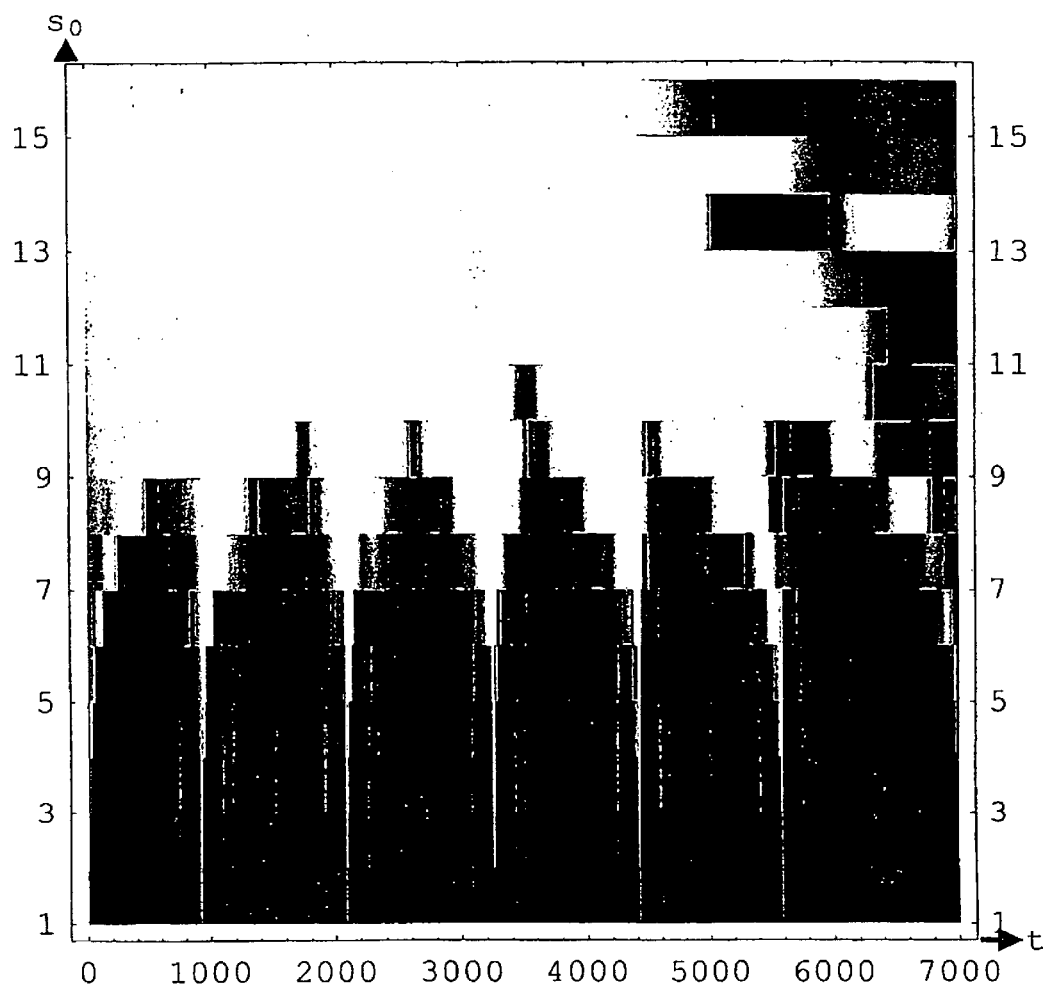
Figure 20B:
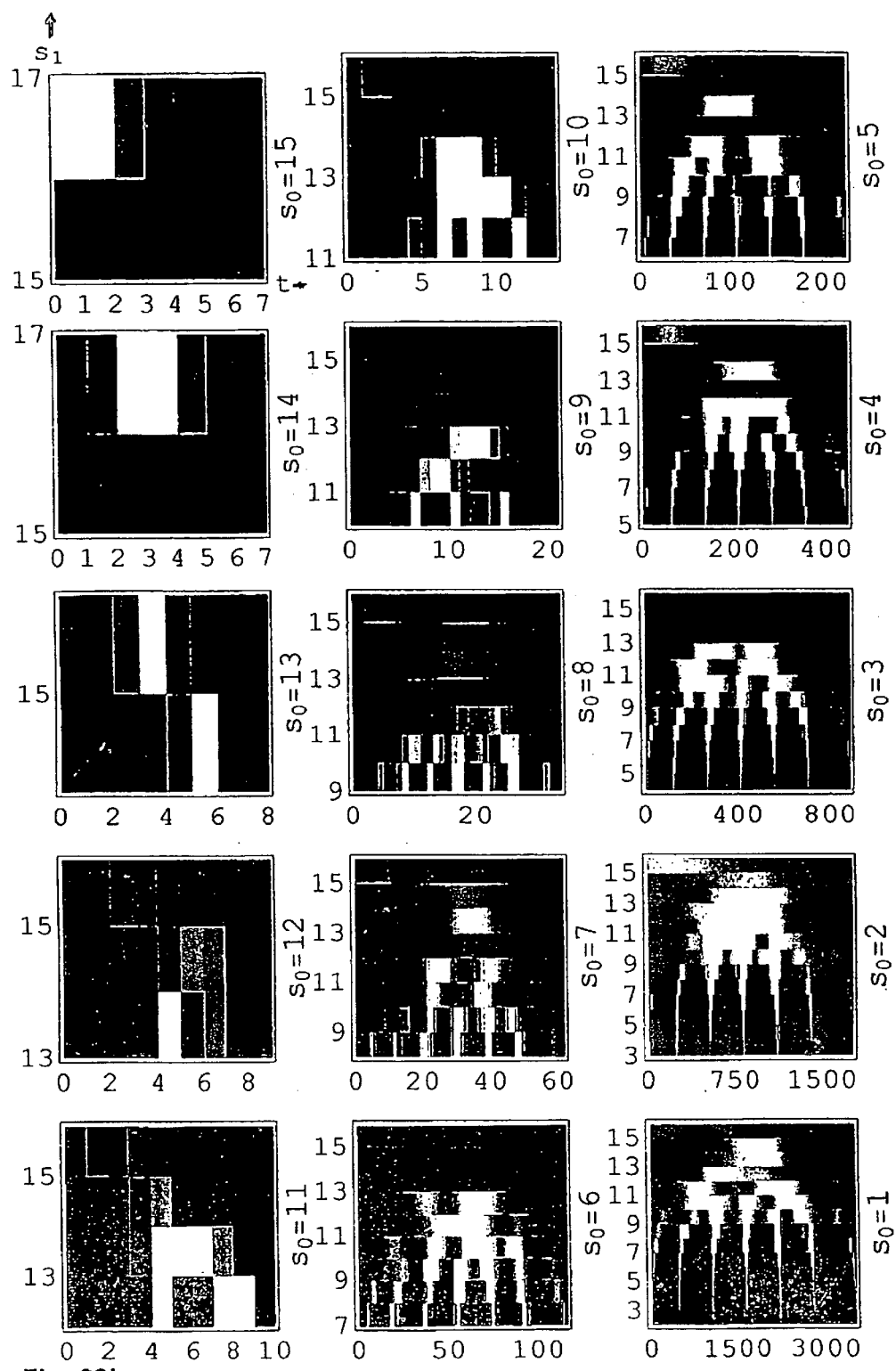
Figure 20D:
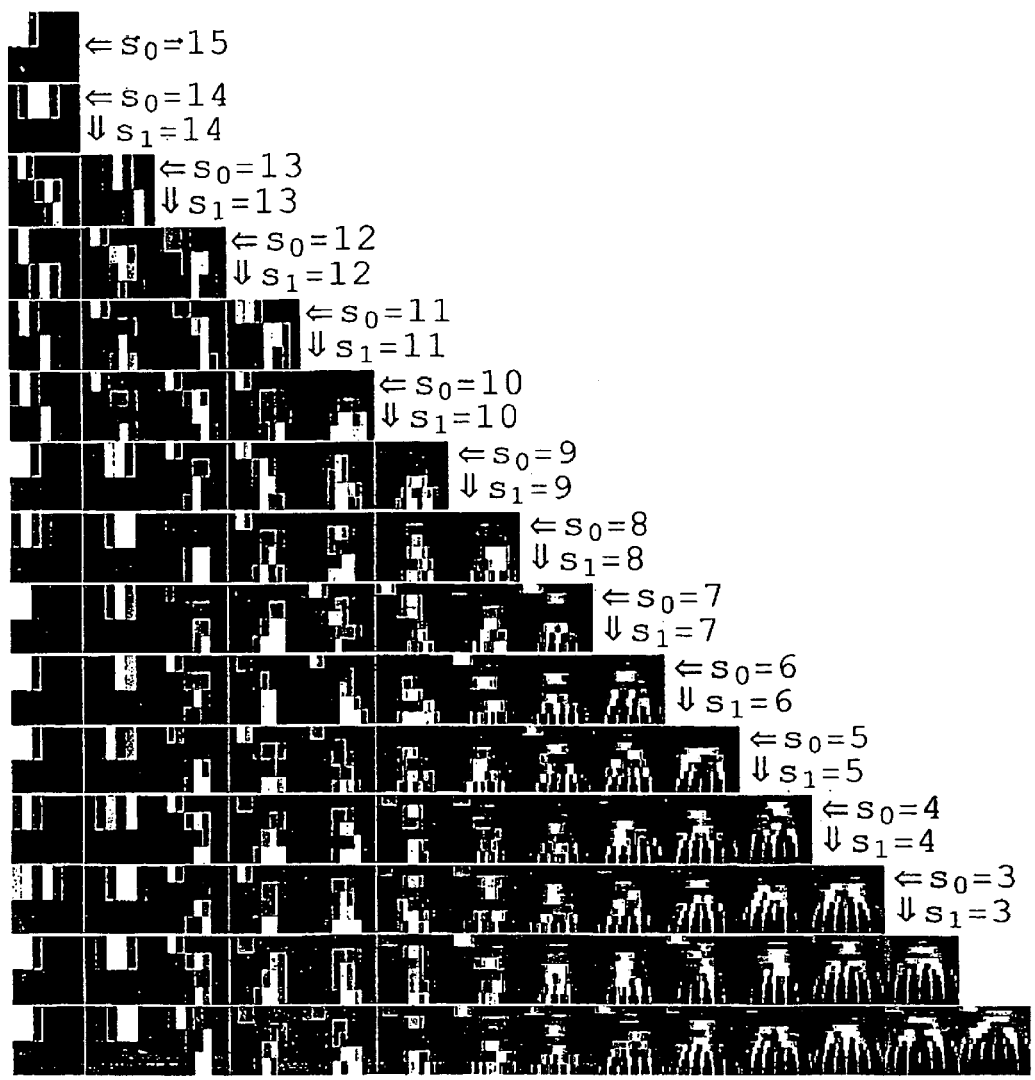
Figure 1:
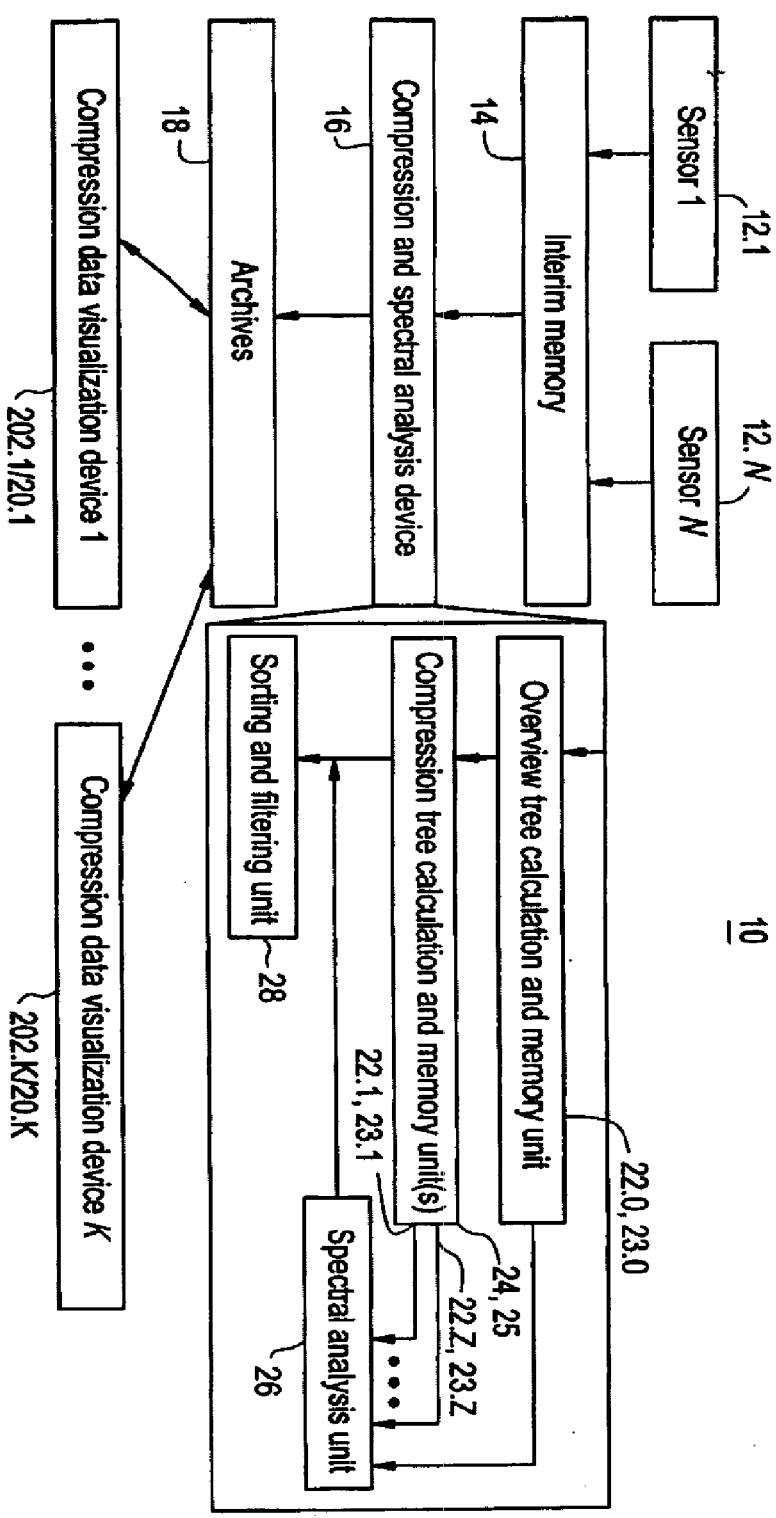
Figure 1A:
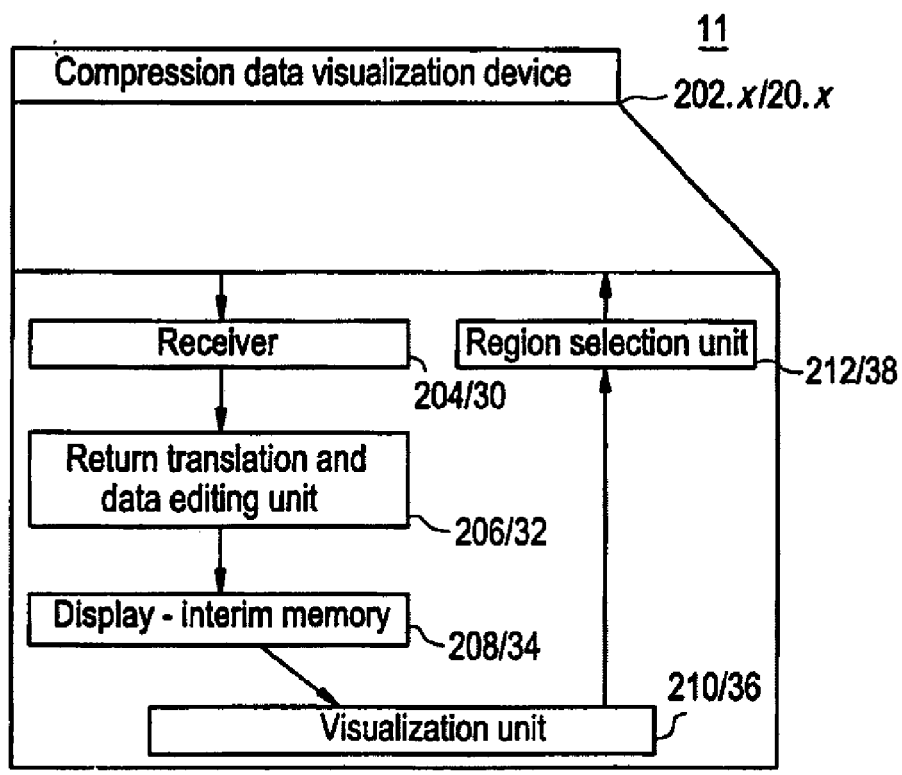
Figure 2B:
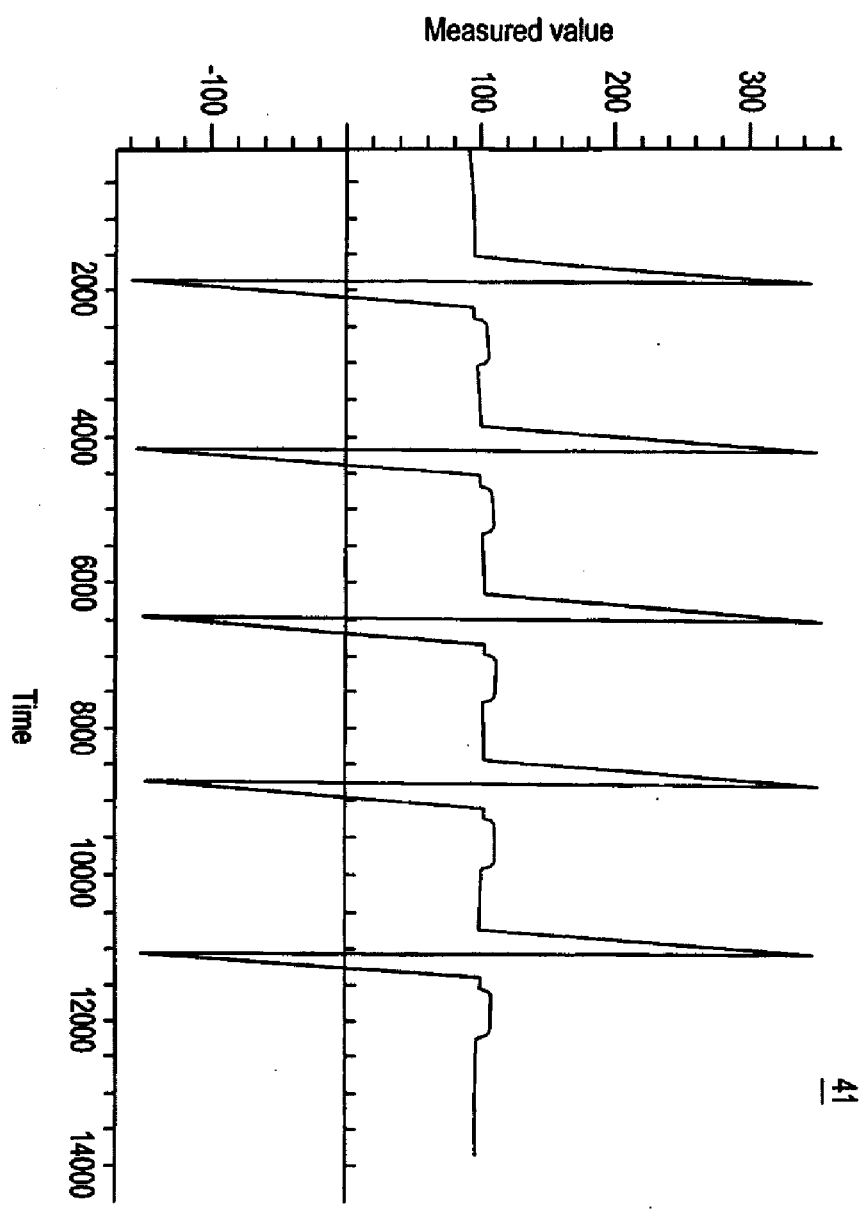
Figure 2C:
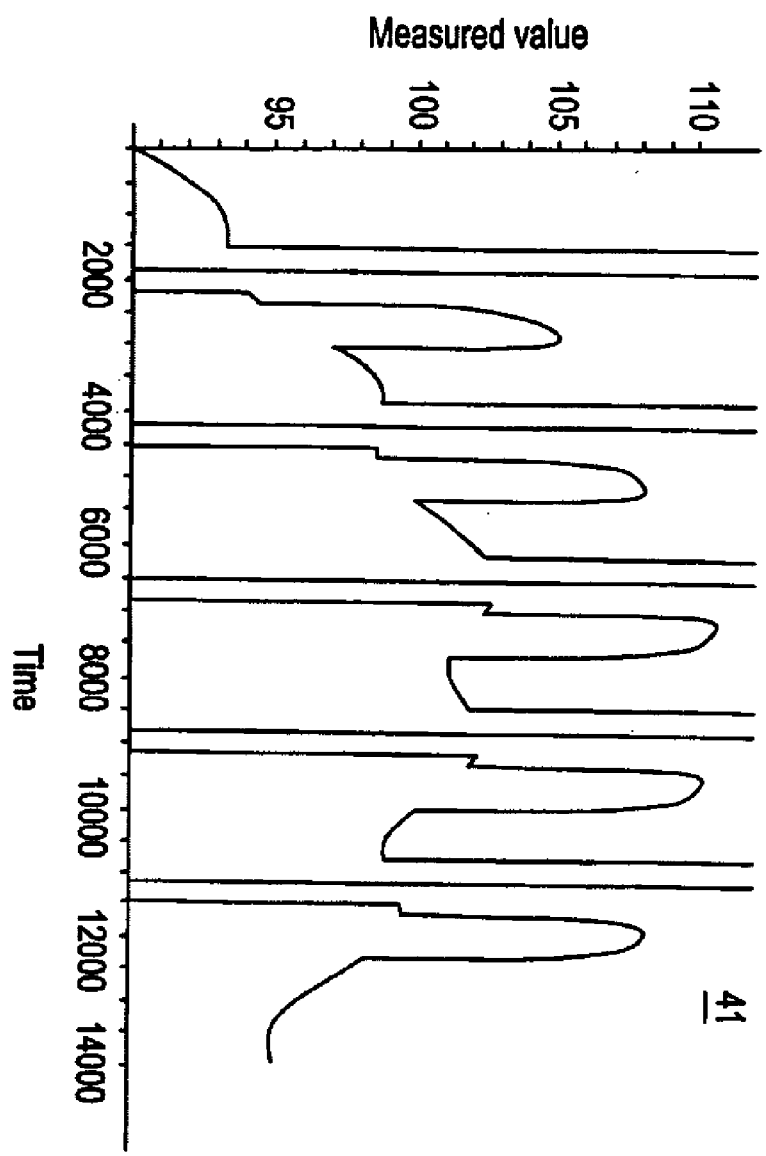
Figure 3:
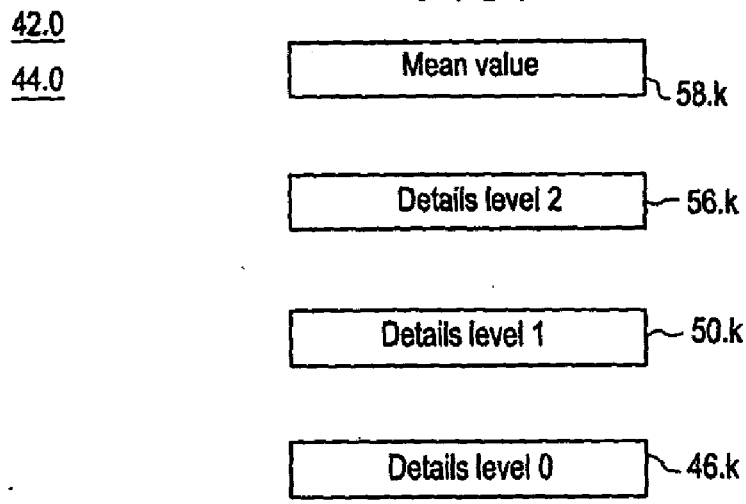
Figure 4:
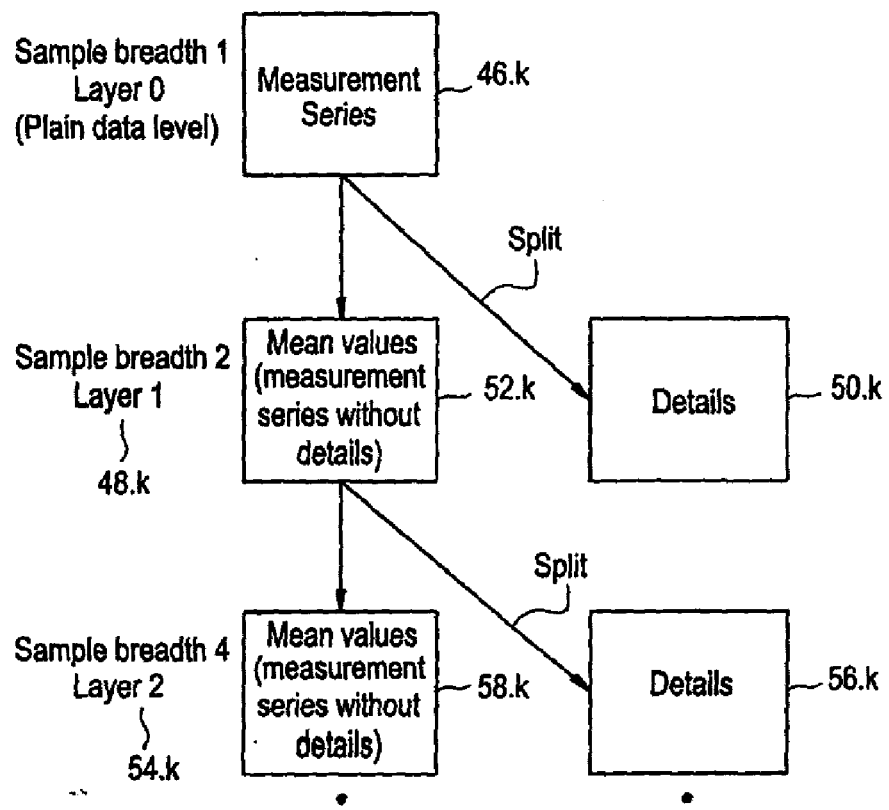

For illustration of the case in which n=3, the compression tree of 0 order 126 in FIG. 18a is represented enlarged one more time as 138 in FIG. 20a in (amount logarithmic) contrast-amplified form. The blurred, finger-like course curve structure described above can be especially well recognized here. FIG. 20b shows the associated 1-st order compression trees 140, one above the other, in amplified contrast form, listed in a column which for reasons of space was subdivided in the middle into [crossed out: two] three individual columns. The upper left two representations (left column) show the uppermost (crudest) mean values or the uppermost (crudest) detail layer of the 1-st order compression trees 140. The lowermost (finest) detail layer (right column) is situated below to the right and agrees with 130 from FIG. 18a, and also permits the concentration of the finger structure described above to be recognized which peels out from top to bottom in the form of a "hand." FIG. 20de finally shows the associated 2-nd order compression trees 142 as columns of lines (numeration-coordinates $s_0$) of representations (numeration coordinates $s_1$) in amplified contrast form (x numeration coordinates t, y numeration coordinates $s_2$) but, for reasons of space, without this numeration. The numeration can be recognized in the figures FIG. $20c.s_0.15$ to $11.s_1.15$ to $12$, FIG. $20cS_0.10$ to $6.s_1.15$ to $12$, FIG. $20c.s_0.5$ to $1.s_1.15$ to $12$, FIG. $20c.s_0.10$ to $6$, $s_1.11$ to $8$, FIG. $20cs_0.5$ to $1$, $s_1.11$ to $8$, FIG. $20c.s_0.6$ to $4$, $s_17$ to $4$, FIG. $20c.s_0.3$ to $1.s_1$, $7$ to $4$, FIG. $20c.s_0.2$ to $1.s_1.3$ to $2$. They contain the representations from 142 from FIG. 20d in amplified contrast form (x numeration coordinates t, y numeration coordinates $s_2$) at the corresponding places that are mentioned in the figure designations: FIG. 20c.$s_0$w to x, $s_1$.y. to .z contains the representations in 20d not provided with scales, with the numbers $s_0$=w, $s_1$=y (top far left), $s_0$=w+1, s1=y (one line deeper) $s_0$=x, $s_1$=y (deepest line), $s_0$=w, $s_1$=y+1, (one column farther to the right, as long as it exists) . . . $s_0$=w+1, $s_1$=y+1(one line deeper, one column farther to the right) . . . $s_0$=x,$s_1$=z (below, far right), i.e., the number ranges in the figure names indicate at which point in the overview figure, FIG. 20d, the individual representations rest, For their elucidation, it is best to space these figures, as they are represented in FIG. 20d, apart in accordance with their numeration. From top to bottom (in the direction $s_0$ in FIG. 20d and in the concentrated figures FIG. 20c.$s_0$.w. to . x.$s_1$y. to .z. the lines correspond to the decompositions of the same layer from 140 from FIG. 20b. The layer depth of the decomposition sinks from left to right, and the marking of the finger structure rises. It can be recognized in the finest second order representation richest in coefficients that the means of the central three finger structures of the "hand" blow, which corresponds to a "dying away" by about 12 dB on the basis of its logarithmic amount value representation. That is, the coefficients become increasingly small. In contrast, compression increases.

The method described is particularly interesting because from one layer to the next lower layer, the number of coefficients contained in it is approximately doubled. (Additional coefficients per layer are left over at the rim of the trees on the basis of rim breaking off effects up to 2M−1.) The representation of the crude preview can thus be undertaken earlier in the present situation than the complete overview (similar as in FIG. 9 with the crude overview 106).

Overall, a method and a device are provided with which data from a process already gathered by sensors, such as process regulation systems, or even a loose accumulation of sensors, such as heart rate frequency and magnetocardiogram, can be coupled out, transformed, and/or subjected to a spectral analysis, compressed, and stored in an archive. The basic meaning of the present invention lies in the very efficient extraction and representation of decompressed data or data compressed in the analysis in contrast to the original data, because a good compression means an efficient recognition of the "essential" in the signal by the compression process. In order to allow humans to participate in the capacity of the compression method for recognizing the "essential," a device such as the device 202.1 . . . 202.K is needed which makes the compressed data visible instead of simply reproducing the uncompressed original data.

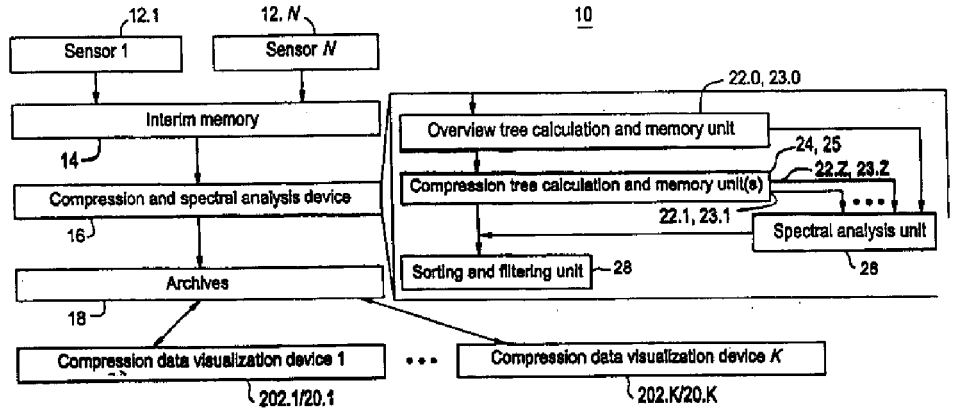

What is claimed is:

1. Process for compressing data, including the operations:

receiving and storing a possibly higher dimensional sequence of (possibly higher dimensional) raw data with at least two datapoints, storage of the datapoints [formally designated as decat built-in structure of the (−1)-st order] as the record to be processed momentarily, first decomposition of the data received by the computation of coefficients of a 0 order decat built-in structure (overview tree/compression zero order tree) on the basis of the data received, and determination of the layers of the 0-th tree structure (overview tree), at least one further decomposition (k-th decomposition, with $2 \leq k \leq n$ and $n \geq 2$) of the coefficients calculated with an immediately preceding decomposition [(k−1)-th decomposition] by the computation of coefficients of at least a further decat built-in structure of the 1-st to (n−1)-th order, as well as the determination of layers of the second tree structures [compression trees of the 1-st to (n−1)-th order], sorting and/or filtering of the coefficients of the layers of at least the second tree structures of the (n−1)-th order (compression trees), preferably without having to decompress the tree structures computed again explicitly or implicitly, storage of those coefficients of at least the decat built-in structure of (n−1)th order (n-th decomposition) that are suited for reconstruction of the data received on the basis of sorting and/or filtering.

2. Method for compressing data (46), comprising the operations:

receiving a sequence of data with at least two datapoints, storage of the datapoints as the record to be processed momentarily, calculation of coefficients of a first tree structure (42) (overview tree) from the data received (46), and determination of layers (50, 56) of the first tree structure, calculation of coefficients in each case of a second tree structure (44) (compression tree) based upon the coefficients in any given case of one of the layers (46, 50, 56) of the first tree structure (42), and determining the layers (50, 56) of the second tree structures (44), sorting and/or filtering coefficients of the layers (50, 56) of the second tree structures (44), storage of those coefficients of the second tree structures (44) which are suited for the reconstruction of the received sequence of data on the basis of sorting and/or filtering.

3. Method for analyzing and representing data, comprising the operations:

receiving and storing a sequence of data with at least two datapoints, initial decomposition of the data received by calculating coefficients of a 0 order decat built-in function at least one further decomposition (n-th decomposition, with $n \geq 2$) of the coefficients calculated with an immediately preceding decomposition ((n−1)-th decomposition) by calculating coefficients of at least one further decomposition structure of the 1-st to (n−1)-th order, storage of at least the coefficients of the decomposition structure of the (n−1)-th order, selection of a desired time range and/or representation fineness of the coefficients corresponding to the data to be represented of at least the decomposition structure of the (n−1)-th order, reconstruction of coefficients of at least a new decomposition structure of the 0-th to (n−2)-th order on the basis of selected coefficients at least of the decomposition structure of (n−1)-th order and representation of the coefficients of all decomposition structures of the 0-th to (n−1)-th order in a multidimensional structure, wherein coefficients of a decomposition tree of the same order are represented on a plane.

4. Method for analyzing and representing data, comprising the operations:

selection of a desired time range and/or representation fineness of the coefficients corresponding to the data to be represented at least of the decomposition structure of the (n−1)-th order, reconstruction of coefficients of at least one new decomposition structure of the 0-th to (n−2)-th order and/or of datapoints [decomposition structure of (−1)-st order] on the basis of selected coefficients at least of the decomposition structure of (n−1)-st order and representation of the coefficients to be displayed at least of a decomposition structure of the 0-th to (n−1)-th order in a multidimensional structure, wherein coefficients of a decomposition tree of the same order are represented on a plane, and/or representation of the coefficients of the decomposition structure of (−1)-st order to be displayed in the form of a usual diagram adapted to the (possibly multidimensional) data structure and possibly animated, separately or in connection with the multidimensional structure for representation of the decomposition structures of the 0-th to (n−1)-th order.

5. Method for compressing and/or analyzing and representing data, comprising the operations:

receiving and storage of a possibly higher dimensional sequence of (possibly higher dimensional) raw data with at least two datapoints, a decomposition of the received data through the calculation of coefficients of a decomposition structure of the 0-th order (overview tree/compression tree of 0-th order) from the datapoints received, and determination of layers of the 0-th tree structure (overview tree), at least one further decomposition (k-th decomposition, with $2 \leq k \leq n$ and $n \geq 2$) of the coefficients calculated in connection with an immediately preceding decomposition of [(k−1)-th decomposition] by computation of the coefficients of at least a further decomposition structure of 1-st to (n−1)-th order, and determination of layers of the second tree structures (compression trees) of 1-st to (n−1)-th order, sorting and/or filtering the coefficients of layers at least of the second tree structures of the (n−1)-th order (compression trees), preferably without the calculated tree structures having to be decompressed again explicitly or implicitly, storage of those coefficients of the decomposition structure of the (n−1)-th order (n-th decomposition) which are suitable for reconstructing the received sequence of data on the sorting and/or filtering, selection of a desired time range and/or representation fineness of the coefficients corresponding to the data to be represented at least of the decomposition structure of the (n−1)-th order, reconstruction of coefficients of at least one new decomposition structure of the 0-th to (n−2)-th order and/or of datapoints [decomposition of the (−1)-th order] from the selected coefficients of at least the decomposition structure of the (n−1)-th order, and representation of the coefficients to be displayed of at least one decomposition structure of the 0-th to (n−1)-th order in a multidimensional structure, wherein coefficients of a decomposition tree of the same order are represented on a plane, and/or representation of the coefficients of the decomposition structure of the (−1)-th order to be displayed in the form of a typical and possibly animated diagram adapted to the (possibly higher dimensional) data structure, separately or in connection with the multidimensional structure for representation of decomposition structures of the 0-th to (n−1)-th order.

6. Method according to claim 1, characterized in that the coefficients resulting from the decomposition within a decomposition structure of the k-th order (wherein $0 \leq k \leq n-1$) in layers of different layer numbers $s_0$ to $s_k$ are classified, wherein the classification is carried out (k+1) times.

7. Method according to claim 1, characterized in that each coefficient is allocated at least one of the layer numbers s to $s_k$ and/or a time and/or a possibly higher dimensional value, and in that a control command is calculated for one image element each representing the coefficient within the multidimensional structure at least from the layer number allocated to the coefficient and/or the time and/or its possibly higher dimensional value.

8. Method according to claim 1, characterized in that the control command for representing a structure of the k-th order (wherein $0 \leq 1 \leq n-1$) of (k+1) layer numbers allocated to the coefficient and/or times and/or values is calculated.

9. Method according to claim 1, characterized in that each of the coefficients to be represented is allocated a display parameter, especially a color and/or gray value and/or a representation coordinate height and/or a brightness value.

10. Method according to claim 1, characterized in that the display parameter of a coefficient is dependent upon the magnitude value or the logarithmic amount value of the coefficient to be represented.

11. Method according to claim 1, characterized in that the control commands of the image elements to be represented are grouped by layer, in that the control commands grouped by layer are preferably grouped layer-wise into surface units corresponding to their affiliation in the decomposition structure of zero order (overview tree) and/or the decomposition structures of the k-th order (compression trees), and in that the surface units of the decomposition structures of the k-th order are preferably grouped along the associated layers $s_0$ to $s_{(k-1)}$ of the generated surface units of the decomposition structure of the (k−1)-th order.

12. Method according to claim 1, characterized in that the decomposition is conducted as wavelet decomposition, preferably rapid wavelet decomposition.

13. Method according to claim 1, characterized in that identical or different wavelets are used for calculating the coefficients of the first and/or second tree structure (42, 44).

14. Method according to claim 1, characterized in that a Haar wavelet is used for wavelet decomposition.

15. Method according to claim 1, characterized in that a wavelet of the class of Daubechies wavelets, preferably the Daubechies $D_2$ wavelet, and/or a wavelet of the Meyer wavelet class is used for wavelet decomposition.

16. Method according to claim 1, characterized in that precisely one second tree structure (44) is ascertained recursively for each layer (46, 50, 56) of the first tree structure.

17. Method according to claim 1, characterized in that the coefficients are sorted according to their magnitude alone, taking an error limit established with regard to a specific standard into account, and in that first a direct storage into the archives takes place (a priori error estimation).

18. Method according to claim 1, characterized in that the compressed data are represented in a three-dimensional structure, including a first surface for representing coefficients of the overview tree and second surfaces extending from the first surface preferably vertically or at varying angles for the representation of coefficients of compression trees.

19. Method according to claim 1, characterized in that the breadth b of the representation of the coefficients of a layer is adjustable.

20. Method according to claim 1, characterized in that the breadth b of representation of all the coefficients of a layer sinks or rises linearly or affine-linearly with the number of the layer.

21. Method according to claim 1, characterized in that the breadth b of representation of an individual coefficient is constant.

22. Method according to claim 1, characterized in that the breadth b of representation of the individual coefficient is proportional to the breadth of the wavelet represented by it or the scaling function represented by it.

23. Method according to claim 1, characterized in that exactly those coefficients are extracted from the archives for representing the measured points that are necessary in order to attain a previously adjusted representation exactitude.

24. Method according to claim 1, characterized in that the extracted coefficients are ascertained on the basis of the generalization of the Nyquist sampling theorem and the uncertainty relation of wavelets.

25. Method according to claim 1, characterized in that first a time period is established for selecting the coefficients to be extracted, and a number of datapoints is selected on which and with which the representation is to take place.

26. Method according to claim 1, characterized in that the data are received synchronously or asynchronously from an arbitrary number of data sources.

27. Method according to claim 1, characterized in that the standard is possibly a weighted $l_p$ or Sobolew norm.

28. Device (10) for the compression of data, comprising:
   a receiving unit with interim memory (14) for receiving and storing the received data,
   a first calculation unit (32) for calculating coefficients of a first tree structure (42) from the received datapoints,
   a first storage unit (23) for storing the coefficients of the first tree structure (42),
   a second calculation unit (24) for calculating coefficients of a second tree structure (44) from coefficients of the first tree structure,
   a second memory unit for storing the coefficients of the second tree structure (44),
   a sorting and/or filtering unit (28) for sorting and/or filtering the coefficients of the second tree structure (44),
   an archive (18) for storing the sorted and/or filtered coefficients of the second tree structure as compressed data.

29. Device according to claim 28, characterized in that the receiving time (14) with interim memory is connected to a large number of data sources (12.1 ... 12.N) such as sensors or video cameras.

30. Device according to claim 28, characterized in that the device (10) contains a spectral analysis unit (26) which is connected on the input side with the first and/or second memory unit (23, 25), and on the output side with the sorting and/or filtering unit (28).

31. Device according to claim 28, characterized in that the archives (18) is connected to a large number of evaluation units (20.1 ... 20.N).

32. Device preferably according to claim 28, characterized in that the evaluation unit (20.1 ... (20.N) includes:
   a receiver (30) for the coefficients stored in the archives (18),
   a decompression-inverse transformation unit (32) connected to the receiver (30),
   a display unit (36),
   an interim memory (34) arranged between the decompression-inverse transformation unit (32) and the display unit (36), and
   a selection unit (38) for selection of a range of received data to be displayed, connected on the input side with the display unit, and on the output side with the archives (18).

33. Device for the analysis and representation of data, comprising:
   a selection unit (38) for determining a time range and a representation fineness of the data to be represented,
   a receiver (30) for receiving the coefficients corresponding to the data selected from at least the decomposition structure of the (n−1)-th order, a return transformation unit (32) which calculates the coefficients of at least a new decomposition structure of zero order (overview tree) up to the (n−2)-th order (compression trees) from the coefficients received from at least the decomposition structure of the (n−1)-th order, and generates control commands from all coefficients needed for representation through a display unit.

34. Device according to claim 33, characterized in that the control commands are calculated for one image element each represented by the display unit (36) alone on the basis of its layer number, of the time allocated to the coefficient as well as of the possibly higher dimensional coefficient value, in that a memory unit (34) is provided for storing the control commands issued, and in that a display unit is provided which processes the control commands generated in the memory (34), preferably asynchronously.

35. Device according to claim 33 or 34, characterized in that the control commands of the image elements represented are grouped by layer, and in that the control commands grouped by layer are grouped by layer preferably as surface units in accordance with their affiliation to random combinations of the decomposition structures from the zero to (n−1)-th order.

36. Device for the compression and/or analysis and representation of data, comprising
   a receiving unit with interim memory (14) for receiving and storing the received data,
   a first calculation unit (32) for the computation of coefficients of a first tree structure (42) from the received datapoints,
   a first memory unit (23) for storing the coefficients of the first tree structure (42),
   a second calculation unit (24) for the calculation of coefficients of a second tree structure (44) from the coefficient of the first tree structure,
   a second storage unit for storing coefficients of the second tree structure (44),
   a soiling and/or filtering unit (28) for sorting and/or filtering the coefficients of the second tree structure (44),
   an archive (18) for storing the sorted and/or filtered coefficient of the second tree structure as compressed data,
   a selection unit (38) for determining a time range and a representation fineness of the data to be represented,
   a receiver (30) for receiving the coefficients corresponding to the selected data of at least the decomposition structure of the (n−1)-th order,
   a return transformation unit (32) which calculates the required coefficients at least of a new decomposition structure of the 0-th order (overview tree) up to (n−2)-th order (compression trees) from the coefficients received from at least the decomposition structure of the (n−1) th order, and generates control commands from all coefficients required for representation of a multidimensional structure through a display unit.

* * * * *

UNITED STATES PATENT AND TRADEMARK OFFICE
CERTIFICATE OF CORRECTION

PATENT NO. : 6,839,003 B2
DATED : January 4, 2005
INVENTOR(S) : Michael Soliman et al.

It is certified that error appears in the above-identified patent and that said Letters Patent is hereby corrected as shown below:

Title page,
Delete the title page and substitute therefore the attached title page.

Drawings:
Please replace Figures 1, 1A, 2B, 2C, 3 and 4 with the Figures attached hereto.

Column 15,
Lines 44-46, amend to read as follows:

of its measurement series $\|f\|_2 = \sqrt{\int_{t=-\infty}^{0} |f(t)^2| dt}$ or $\|(c_k)_{\nabla k}\|_2 = \sqrt{\sum_{\nabla k} |c_k|^2}$ is of special importance.

Column 19,
Lines 30-31, amend to read as follows:

$$c_{k,\ next\ higher\ layer} = \sum_{l=0}^{M-1} h_{l-2k} c_l \qquad (a)$$

$$d_k = \sum_{l=2-M}^{l} g_{l-2k} c_l \qquad (b)$$

Signed and Sealed this

Seventeenth Day of May, 2005

JON W. DUDAS
*Director of the United States Patent and Trademark Office*

United States Patent
Soliman et al.

(10) Patent No.: US 6,839,003 B2
(45) Date of Patent: Jan. 4, 2005

(54) METHOD AND DEVICE FOR COMPRESSING AND/OR DECOMPRESSING DATA AS WELL AS FOR ANALYZING AND REPRESENTING DATA

(76) Inventors: Michael Soliman, Hauptstrasse 11a, 64401 Gross-Bieberau (DE); Henning Voss, Gross-Bierberauer-Strasse 4, 64354 Reinheim (DE); Günter Greschenz, Tannenweg 49, 64354 Reinheim (DE)

( * ) Notice: Subject to any disclaimer, the term of this patent is extended or adjusted under 35 U.S.C. 154(b) by 25 days.

(21) Appl. No.: 10/258,597
(22) PCT Filed: May 2, 2001
(86) PCT No.: PCT/EP01/04920
§ 371 (c)(1), (2), (4) Date: Jul. 3, 2003
(87) PCT Pub. No.: WO01/86819
PCT Pub. Date: Nov. 15, 2001

(65) Prior Publication Data
US 2004/0027259 A1 Feb. 12, 2004

(30) Foreign Application Priority Data
May 2, 2000 (DE) .......................... 100 21 286

(51) Int. Cl.$^7$ ................................ H03M 7/00
(52) U.S. Cl. ..................... 341/50; 341/106; 341/87
(58) Field of Search .................... 341/50, 51, 87, 341/106, 95

(56) References Cited

U.S. PATENT DOCUMENTS 6,606,040 B2 * 8/2003 Abdat ................ 341/87

FOREIGN PATENT DOCUMENTS

DE 19 928985 12/1999

(List continued on next page.)

OTHER PUBLICATIONS

Rabbani et al, "Digital Image Compression Techniques In: Tutorial Texts In Optical Engineering", vol. TT 7, Bellingham, Washington USA, third printing 1991, pp. 175–181.

(List continued on next page.)

Primary Examiner—Brian Young
(74) Attorney, Agent, or Firm—Dennison, Schultz, Dougherty & MacDonald

(57) ABSTRACT

A method and device for compressing data to allow for a simple and rapid evaluation of the compressed data. The invention includes the steps of receiving and storing a possibly higher dimensional sequence of (possibly higher dimensional) raw data with at least two datapoints, storage of the datapoints [formally designated as decat built-in structure of the (−1)-st order] as the record to be processed momentarily, first decomposition of the data received by the computation of coefficients of a 0 order decat built-in structure (overview tree/compression zero order tree) on the basis of the data received, and determination of the layers of the 0-th tree structure (overview tree), at least one further decomposition (k-th decomposition, with $2 \leq k \leq n$ and $n \geq 2$) of the coefficients calculated with an immediately preceding decomposition [(k−1)-th decomposition] by the computation of coefficients of at least a further decat built-in structure of the 1-st to (n−1)-th order, as well as the determination of layers of the second tree structures [compression trees of the 1-st to (n−1)-th order], and sorting and/or filtering of the coefficients of the layers of at least the second tree structures of the (n−1)-th order (compression trees), preferably without having to decompress the tree structures computed again explicitly or implicitly, storage of those coefficients of at least the decat built-in structure of (n−1)-th order (n-th decomposition) that are suited for reconstruction of the data received on the basis of sorting and/or filtering.

36 Claims, 37 Drawing Sheets